US008668846B2

(12) United States Patent
Kawasaki et al.

(10) Patent No.: US 8,668,846 B2
(45) Date of Patent: *Mar. 11, 2014

(54) PHOTOELECTRIC CONVERSION ELEMENT AND SOLAR CELL

(75) Inventors: Hidekazu Kawasaki, Tokyo (JP); Akihiko Itami, Tokyo (JP); Kazuya Isobe, Tokyo (JP); Hideya Miwa, Tokyo (JP); Kazukuni Nishimura, Tokyo (JP); Mayuko Ushiro, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 718 days.

This patent is subject to a terminal disclaimer.

(21) Appl. No.: 12/766,236

(22) Filed: Apr. 23, 2010

(65) Prior Publication Data
US 2010/0275988 A1 Nov. 4, 2010

(30) Foreign Application Priority Data

Apr. 28, 2009 (JP) ................................ 2009-108953

(51) Int. Cl.
*H01L 31/0256* (2006.01)
*C09B 67/00* (2006.01)
(52) U.S. Cl.
USPC ........ 252/501.1; 252/500; 136/263; 136/261; 136/252
(58) Field of Classification Search
USPC ............... 252/501.1, 500; 136/263, 261, 252
See application file for complete search history.

(56) References Cited

U.S. PATENT DOCUMENTS

| 6,911,595 | B2 * | 6/2005 | Yoshikawa et al. | 136/263 |
| 7,943,848 | B2 * | 5/2011 | Nishimura et al. | 136/263 |
| 8,247,687 | B2 * | 8/2012 | Miwa et al. | 136/263 |
| 2008/0115826 | A1 * | 5/2008 | Nishimura et al. | 136/252 |
| 2008/0296564 | A1 * | 12/2008 | Nishimura et al. | 257/40 |
| 2010/0263726 | A1 * | 10/2010 | Kawasaki et al. | 136/261 |
| 2010/0282322 | A1 * | 11/2010 | Kawasaki et al. | 136/261 |
| 2010/0288360 | A1 * | 11/2010 | Kawasaki et al. | 136/261 |
| 2012/0085411 | A1 * | 4/2012 | Isobe et al. | 136/263 |
| 2012/0152356 | A1 * | 6/2012 | Ishikawa et al. | 136/263 |
| 2012/0247562 | A1 * | 10/2012 | Nishimura et al. | 136/263 |

FOREIGN PATENT DOCUMENTS

| JP | 2005063833 A | * | 3/2005 | ............ H01M 14/00 |
| JP | 2005123033 | | 5/2005 | |
| JP | 2008277206 A | * | 11/2008 | |

OTHER PUBLICATIONS

English translation of JP 2008-277206, Nov. 13, 2008.*
True, Jan E., et al., "Electronegativities from Core-Ionization Energies: Electonegativities of SF5 and CF3", Inorg. Chem. 2003, 42, 4437-4441.*
Nature,(Abstract) 353, 737 (1991) by B. O'Regan and M. Gratzel.

* cited by examiner

*Primary Examiner* — Douglas McGinty
(74) *Attorney, Agent, or Firm* — Lucas & Mercanti, LLP

(57) ABSTRACT

A dye-sensitized photoelectric conversion element, comprises a pair of electrodes arranged opposite to each other; a semiconductor layer including a semiconductor supporting a sensitizing dye; and an electrolyte layer. At least the semiconductor layer and the electrolyte layer are provided between the pair of electrodes, and the sensitizing dye contains a compound represented by the following Formula (1).

12 Claims, 1 Drawing Sheet

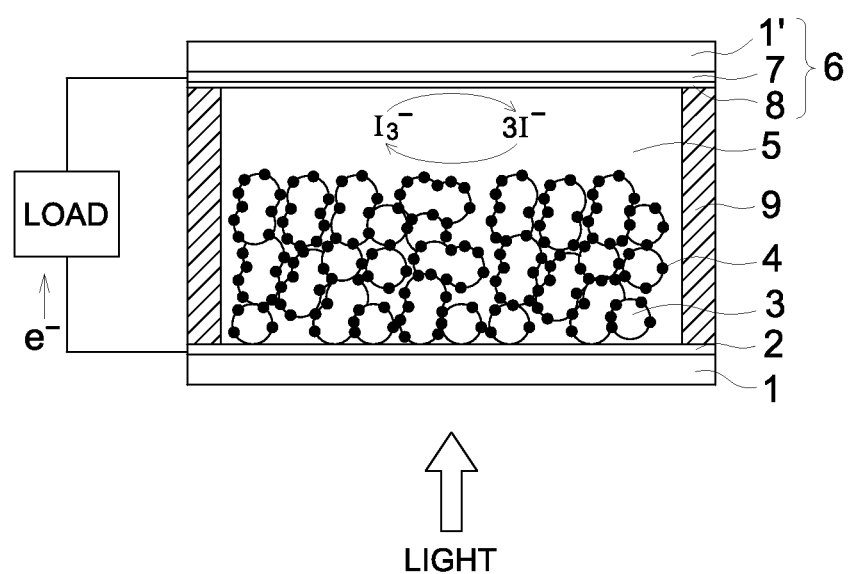

PHOTOELECTRIC CONVERSION ELEMENT AND SOLAR CELL

This application is based on Japanese Patent Application No. 2009-108953 filed on Apr. 28, 2009, in Japanese Patent Office, the entire content of which is hereby incorporated by reference.

BACKGROUND OF THE INVENTION

The present invention relates to a photoelectric conversion element employing a new molecular entity (dye) and a solar cell.

In recent years, the utilization of sunlight which is available infinitely and does not generate a harmful substance has been investigated energetically. Inorganic type residential solar cells, such as single crystal silicon, polycrystalline silicon, amorphous silicon, cadmium telluride, indium selenide copper and the like have been practically used as a clean energy source of the utilization of sunlight.

However, these inorganic type solar cells, for example, a silicon type solar cell has defects that extremely high purity is required, naturally, the refining process becomes complicate and is constituted of many processes, and then the manufacturing cost becomes high.

On the other hand, also there are many proposals for solar cells employing organic materials. Examples of organic type solar cells, there are a Schottky type photoelectric conversion element in which a p type organic semiconductor and a metal having a small work function are joined; a hetero junction type photoelectric conversion element in which a p type organic semiconductor and a n type inorganic semiconductor or a p type organic semiconductor and an electronic receptive organic compound are joined; and the like. As the organic semiconductors, employed are synthetic dyes and pigments, such as chlorophyll and perylene; conductive polymers, such as polyacetylene; composite materials of them and the like. These materials are made in a thin film so as to constitute a cell material by a vacuum deposition method, casting method, or dipping method. The organic materials have advantages, such as low cost and easiness in forming a large area. However, they have problems that their conversion efficiency is low to 1% or less, and their durability is not good.

Under such a circumstance, Dr. Gratzel et al in Switzerland proposed a solar cell having good characteristics (refer to Non-patent Document: Nature, 353, 737(1991) by B. O'Regan and M. Gratzel). The proposed cell is a dye-sensitized type solar cell and a wet type solar cell that employs titanium oxide porous thin film spectrally sensitized with a ruthenium complex as a working electrode. The above solar cell has advantages that since a cheap metallic compound semiconductors, such as titanium oxide is not needed to be refined to high purity, the cost is cheap, and since utilizable light extends to a wide visible light region, the cell can convert sunlight including a lot of visible light components effectively into electricity.

However, since the ruthenium complex restricted in resource is used, when this solar cell is put in practical use, the supply of the ruthenium complex is concerned. Further, the ruthenium complex is expensive and has a problem in temporal stability. Therefore, if the ruthenium complex is replaced with a cheap and stable organic dye, these problems can be solved.

There is a disclosure that when a rhodanine skeleton-containing amine structure is employed as such dye, it is possible to obtain an element having high photoelectric conversion efficiency (for example, refer to Patent Document: Japanese Unexamined Patent Publication No. 2005-123033). However, even in the case that such dye is employed, its conversion efficiency is still low as compared with that of the ruthenium complex. Accordingly, sensitizing dye with high photoelectric conversion efficiency is still required.

SUMMARY OF THE INVENTION

The present invention has been achieved in view of the above-mentioned themes, and an object of the invention is to provide a photoelectric conversion element and a solar cell, which employ a compound (dye) which is novel, good at adsorbing to an oxide semiconductor, and has high photoelectric conversion efficiency.

The above-mentioned themes of the present invention can be attained by the structures described in the following Items.

Item 1. In a dye-sensitized photoelectric conversion element comprises a pair of electrodes arranged opposite to each other, a semiconductor layer in which a semiconductor supports a sensitizing dye, and an electrolyte layer, wherein at least the semiconductor layer and the electrolyte layer are provided between the pair of electrodes, the photoelectric conversion element is characterized in that the sensitizing dye contains a compound represented by the following Formula (1),

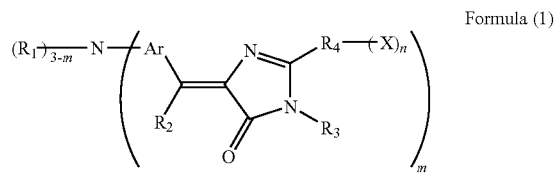

Formula (1)

in Formula (1), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_4$ represents an X-substituted group of one of an alkyl group, alkenyl group, alkynyl group, alkoxy group, alkylthio group, alkylseleno group, amino group, aryl group, and heterocyclic group and $R_4$ may be further substituted with a substituent other than X, X represents an acidic group, n is an integer of 1 or more, m is 2 or 3, and a carbon-carbon double bond may be a cis form or a trans form.

Item 2. The photoelectric conversion element described in Item 1 is characterized in that the compound represented by the abovementioned Formula (1) is a compound represented by the following Formula (2), Formula (2)

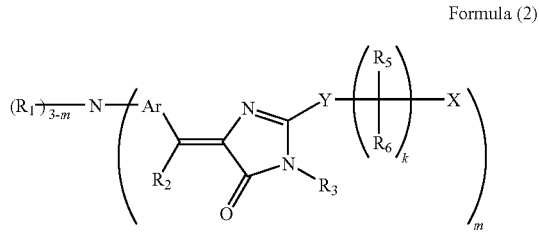

in Formula (2), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, Y represents a sulfur atom, an oxygen atom, or a selenium atom, m is 2 or 3, X represents an acidic group, and a carbon-carbon double bond may be a cis form or a trans form. Item 3. The photoelectric conversion element described in Item 2 is characterized in that Y represents a sulfur atom so that the compound represented by the abovementioned Formula (2) is a compound represented by the following Formula (3), Formula (3)

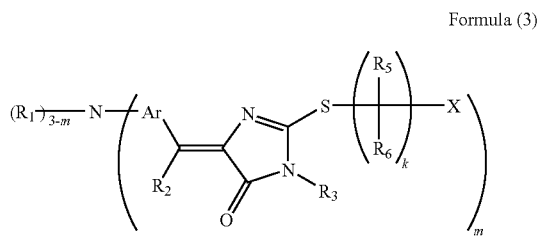

in Formula (3), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, m is 2 or 3, X represents an acidic group, and a carbon-carbon double bond may be a cis form or a trans form.
Item 4. The photoelectric conversion element described in Item 3 is characterized in that $R_3$ represents a hydrogen atom so that the compound represented by the abovementioned Formula (3) is a compound represented by the following Formula (4), Formula (4)

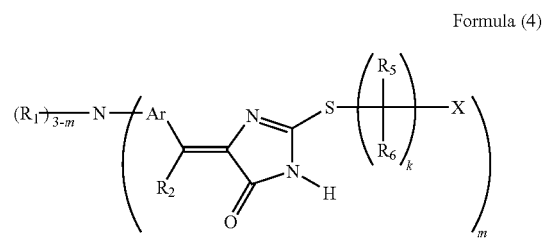

in Formula (4), in Formula (4), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, aryl group, amino group, cyano group and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, m is 2 or 3, X represents an acidic group, and a carbon-carbon double bond may be a cis form or a trans form.
Item 5. The photoelectric conversion element described in any one of Items 1 to 4 is characterized by containing plural kinds of compounds selected from the compounds represented by the abovementioned Formulas (1) to (4).
Item 6. The photoelectric conversion element described in any one of Items 1 to 5 is characterized in that the semiconductor forming the semiconductor layer is a titanium oxide.
Item 7. A solar cell characterized by comprising a photoelectric conversion element described in any one of Items 1 to 6.

BRIEF DESCRIPTION OF THE DRAWINGS

FIG. 1 is a cross sectional view showing an example of a photoelectric conversion element used in the present invention.

DETAILED DESCRIPTION OF THE PREFERRED EMBODIMENT

Hereafter, preferred embodiments of the present invention will be explained. However, the present invention is not limited to these embodiments.
As mentioned above, conventionally, compounds having a rhodanine skeleton containing amine structure have been known as dye with high photoelectric conversion efficiency. However, since these dyes have inferior conversion efficiency as compared with the above-mentioned ruthenium complex dyes, further improvements are required.

As a result of the investigations of the present inventor for compounds having a plural imidazolone skeletons-containing amine structure, it turned out that photoelectric conversion elements employing these compound have high photoelectric conversion efficiency. Namely, as compared with conventional compounds having a rhodanine skeleton-containing amine structure, in novel dyes containing these compounds, it is presumed that (1) since wide molecular clouds are caused by an imidazolone ring itself and the existence of plural imidazolone rings, a molar extinction coefficient becomes high, and (2) since the electronegativity of a portion of an electron acceptor (a portion of an imidazolone skeleton) in a dye molecule is high, the nucleophilicity of an acidic group (X) of the dye molecule becomes strong and the acidic group (X) of the dye molecule easily bonds with or is easily coordinated in a metal molecule on a surface of a semiconductor, whereby the photoelectric conversion efficiency is improved. In particular, since the extinction coefficient is high, it is possible to make a semiconductor layer thin. Accordingly, it becomes possible to reduce an adsorption amount of a semiconductor layer which requires time at the time of manufacture, and manufacture efficiency becomes high.

According to the present invention, it becomes possible to provide a photoelectric conversion element and a solar cell, which employ a compound (dye) which is novel, good in adsorbing to an oxide semiconductor, and has high photoelectric conversion efficiency.

Hereafter, the present invention will be explained more in detail.

[Photoelectric Conversion Element]

A photoelectric conversion element of the present invention is explained with reference to drawing.

FIG. 1 is a cross sectional view showing an example of a photoelectric conversion element of the present invention.

As shown in FIG. 1, the photoelectric conversion element is constituted of substrates 1, 1', transparent conducting layers 2 and 7, semiconductors 3, sensitizing dyes 4, a charge transport layer 5, a partition wall 9, and the like.

On the substrate 1 (also called a conductive substrate) provided with the transparent conducting film 2, the photoelectric conversion element of the present invention comprises a semiconductor layer which is formed by sintered particles of the semiconductors 3 and has pores in which the dyes 4 adhere on the surfaces of the sintered semiconductor particles. An electrode 6 of the pair of electrodes opposite each other is structured such that the transparent conducting layer 7 is formed on the substrate 1' and a platinum layer 8 is formed on the transparent conducting layer 7 by vapor deposition, and a charge transporting substance is filled as the charge transport layer 5 between both electrodes. The transparent conducting layers 2, 7 are attached with terminals through which photocurrent is outputted.

The present invention relates to new molecular entities (dyes), and to a photoelectric conversion element and a solar cell, which employ them.

<<Compound Represented by Formula (1)>>

Hereafter, the compound represented by Formula (1) will be explained.

In Formula (1), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_4$ represents an X-substituted group of one of an alkyl group, alkenyl group, alkynyl group, alkoxy group, alkylthio group, alkylseleno group, amino group, aryl group, and heterocyclic group and $R_4$ may be further substituted with a substituent other than X, X represents an acidic group, n is an integer of 1 or more, m is 2 or 3, and a carbon-carbon double bond may be a cis form or a trans form.

As examples of a group represented by Ar, examples of an arylene group include a phenylene group, a tolylene group, etc., and examples of a heterocyclic group include a furyl group, a thienyl group, an imidazolyl group, a thiazolyl group, a morphonyl group, and the like.

As examples of a group represented by $R_1$, examples of an alkyl group include a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group, a cyclohexyl group, etc.; examples of an alkenyl group include a vinyl group, a 1-propenyl group, a 2-propenyl group, a 2-butenyl group, an aryl group, etc.; examples of an alkenyl group include a propargyl group, a 3-pentynyl group, etc; examples of an aryl group include a phenyl group, a naphthyl group, an anthracenyl group, etc.; and examples of a heterocyclic group include a furyl group, a thienyl group, and imidazolyl group, a thiazolyl group, a morphonyl group, and the like.

Examples of a halogen atom represented by $R_2$ include a chlorine atom, a bromine atom, a fluorine atom and an iodine atom.

Examples of an amino group represented by $R_2$ and $R_3$ include an amino group, an ethylamino group, a dimethylamino group, a butylamino group, a cyclopentyl amino group, and the like.

Examples of each of an alkyl group, an alkenyl group, an alkynyl group, an aryl group, and a heterocyclic group which are represented by $R_2$ through $R_4$ are the same as those in examples of respective groups represented by $R_1$.

As examples of a group represented by $R_4$, examples of an alkoxy group include a methoxy group, an ethoxy group, a propoxy group, butoxy group, etc.; examples of an alkylthio group include a tert-butylthio group, a hexylthio group, etc.; examples of an alkylseleno group include a methylseleno group, an ethylseleno group, a propylseleno group, a butylseleno group, a hexyl seleno group, etc.; and examples of an amino group include an amino group, and ethylamino group, a dimethylamino group, a butylamino group, a cyclopentyl amino group, and the like. X substitutes an alkyl portion of one of the alkoxy group, alkylthio group, alkylseleno group and amino group.

X represents an acidic group, and examples of an acidic group include a carboxyl group, a sulfo group, a sulfino group, a sulfinyl group, a phosphoryl group, a phosphinyl group, a phosphono group, a phosphonyl group, a sulfonyl group, and those salts, etc, and a carboxyl group and a sulfo group are desirable.

Examples of a substituent include alkyl group (a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group, and cyclohexyl group), and alkenyl group (for example, a vinyl group, a 1-propenyl group, a 2-propenyl group, a 2-butenyl group, an allyl group, etc.), a hydroxyl group, an amino group, a thiol group, a cyano group, a halogen atom (for example, a chlorine atom, a bromine atom, a fluorine atom, etc.) or a heterocyclic group (for example a pyrrolidyl group, an imidazolidyl group, a morpholyl group, an oxazolidyl group, a 2-tetrahydrofuranyl group, a 2-tetrahydro thienyl group, a 2-tetrahydropyranyl group, a 3-tetrahydropyranyl group, etc.). Further, among the above substituent groups, plural groups may form a ring by bonding with each other.

<<Compound Represented by Formula (2)>>

Among the compounds represented by the abovementioned Formula (1), the compound represented by the abovementioned Formula (2) is preferable because of high photoelectric conversion efficiency.

In Formula (2), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, Y represents a sulfur atom, an oxygen atom, or a selenium atom, m is 2 or 3, X represents an acidic group, and a carbon-carbon double bond may be a cis form or a trans form.

Examples of a halogen atom represented by $R_5$ and $R_6$ include a chlorine atom, a bromine atom, a fluorine atom, and the like. A substituted or unsubstituted group of an alkyl group, alkenyl group, alkynyl group, aryl group, amino group, cyano group and heterocyclic group, are synonymous respectively with the substituted or unsubstituted group of the alkyl group, alkenyl group, alkynyl group, aryl group, amino group, cyano group and heterocyclic group which are described in Formula (1).

Ar, $R_1$, $R_2$, $R_3$, $R_5$, $R_6$, and X in Formula (2) are synonymous respectively with Ar, $R_1$, $R_2$, $R_3$, $R_5$, $R_6$, and X in Formula (1).

<<Compound Represented by Formula (3)>>

Y in the compounds represented by the abovementioned Formula (2) represents a sulfur atom, that is, the compound represented by the abovementioned Formula (3) is preferable because of high photoelectric conversion efficiency.

In Formula (3), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, m is 2 or 3, X represents an acidic group, and a carbon-carbon double bond may be a cis form or a trans form. Ar, $R_1$, $R_2$, $R_3$, $R_5$, $R_6$, and X in Formula (3) are synonymous respectively with Ar, $R_1$, $R_2$, $R_3$, $R_5$, $R_6$, and X in Formula (2).

<<Compound Represented by Formula (4)>>

$R_3$ in the compounds represented by the abovementioned Formula (2) represents a hydrogen atom, that is, the compound represented by the abovementioned Formula (4) is preferable because of high photoelectric conversion efficiency.

In Formula (4), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, aryl group, amino group, and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, m is 2 or 3, X represents an acidic group, and a carbon-carbon double bond may be a cis form or a trans form.

Ar, $R_1$, $R_2$, $R_5$, $R_6$, and X in Formula (4) are synonymous respectively with Ar, $R_1$, $R_2$, $R_5$, $R_6$, and X in Formula (3).

Specific examples of the compounds represented by Formulas (1) through (4) are shown below. However the present invention is not limited to these examples. In the specific examples, a portion at which a wavy line is attached represents a bonding portion at which respective elements are bonded in Formulas (1) through (4).

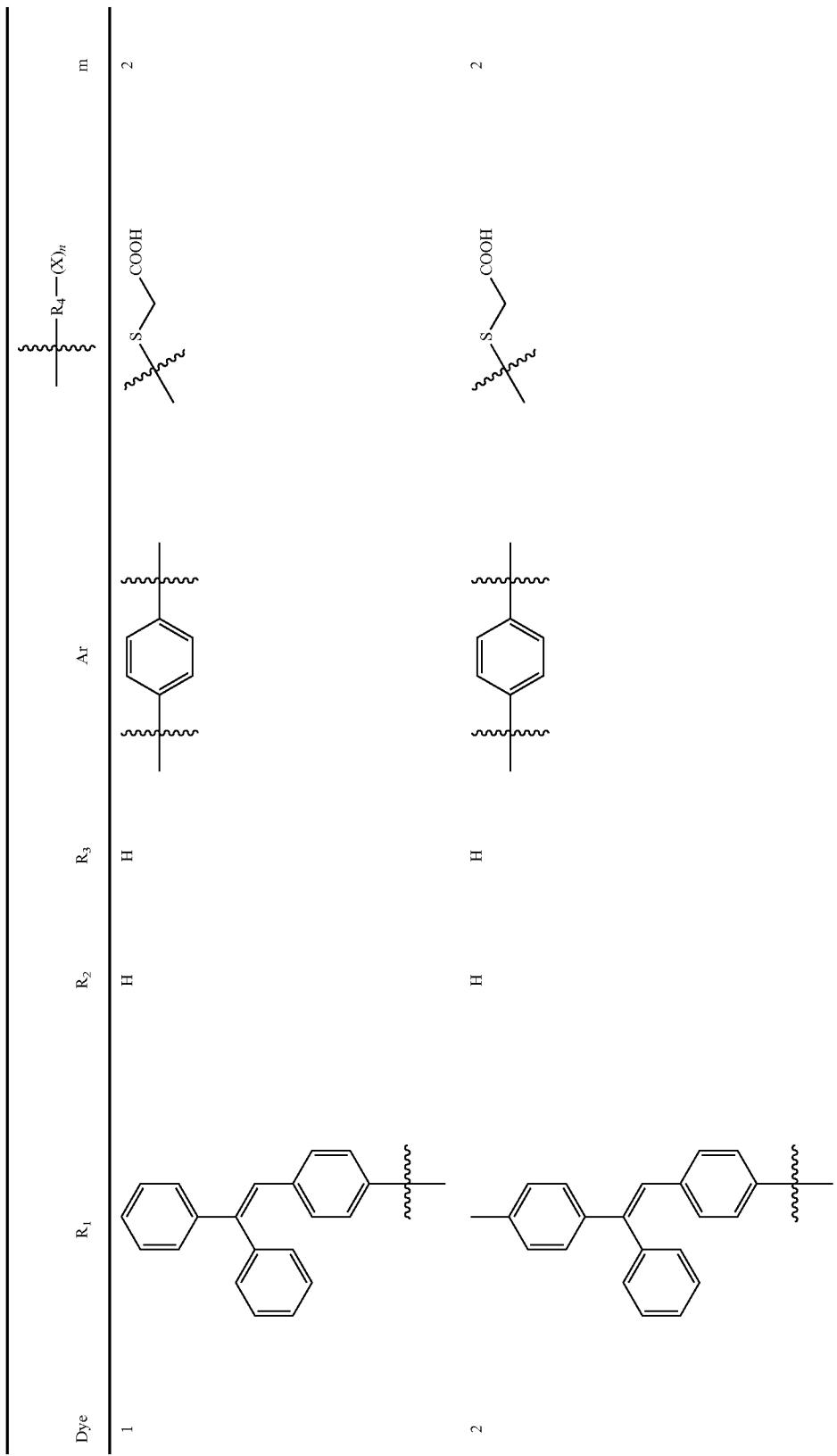

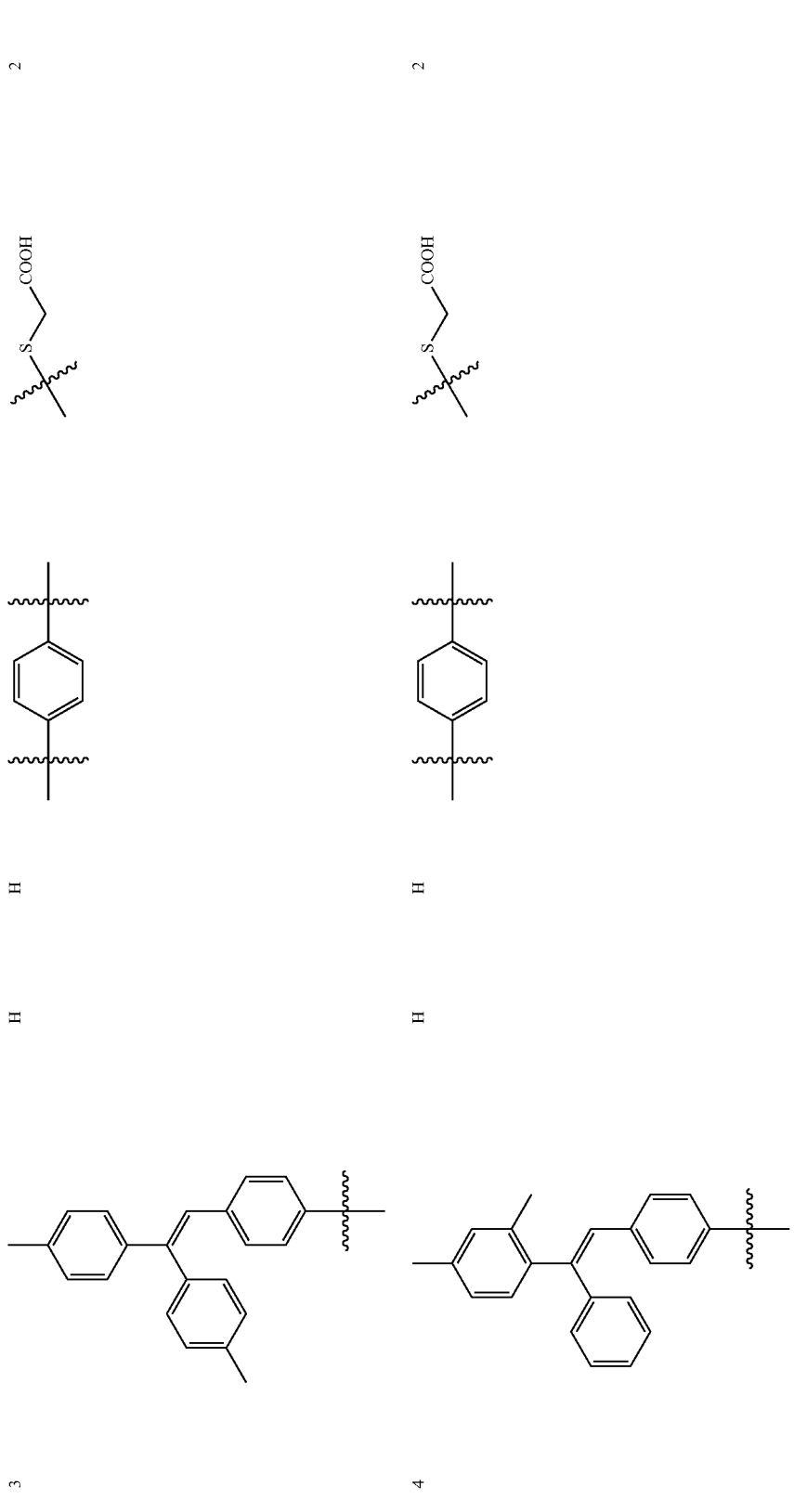

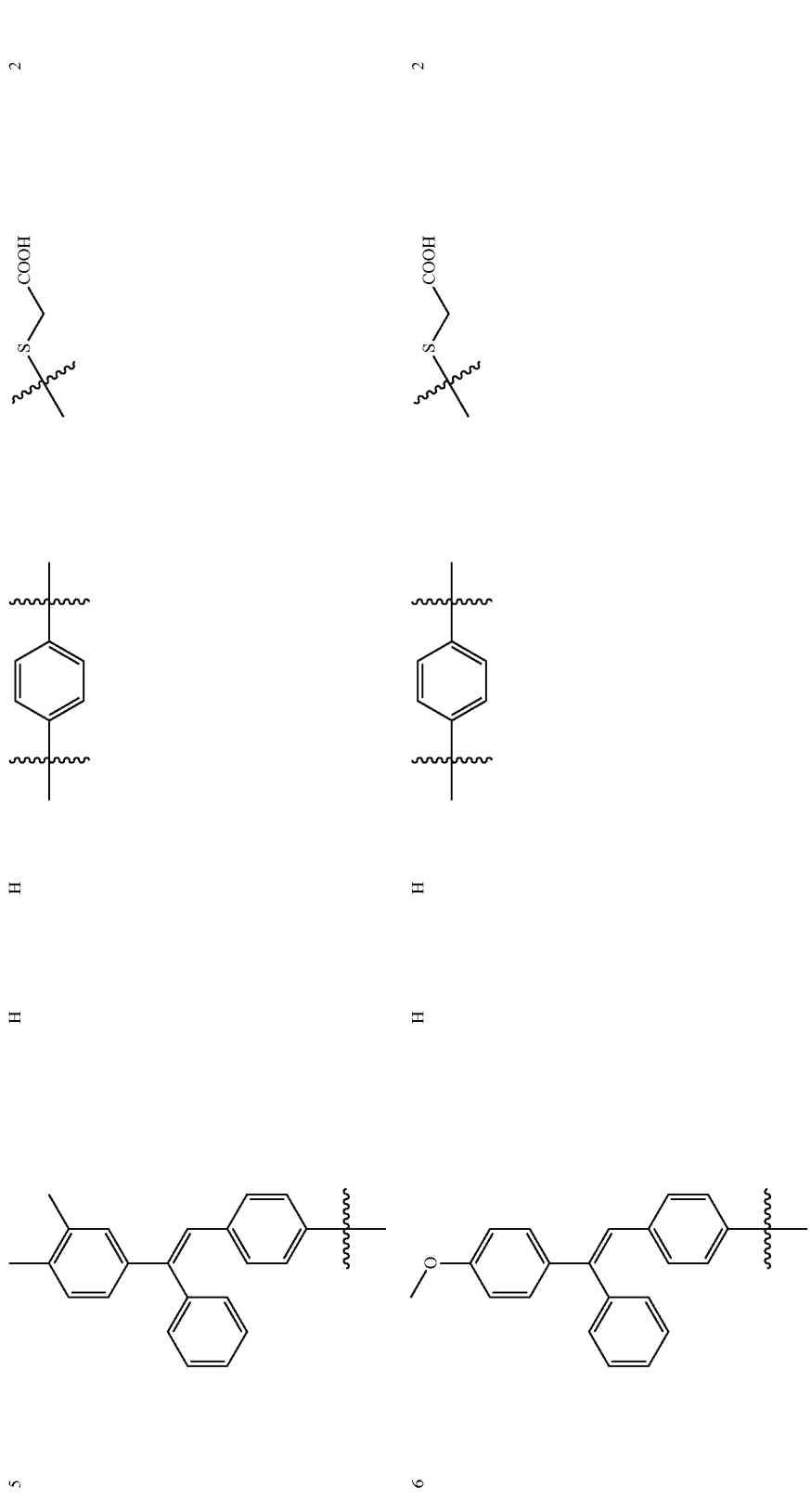

-continued
| 7 | 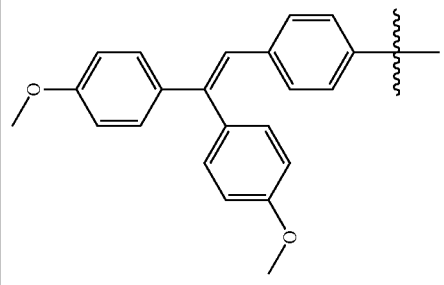 | H | H |  | 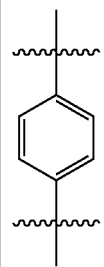 | 2 |
| --- | --- | --- | --- | --- | --- | --- |
| 8 | 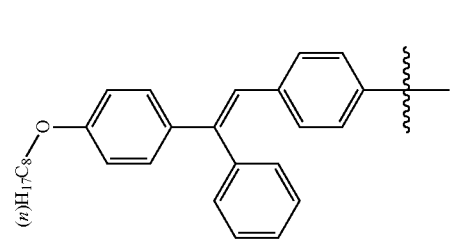 | H | H |  | 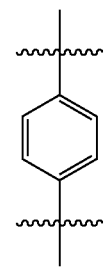 | 2 |

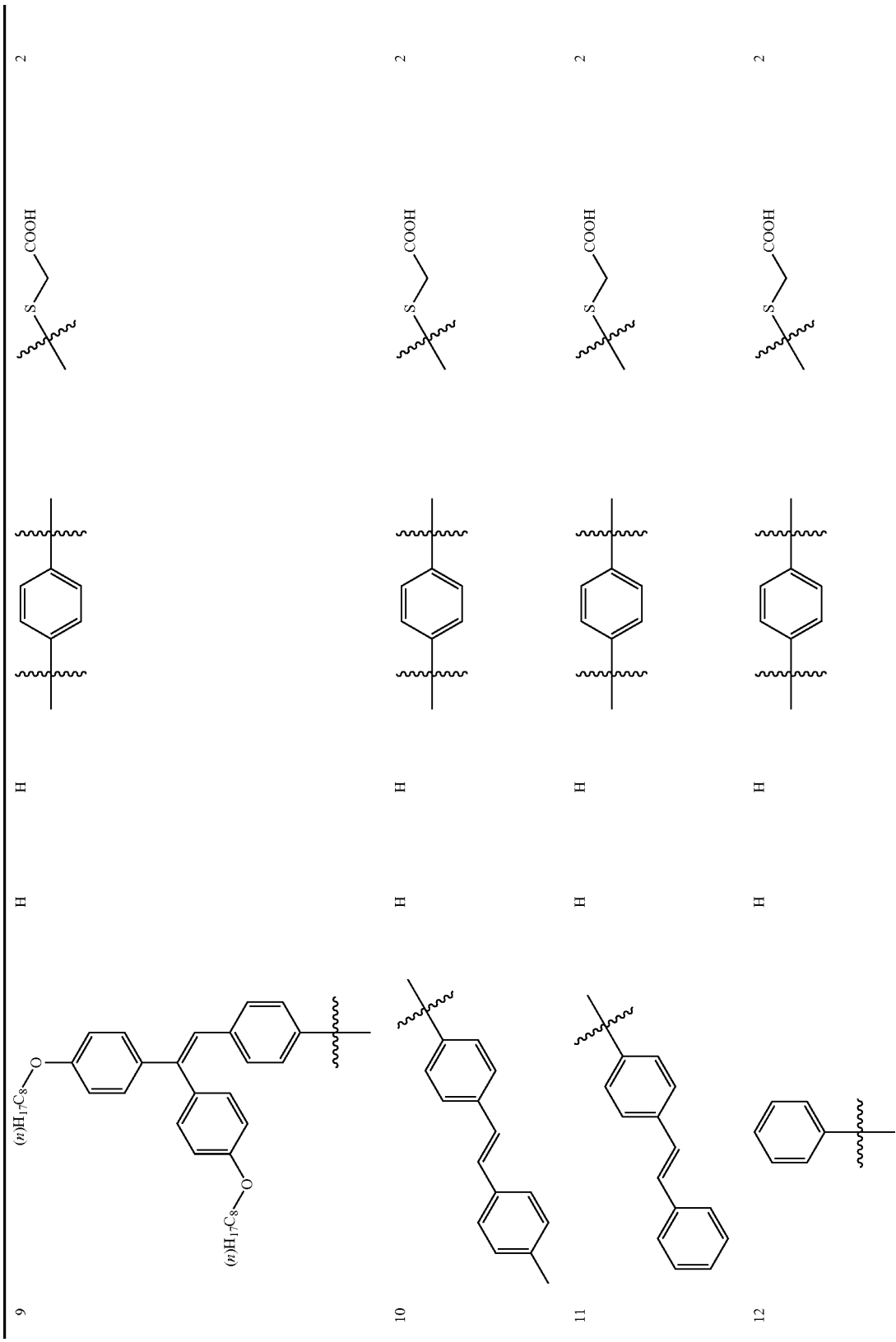

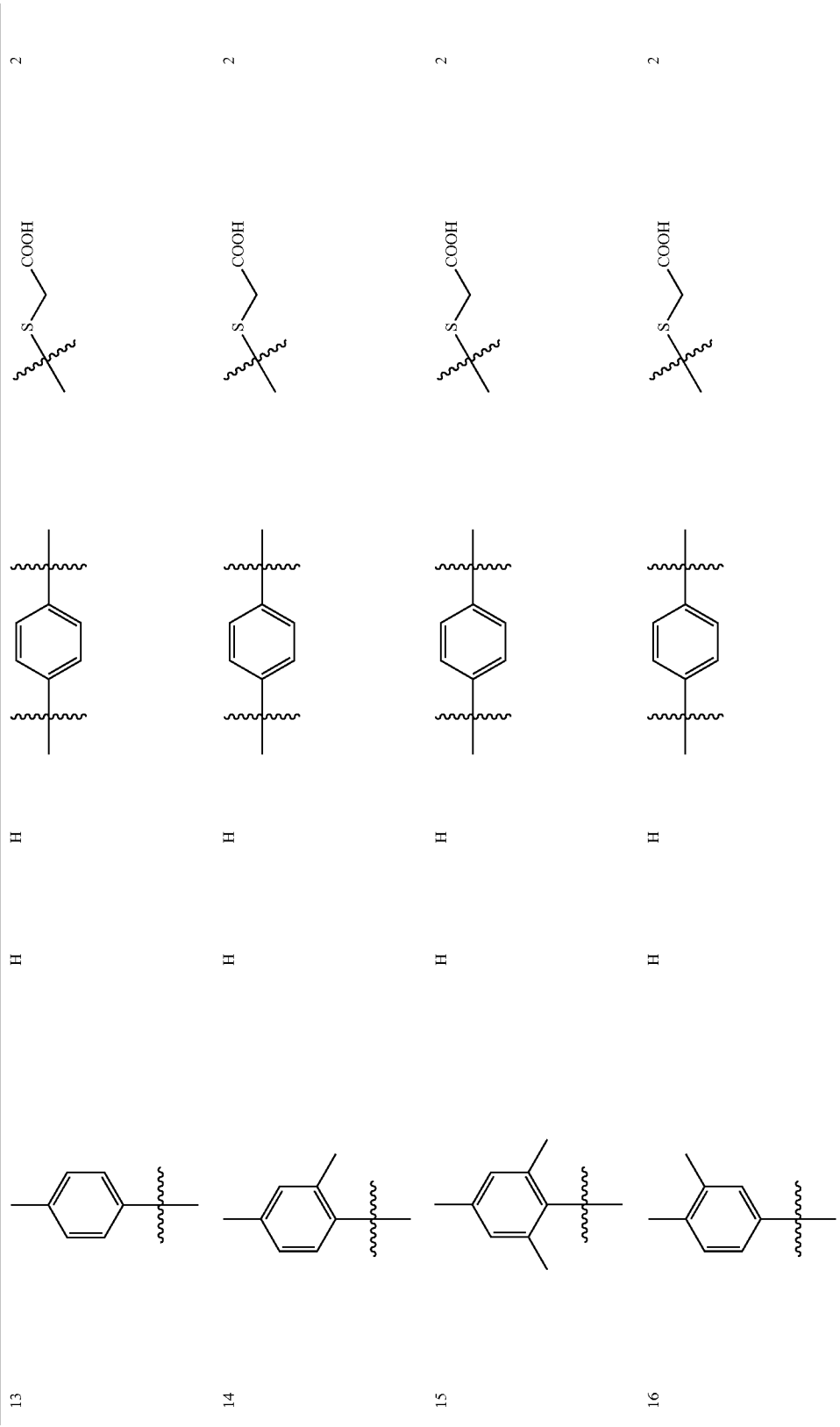

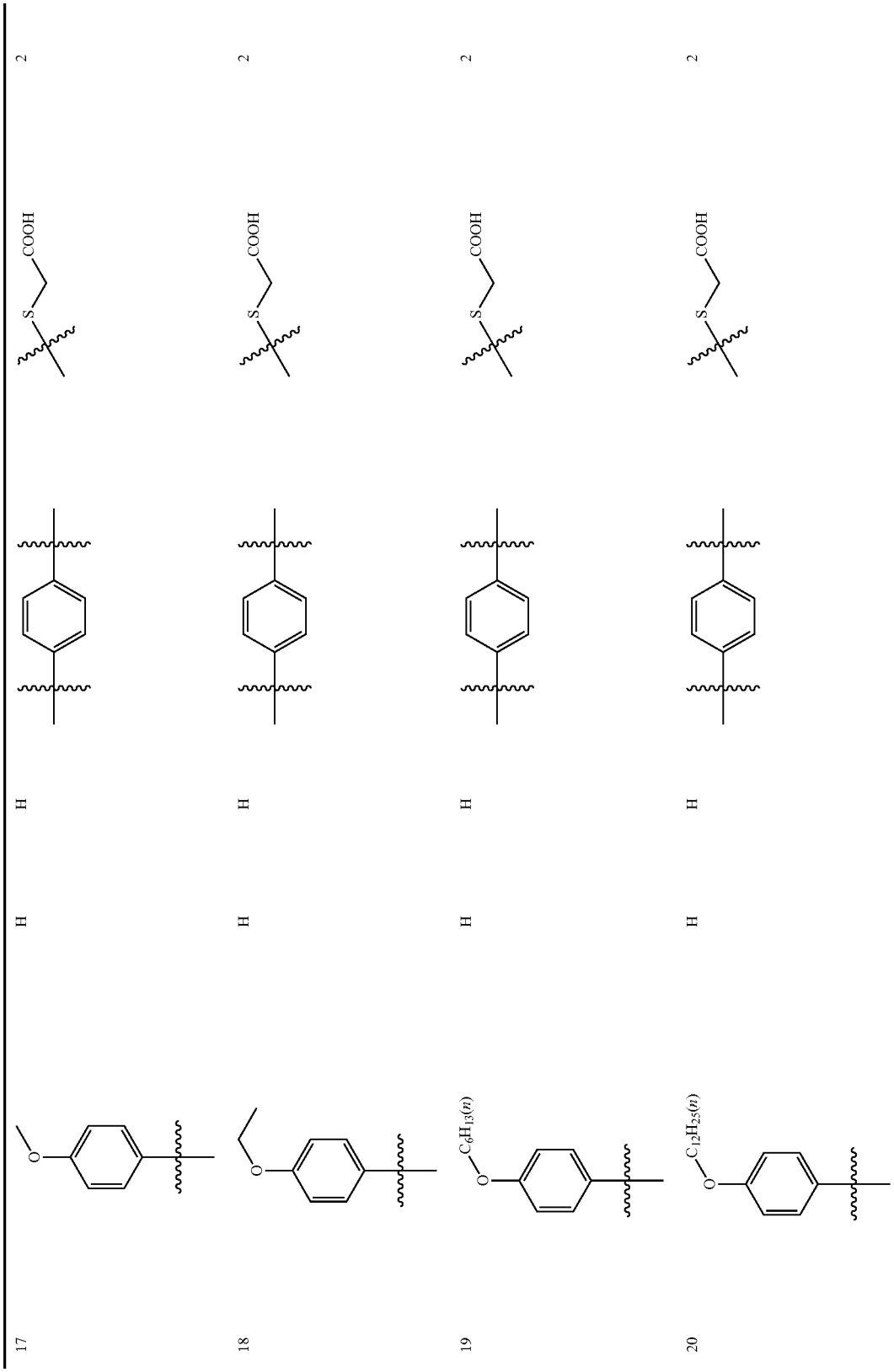

-continued

| | | | | | |
|---|---|---|---|---|---|
| 21 | 9,9-dimethylfluorenyl | H | H | p-phenylene | -S-CH2CH2-COOH | 2 |
| 22 | fluorenyl | H | H | p-phenylene | -S-CH2CH2-COOH | 2 |
| 23 | 9,9-di(n-C8H17)fluorenyl | H | H | p-phenylene | -S-CH2CH2-COOH | 2 |
| 24 | Me | H | H | p-phenylene | -S-CH2CH2-COOH | 2 |
| 25 | Et | H | H | p-phenylene | -S-CH2CH2-COOH | 2 |
| 26 | n-C3H7 | H | H | p-phenylene | -S-CH2CH2-COOH | 2 |
| 27 | n-C4H9 | H | H | p-phenylene | -S-CH2CH2-COOH | 2 |
| 28 | n-C6H13 | H | H | p-phenylene | -S-CH2CH2-COOH | 2 |
| 29 | n-C8H17 | H | H | p-phenylene | -S-CH2CH2-COOH | 2 |

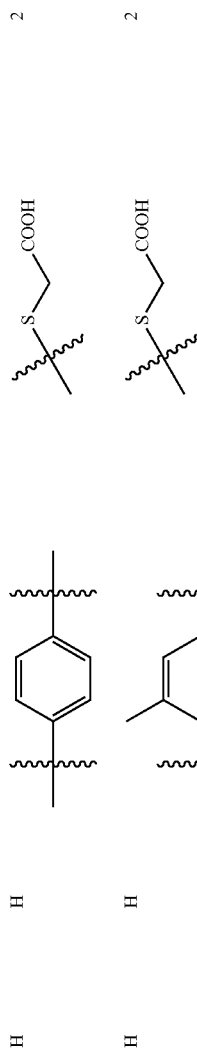
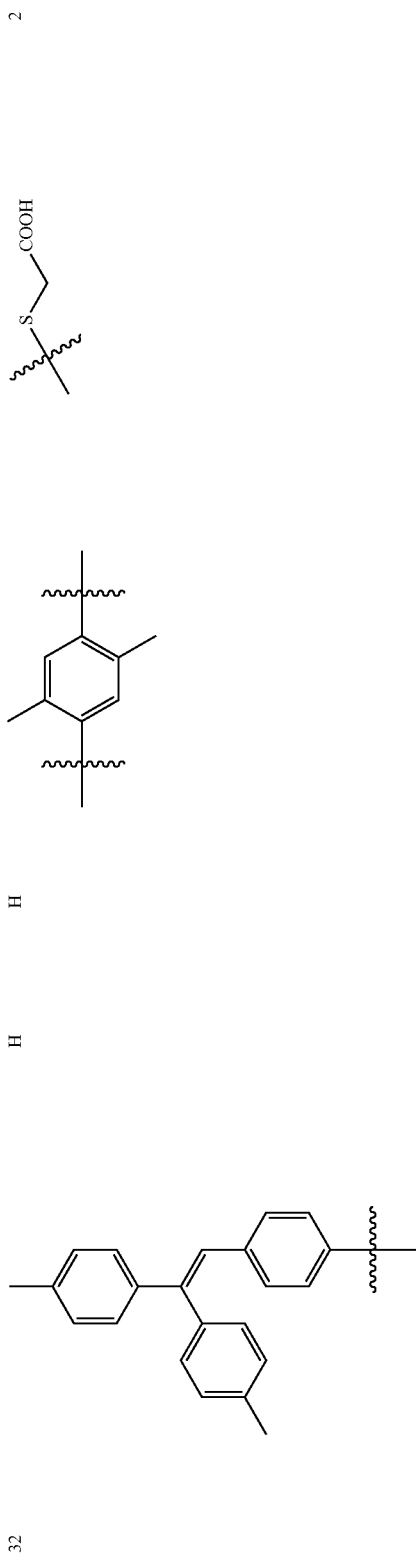

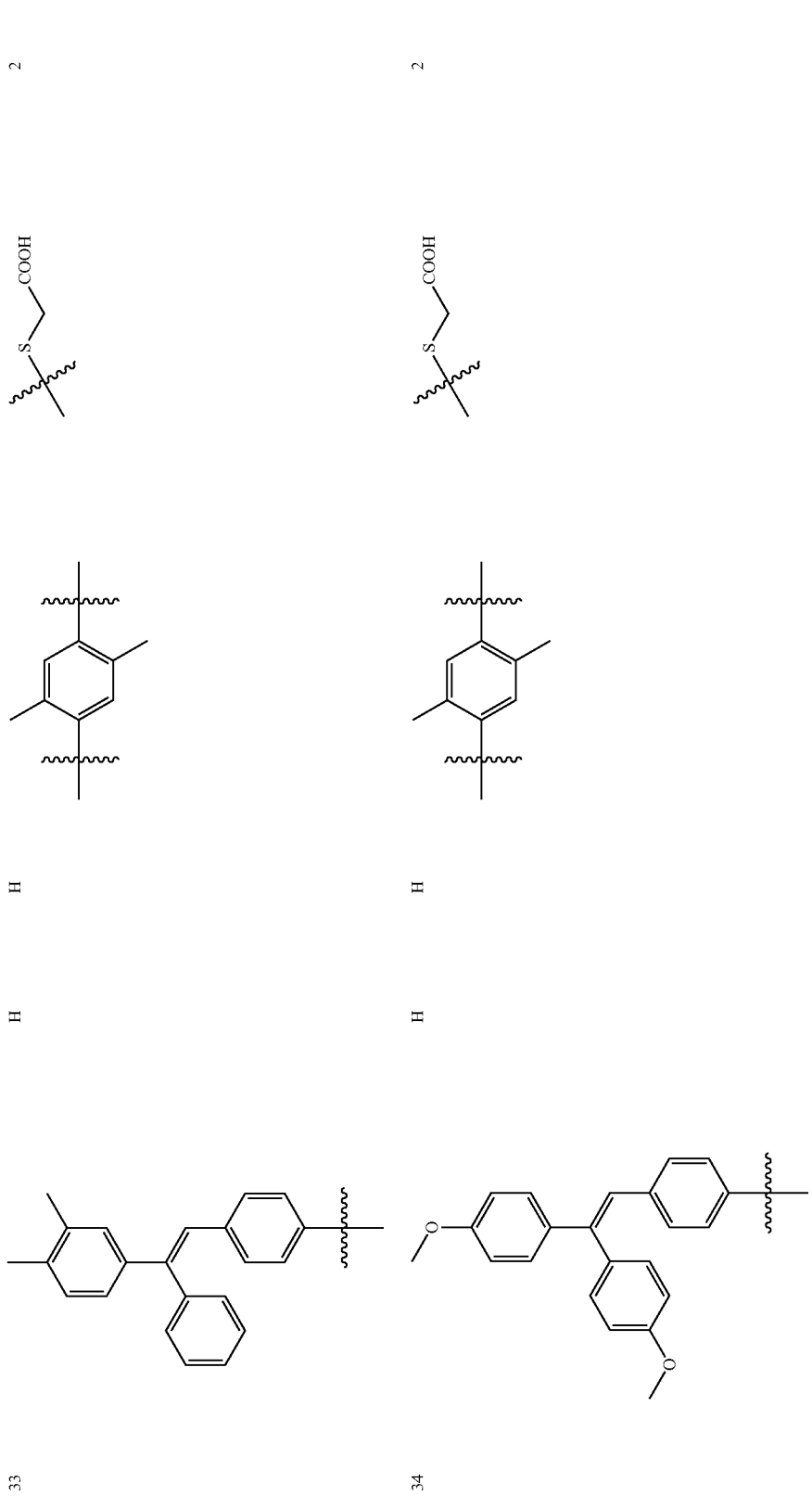

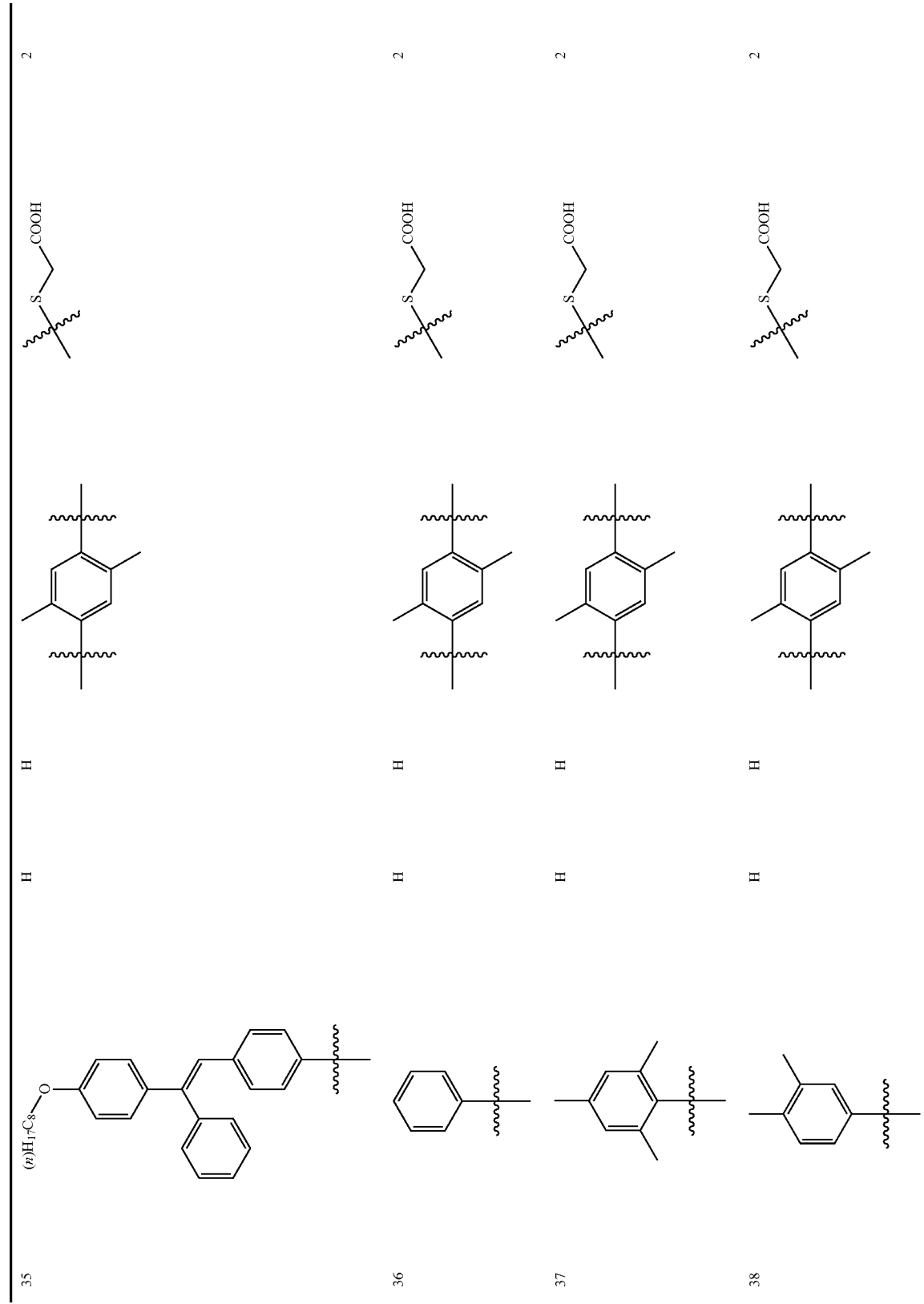

-continued
| | | | | | |
|---|---|---|---|---|---|
| 39 |  | H | H | 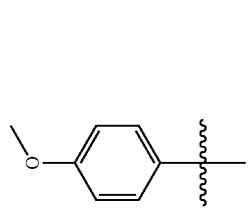 | 2 |
| 40 | 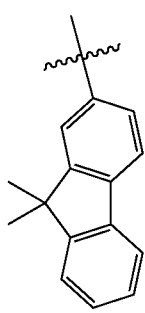 | H | H |  | 2 |
| 41 | 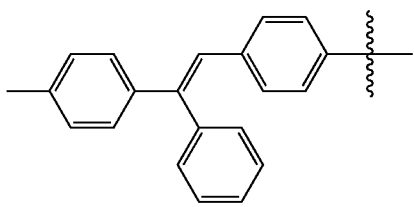 | H | H | 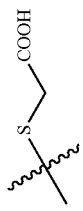 | 2 |

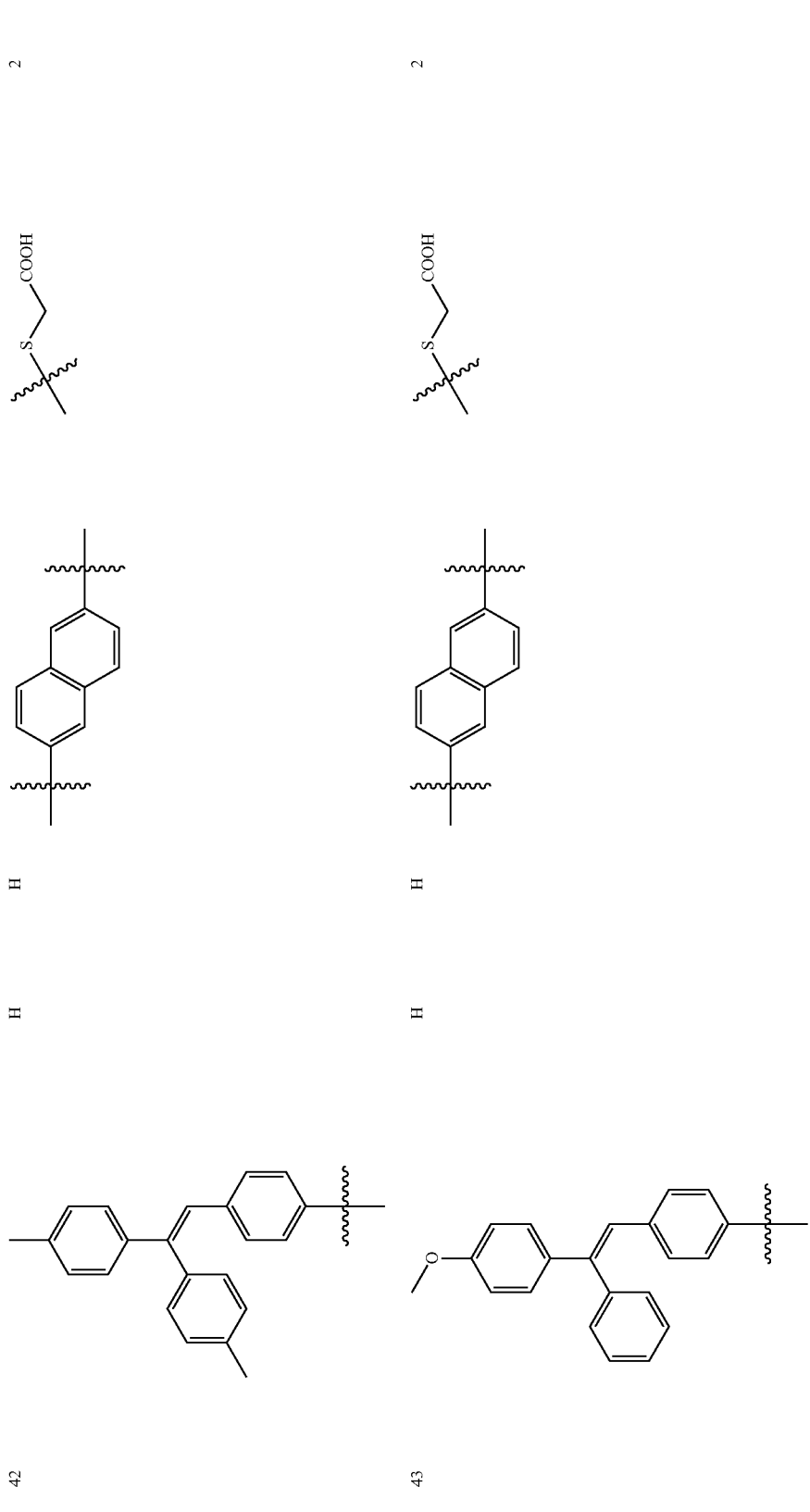

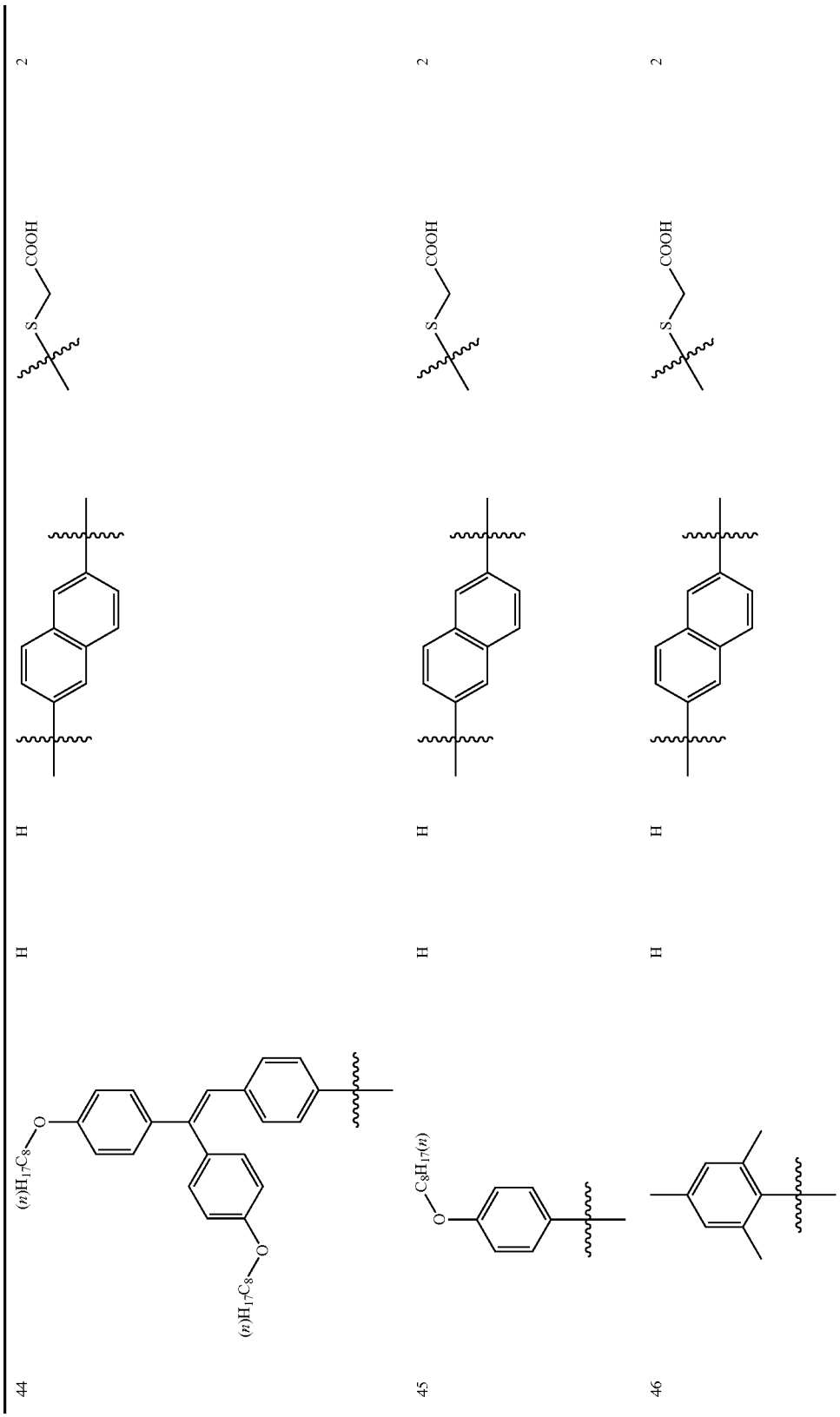

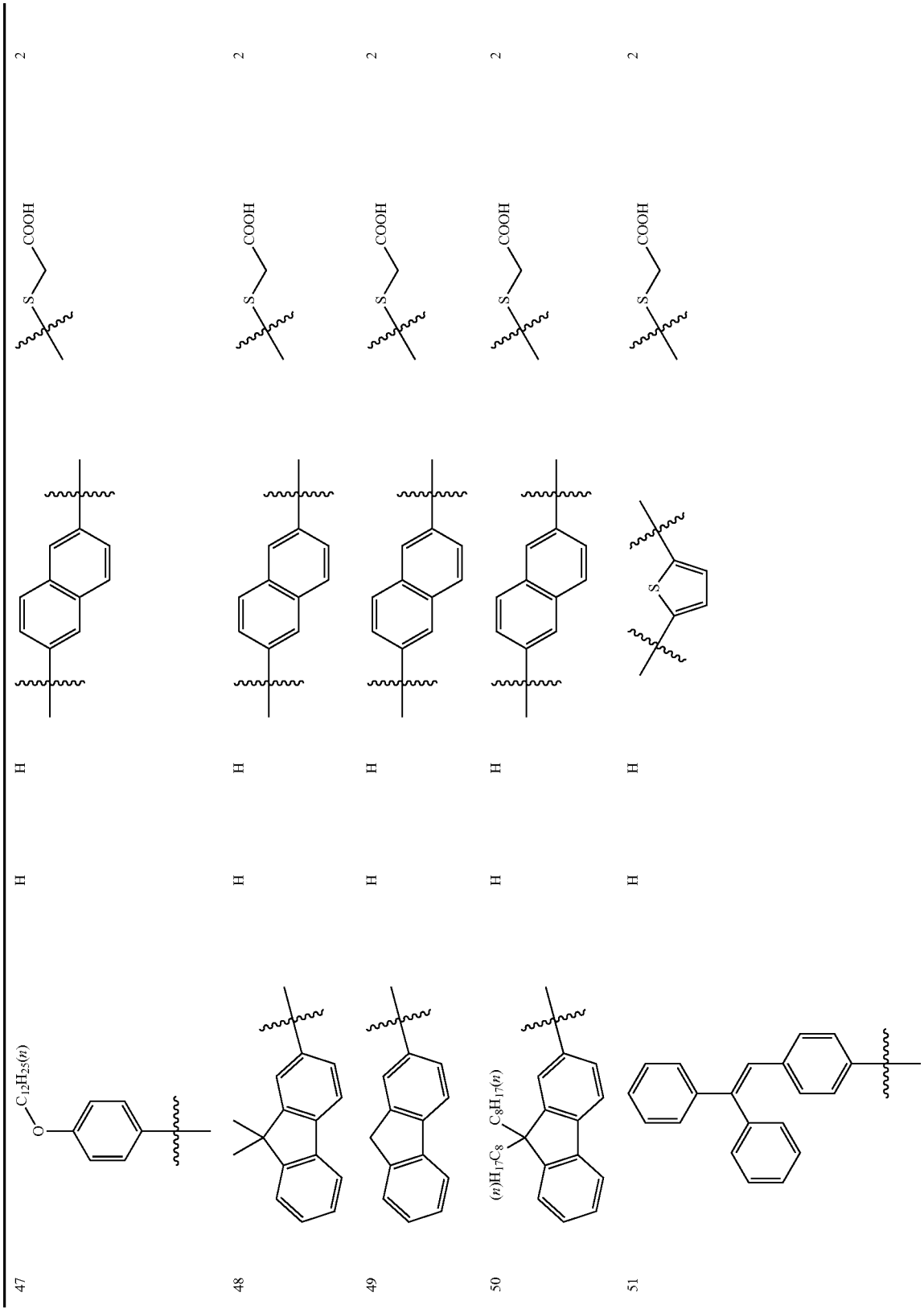

-continued
| | | | | | |
|---|---|---|---|---|---|
| 52 | 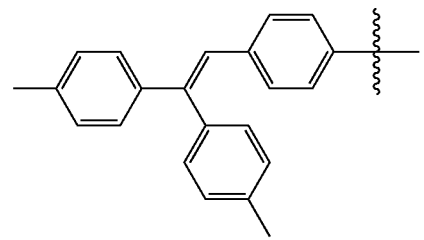 | H | H |  |  | 2 |
| 53 | 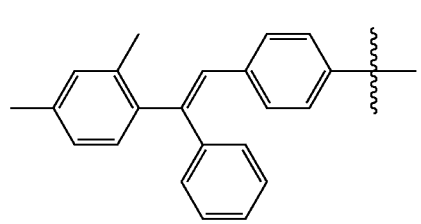 | H | H |  |  | 2 |
| 54 | 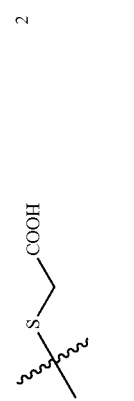 | H | H |  | | 2 |

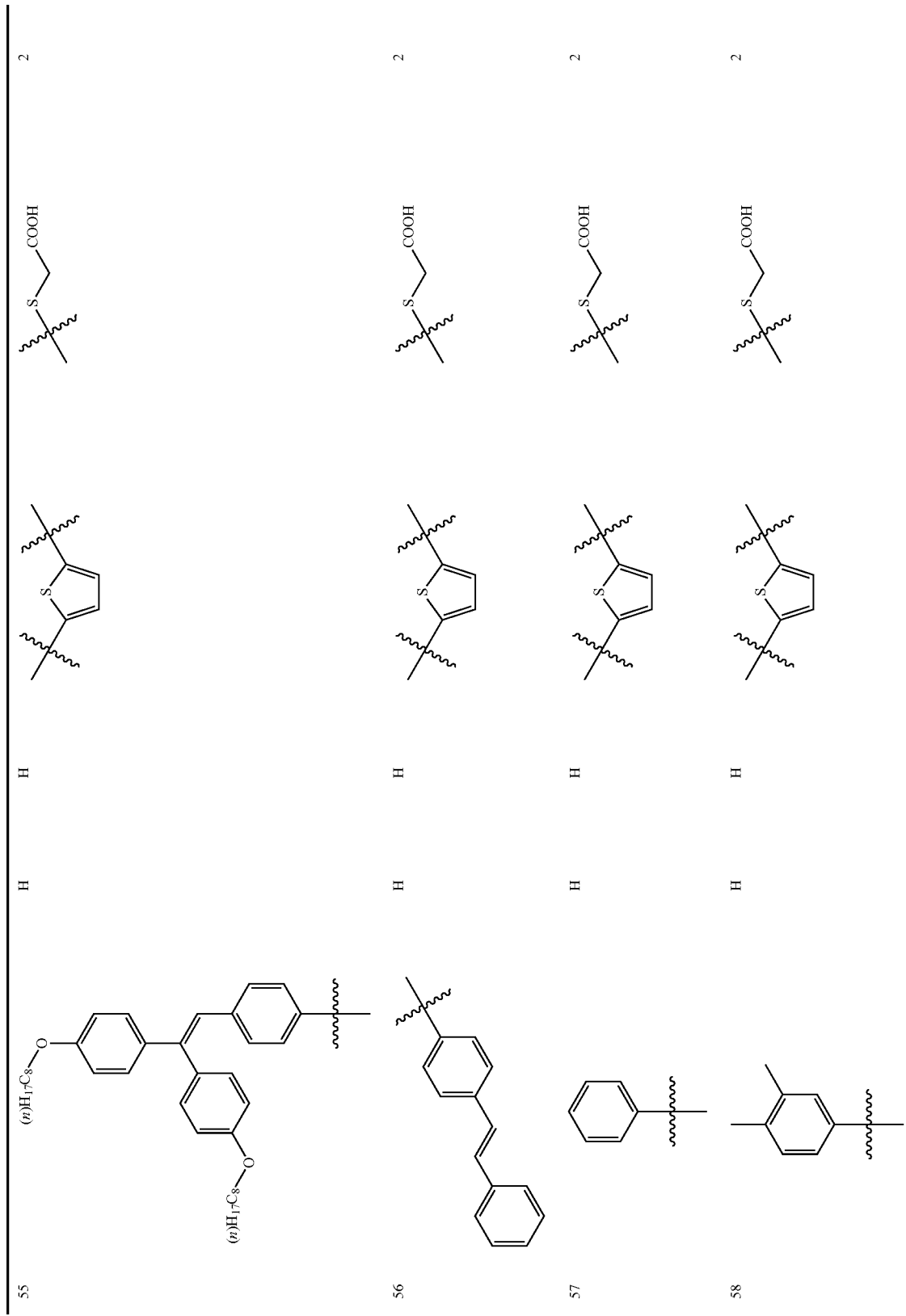

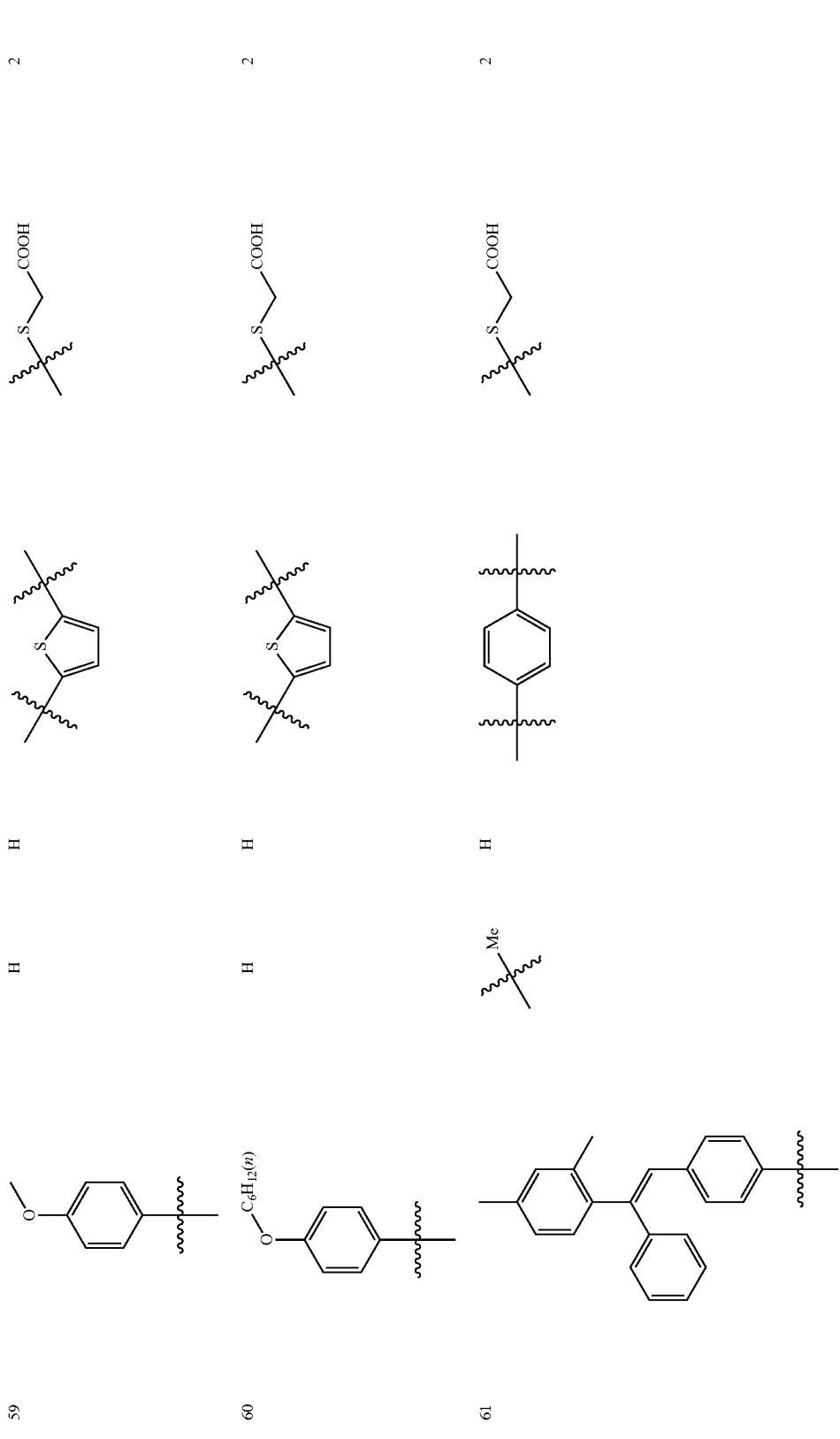

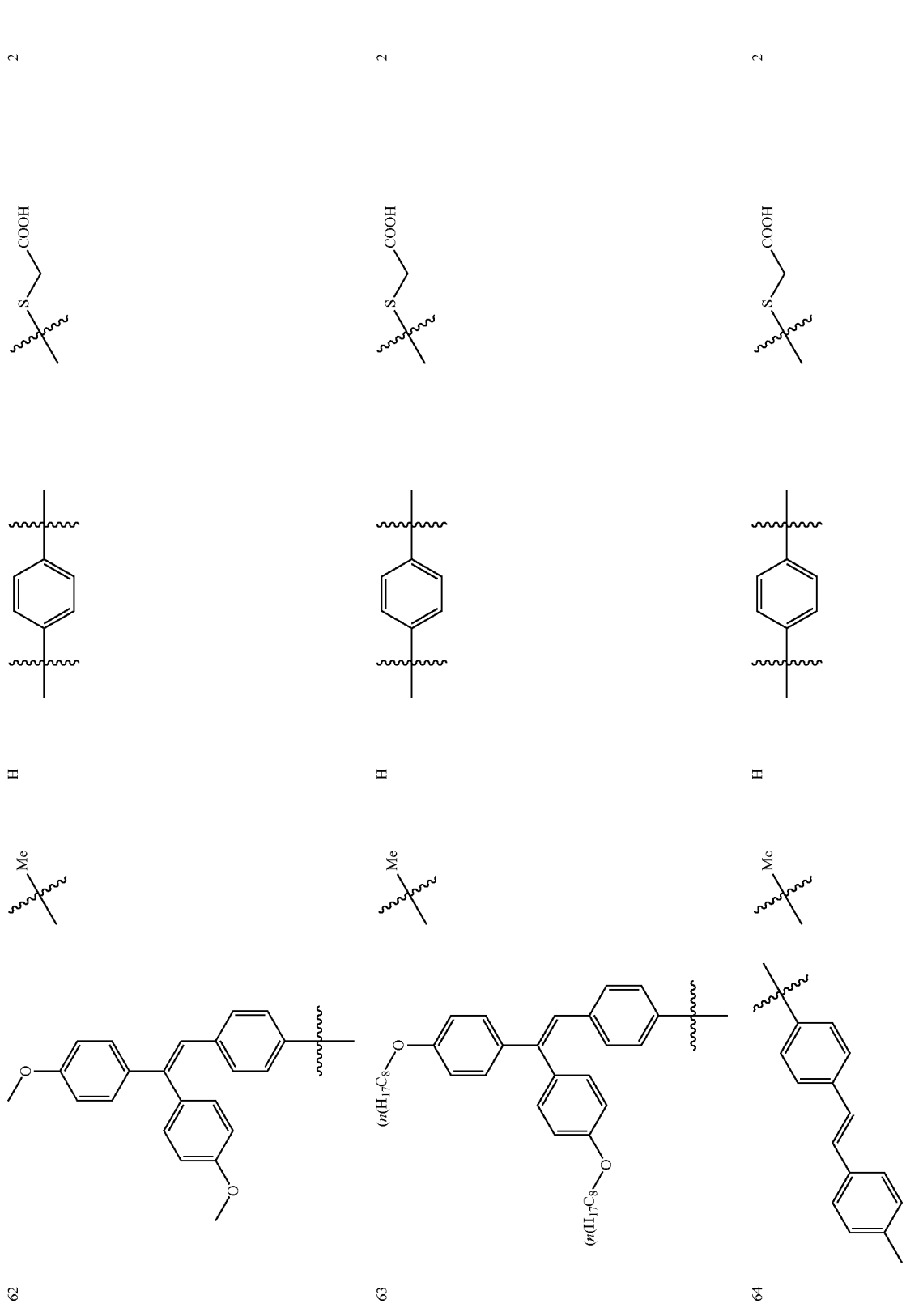

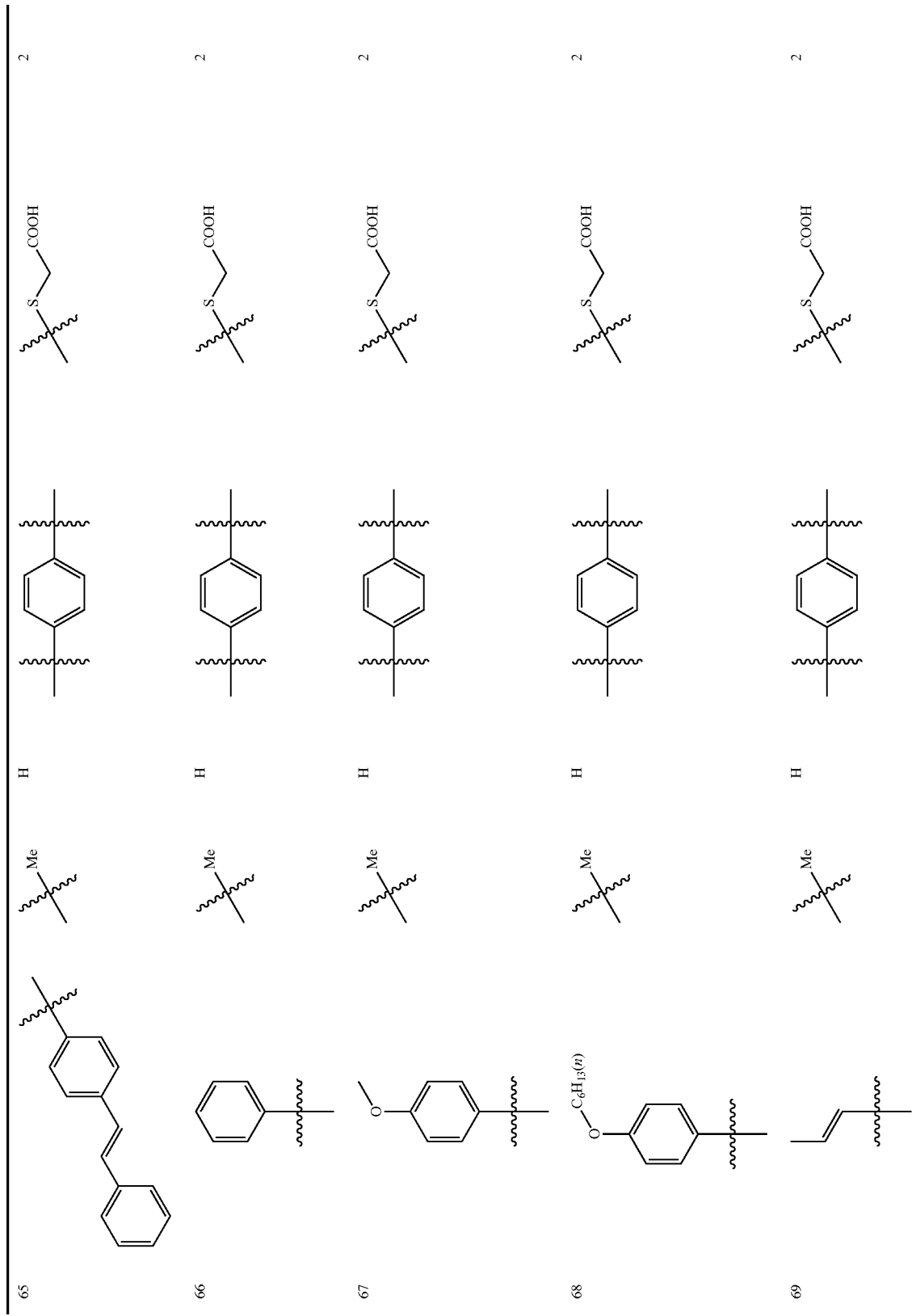

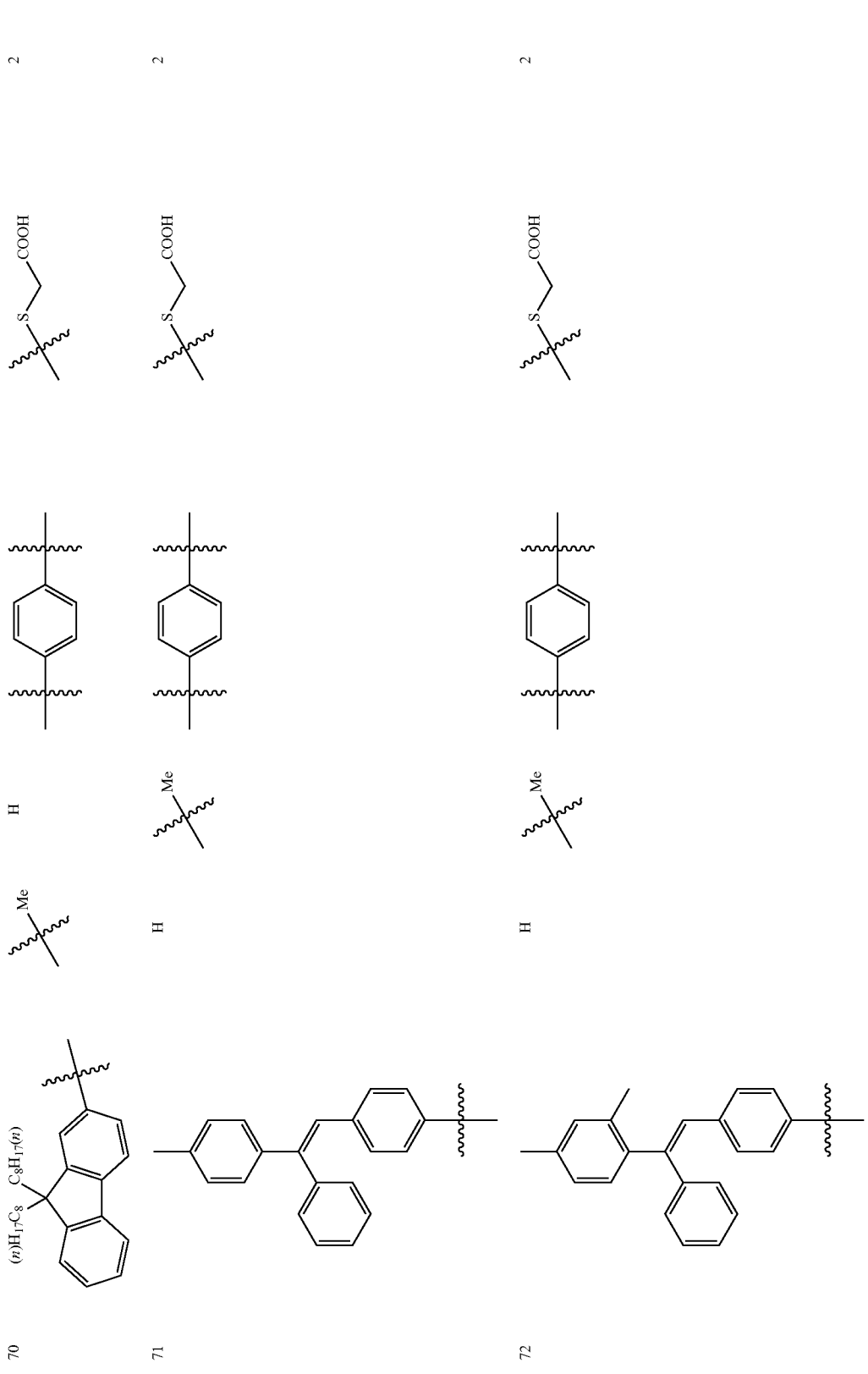

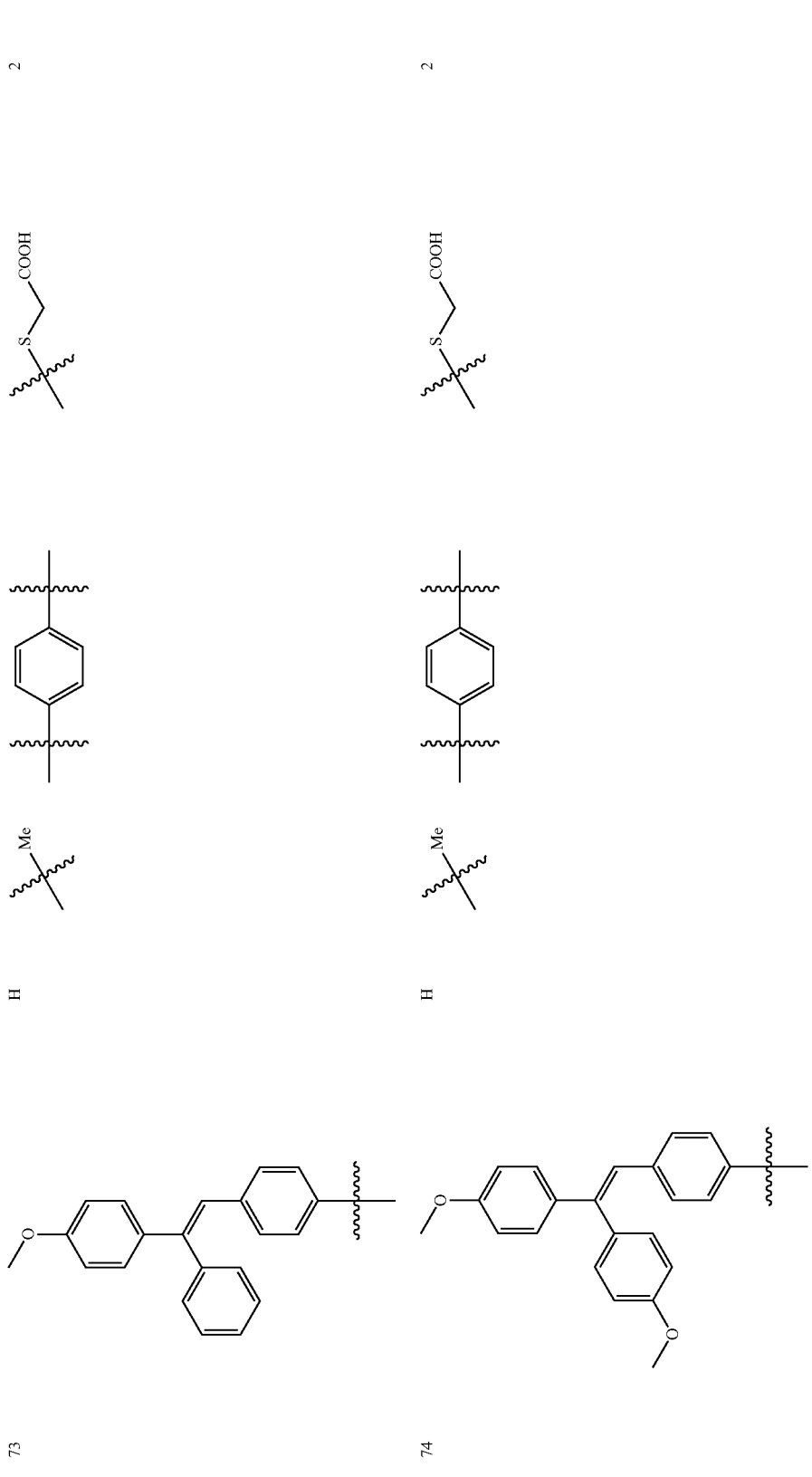

-continued
| | | | | | |
|---|---|---|---|---|---|
| 75 |  | H | 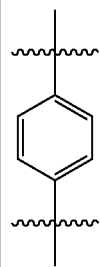 |  | 2 |
| 76 | 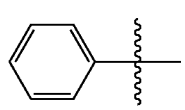 | H | 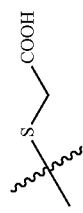 | 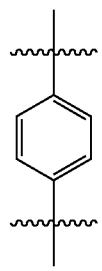 | 2 |
| 77 | 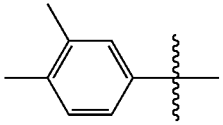 | H | 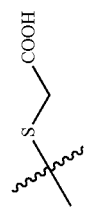 | 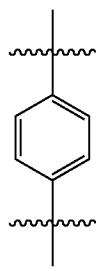 | 2 |

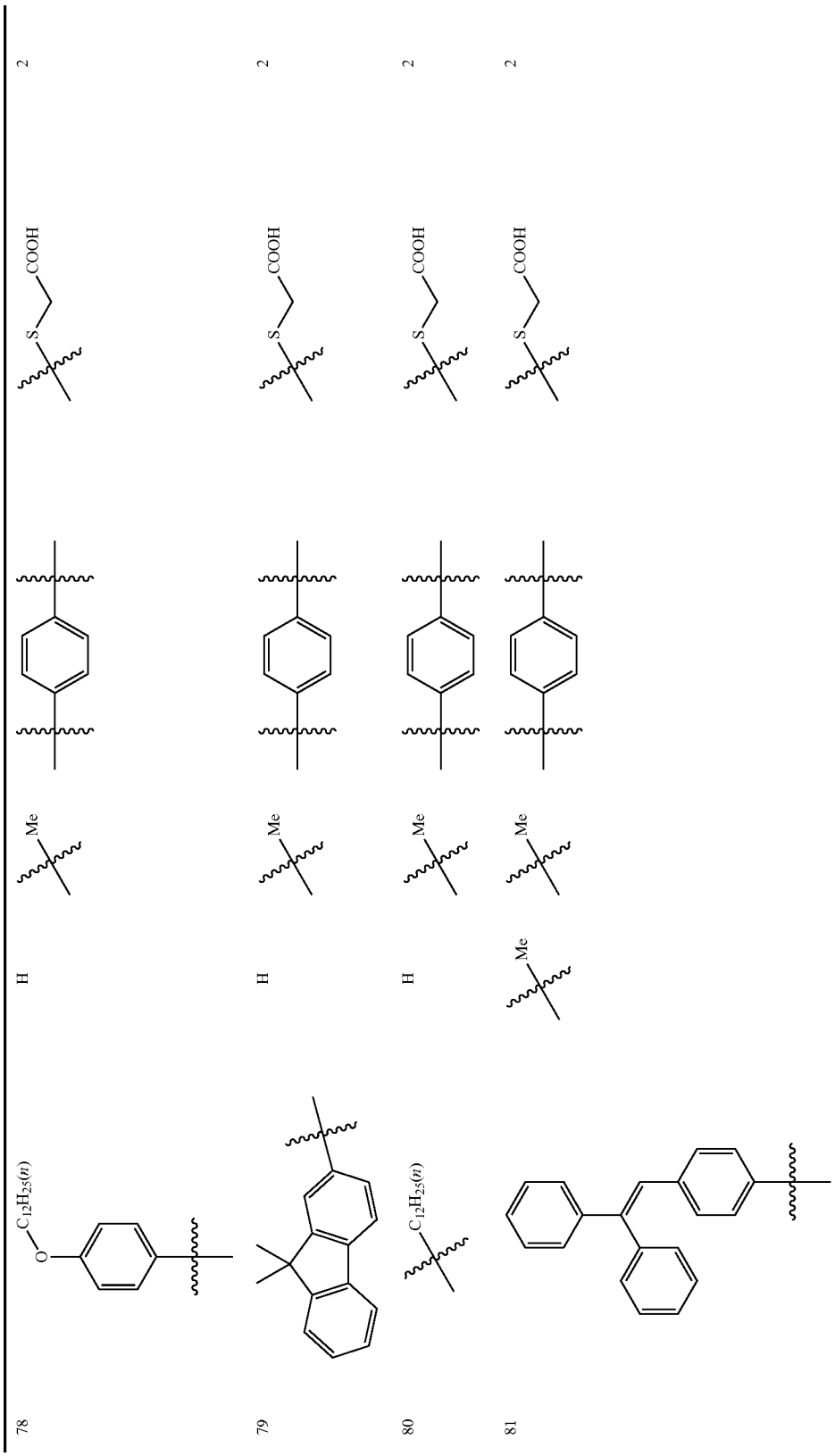

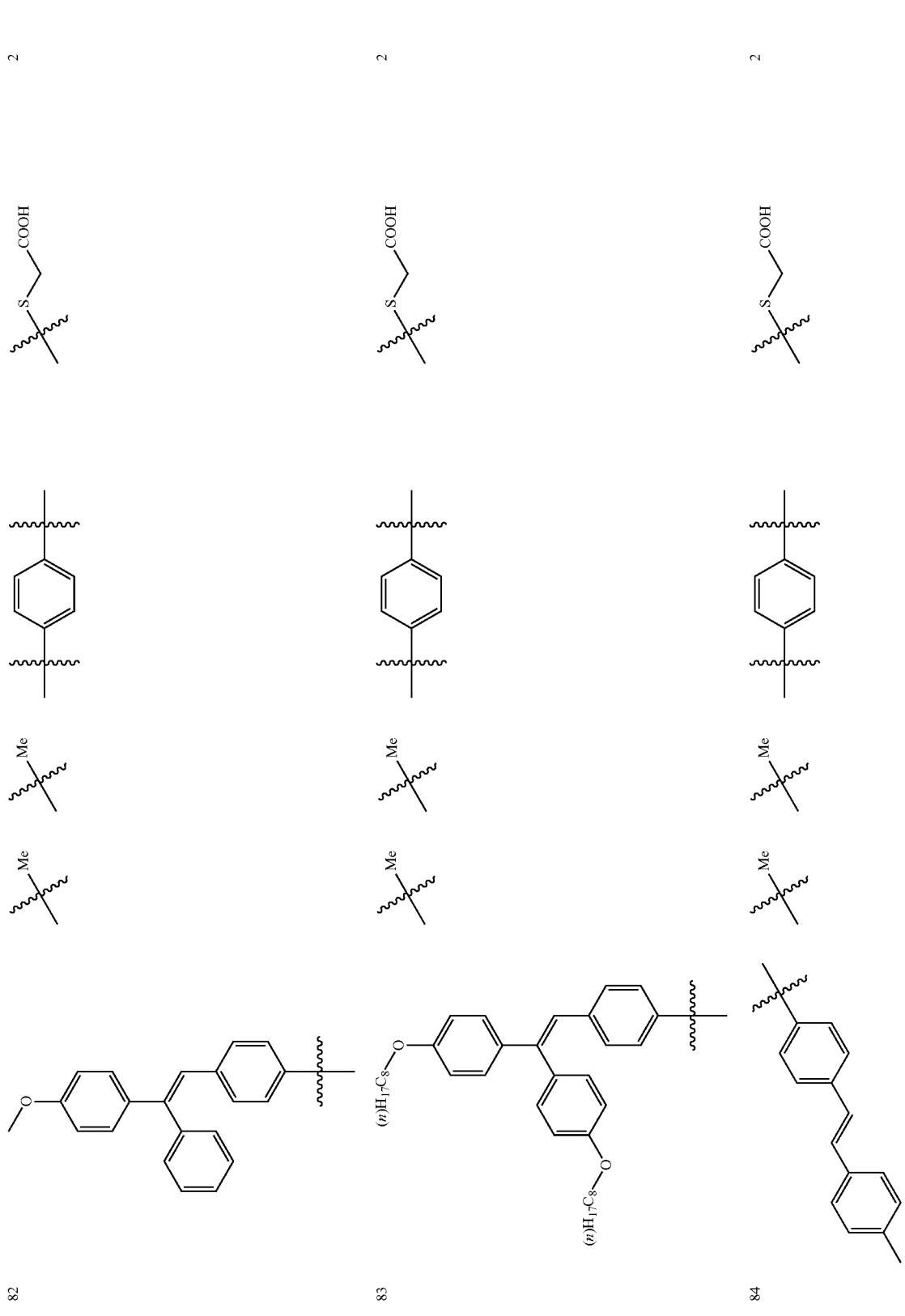

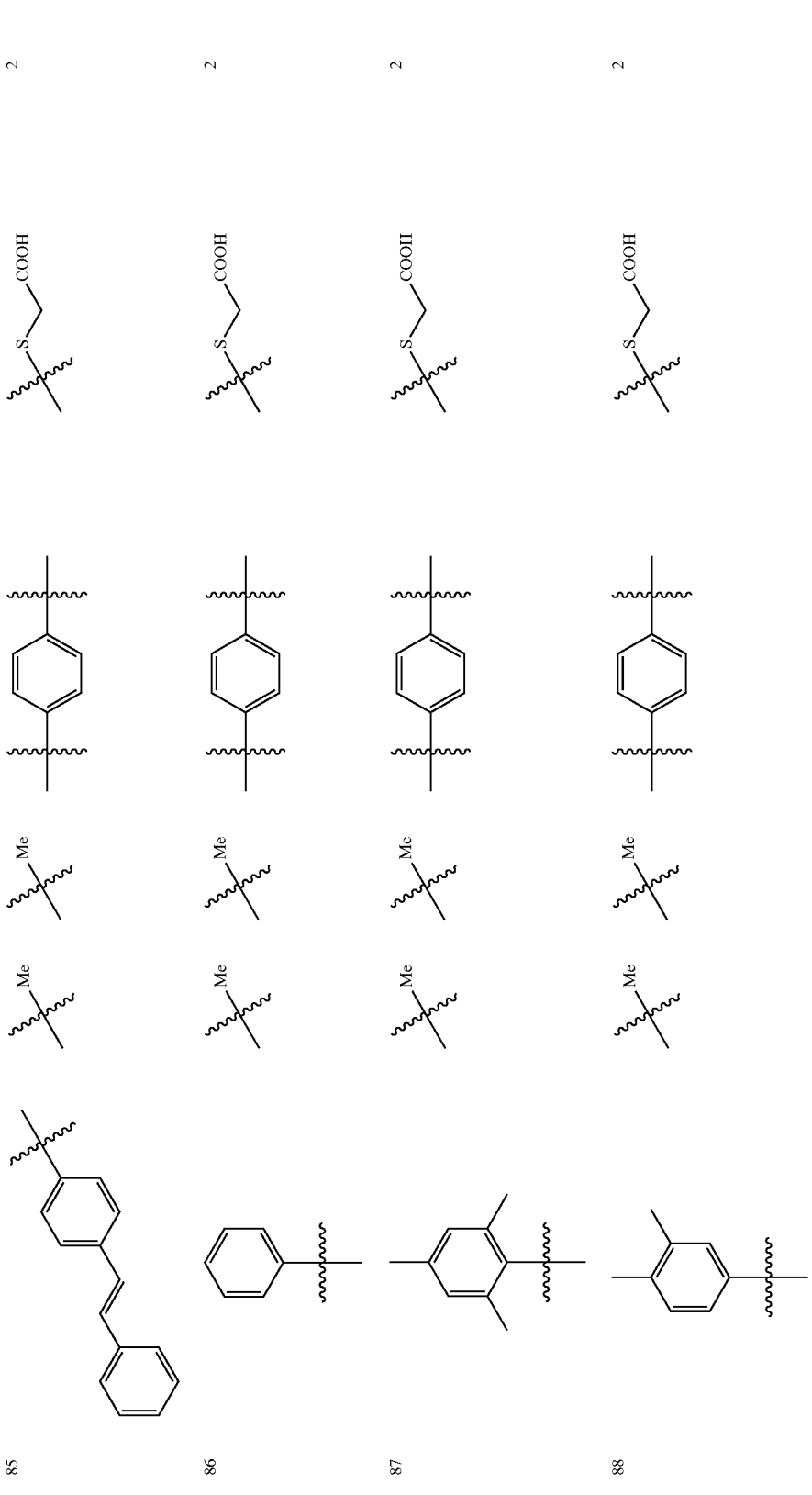

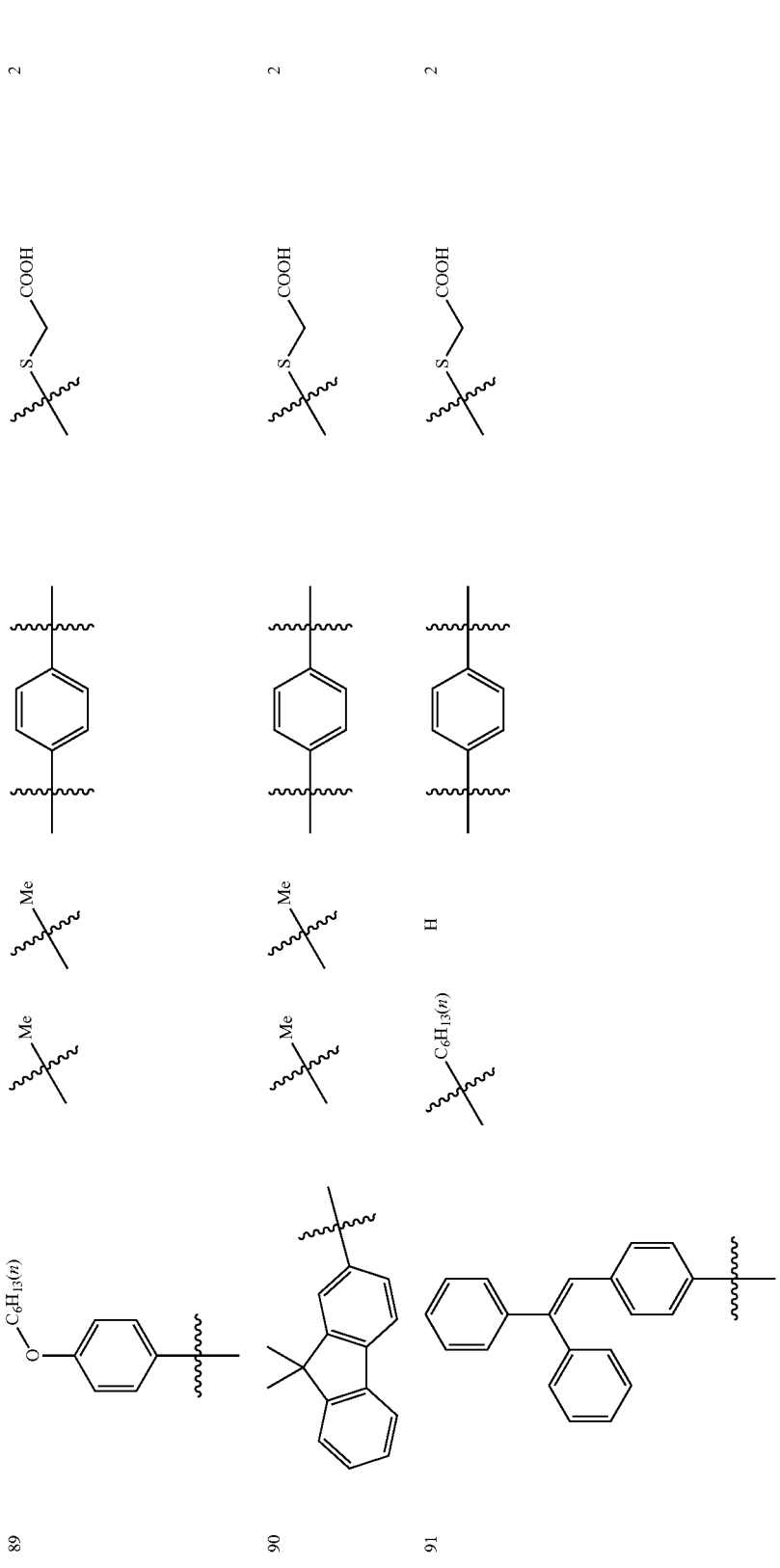

-continued
| | | | | |
|---|---|---|---|---|
| 92 | 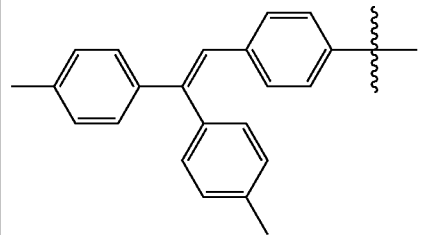 | C₆H₁₃(n) H  | 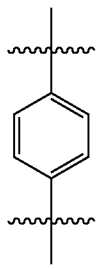 |  2 |
| 93 | 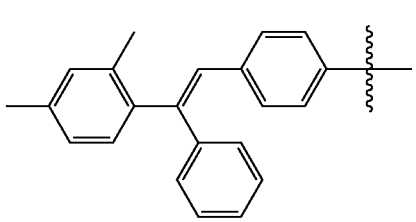 | C₆H₁₃(n) H  | 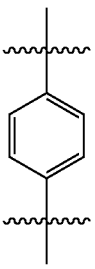 | 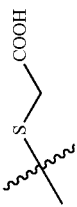 2 |

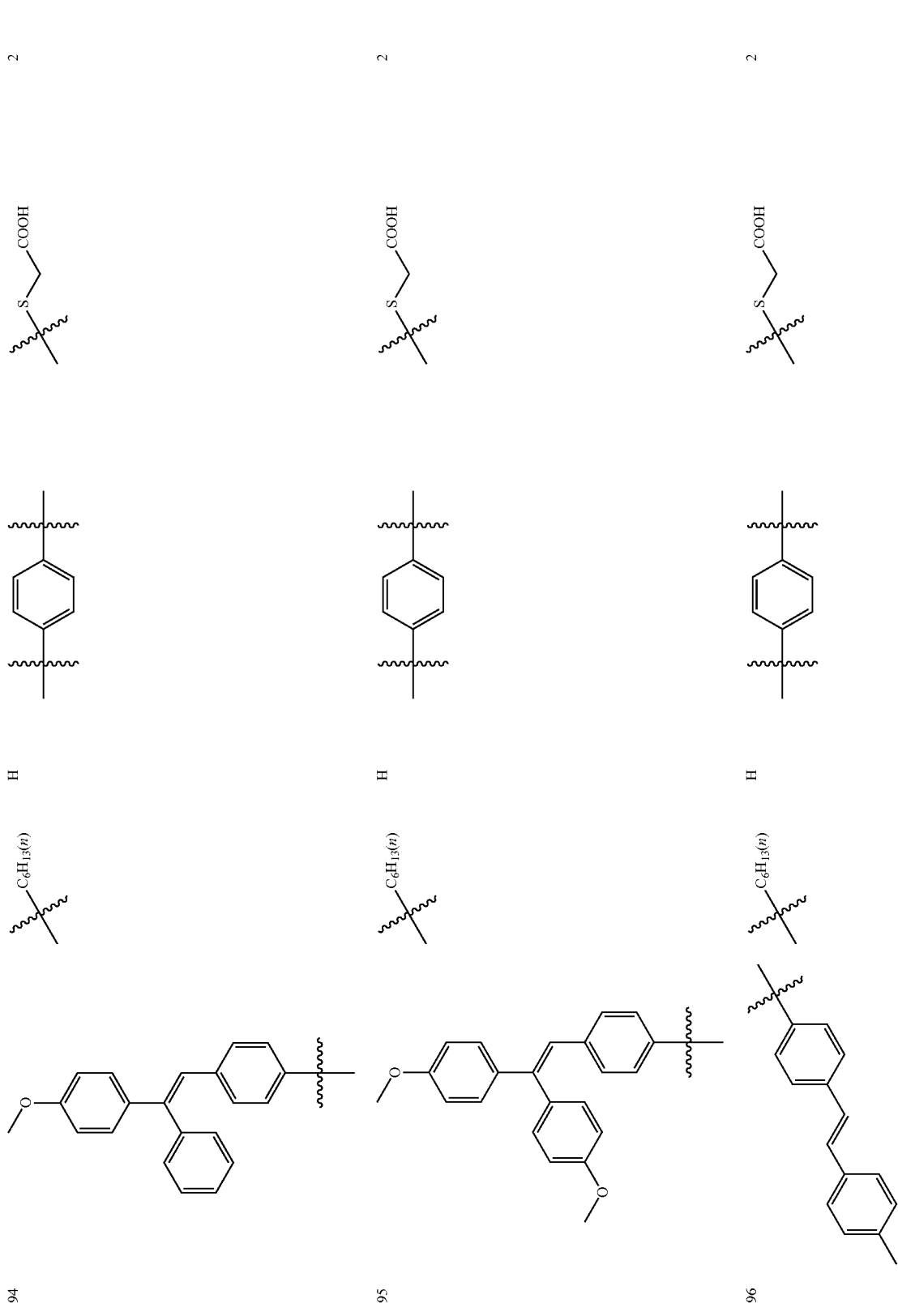

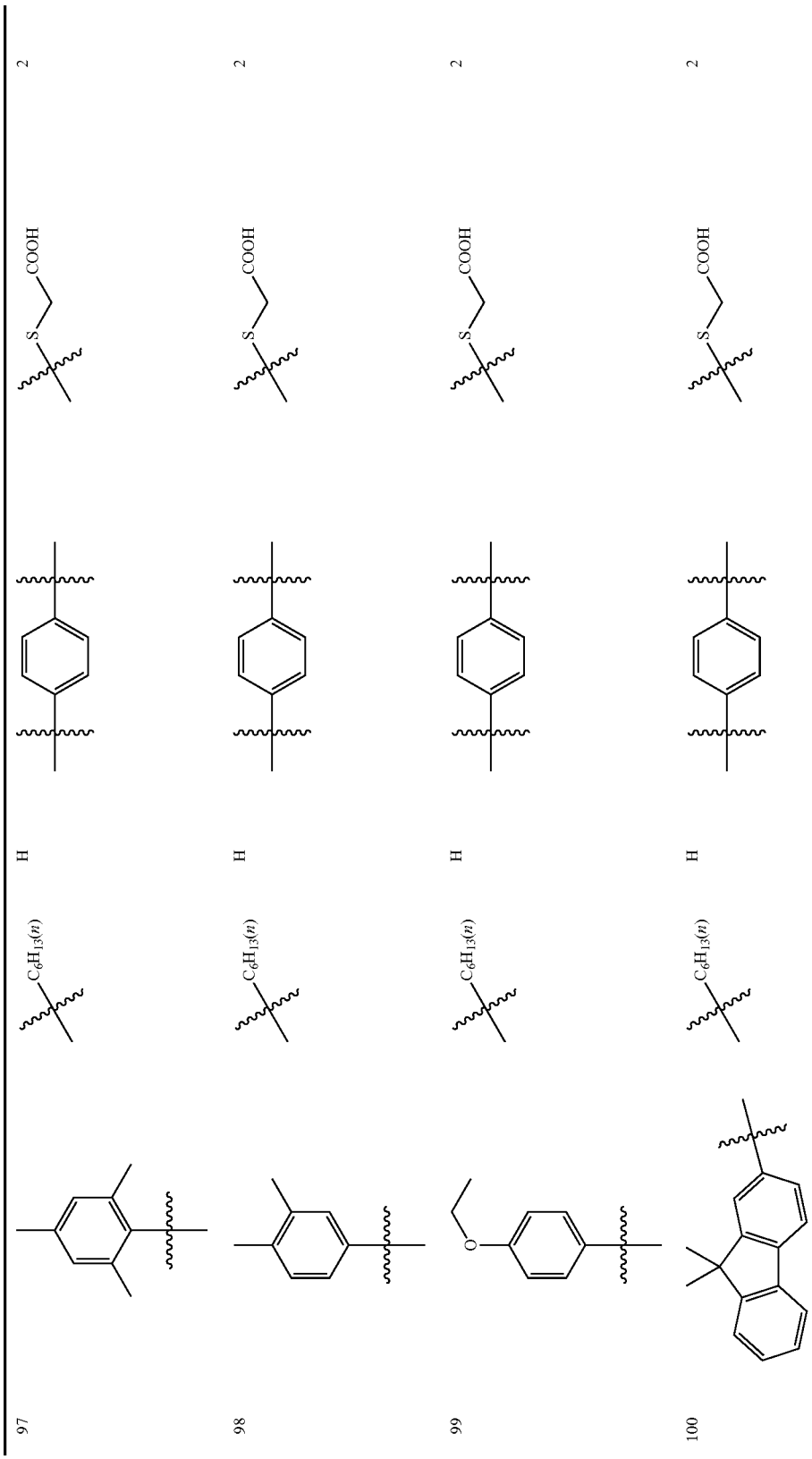

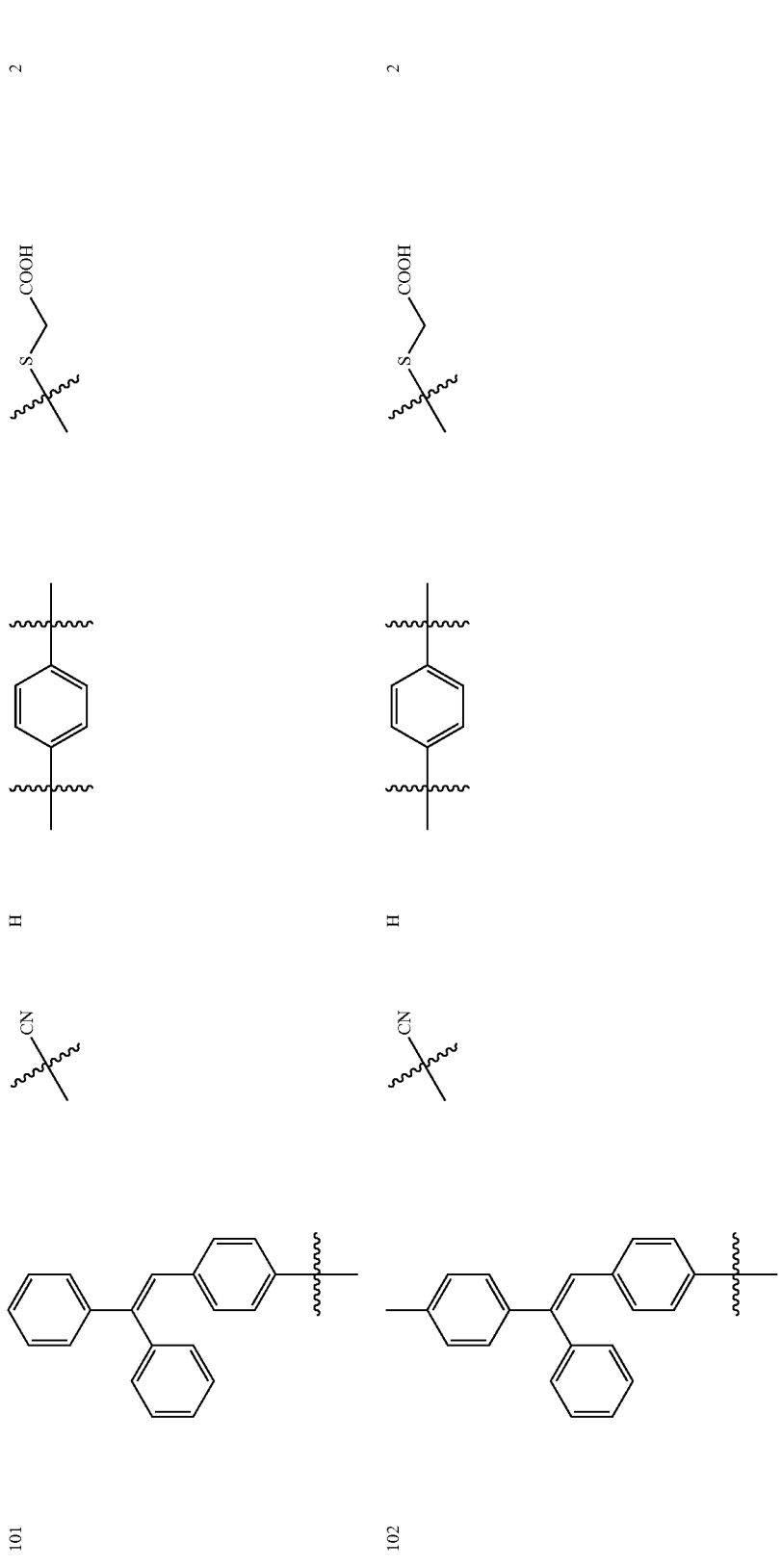

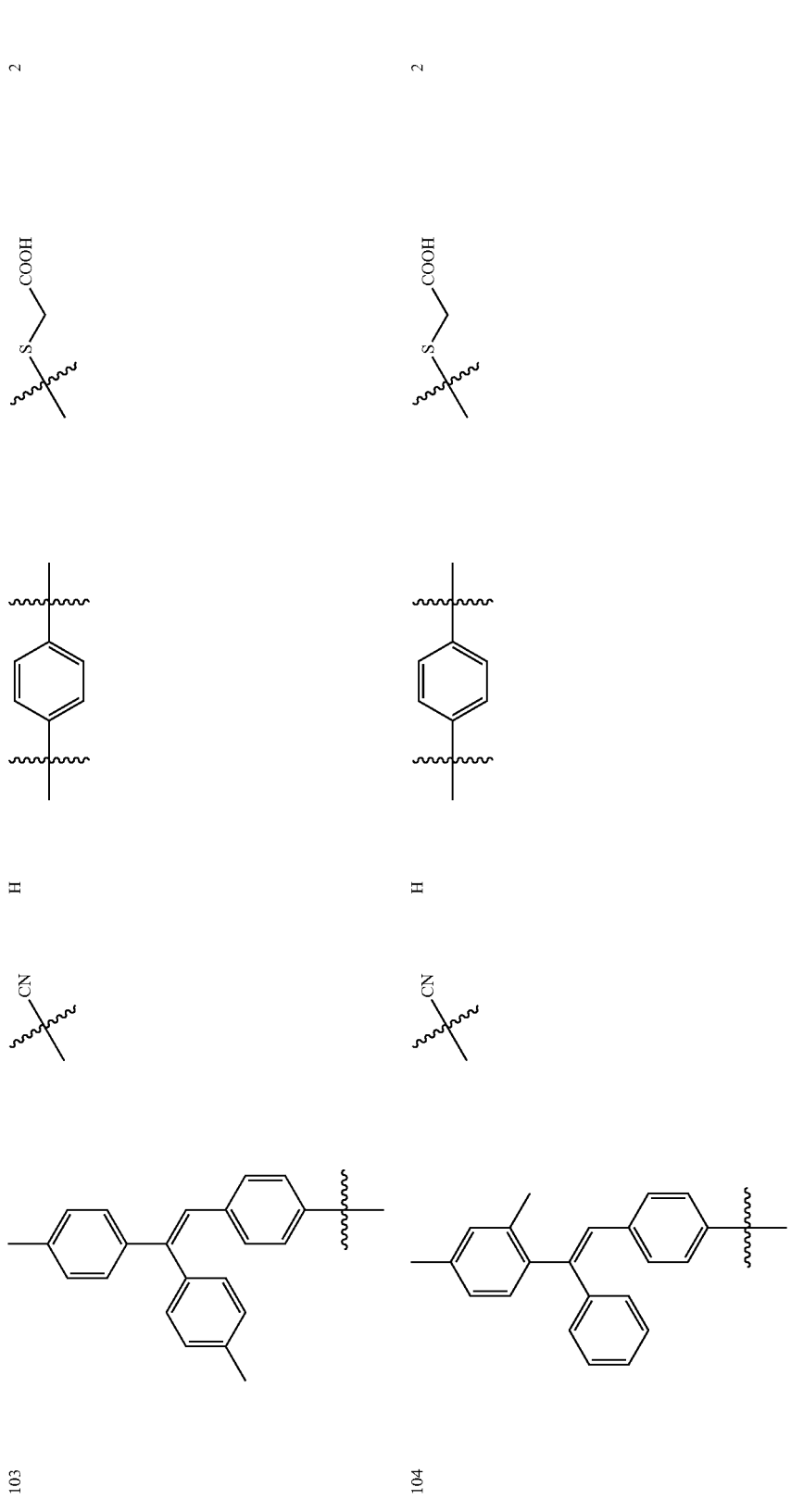

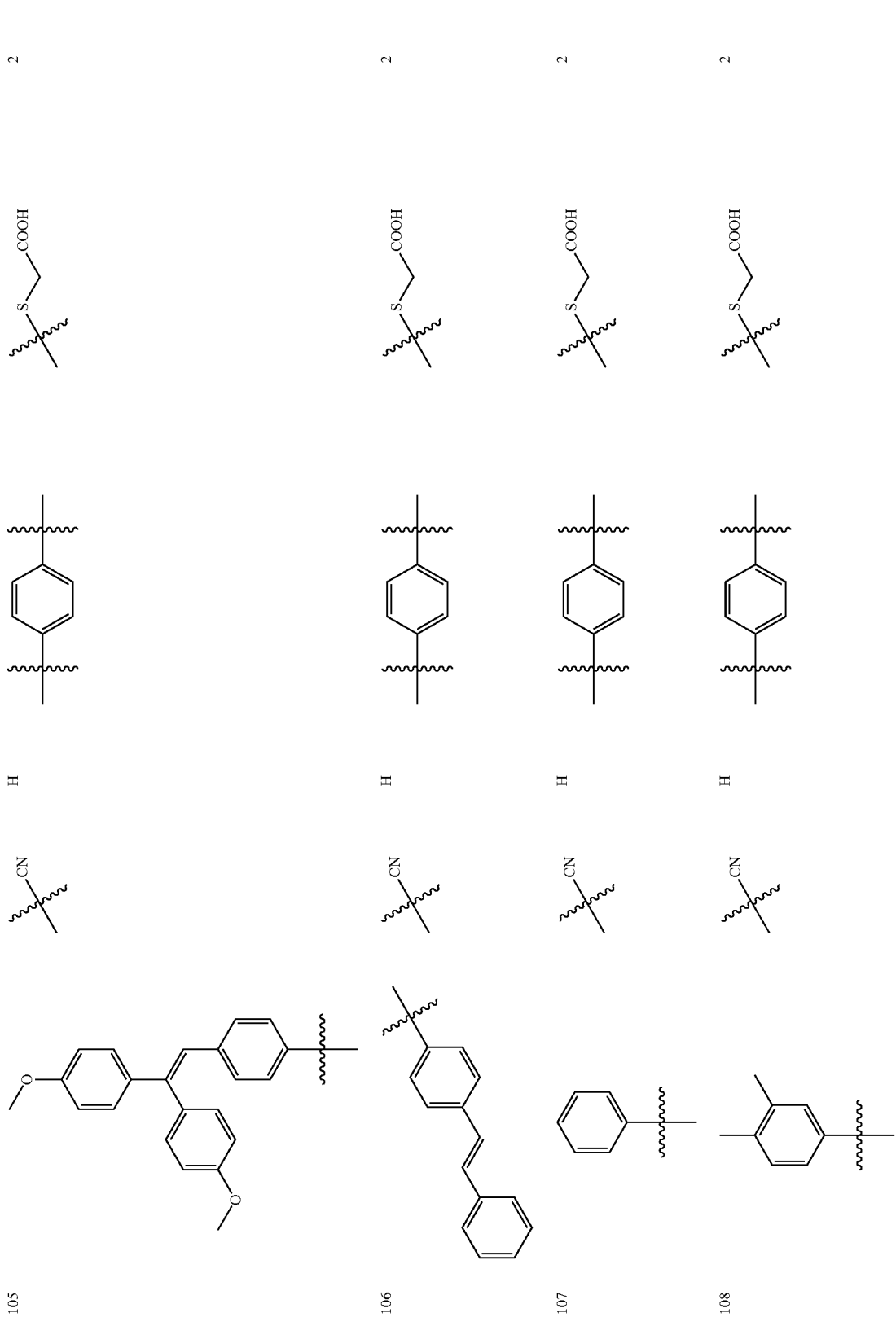

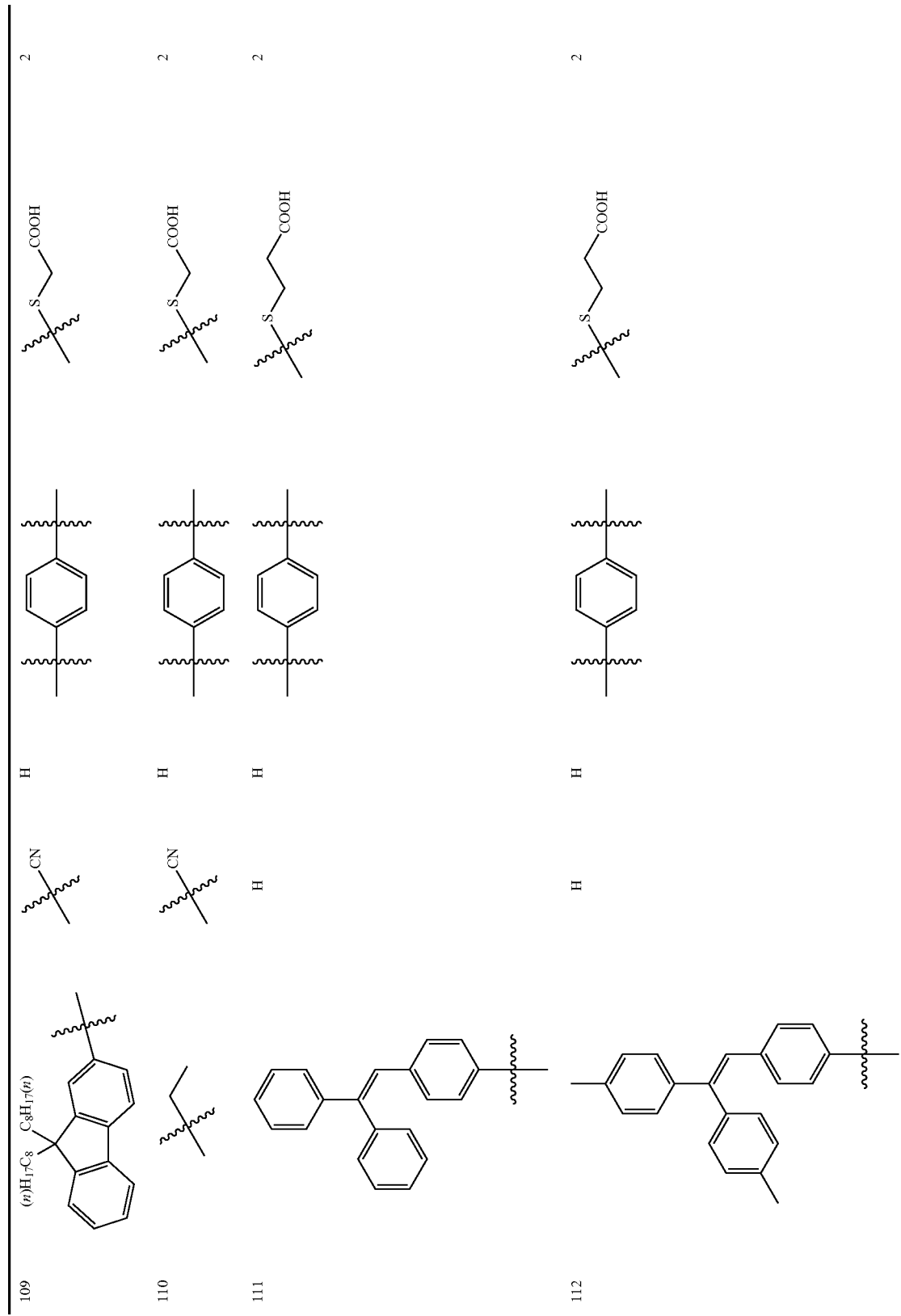

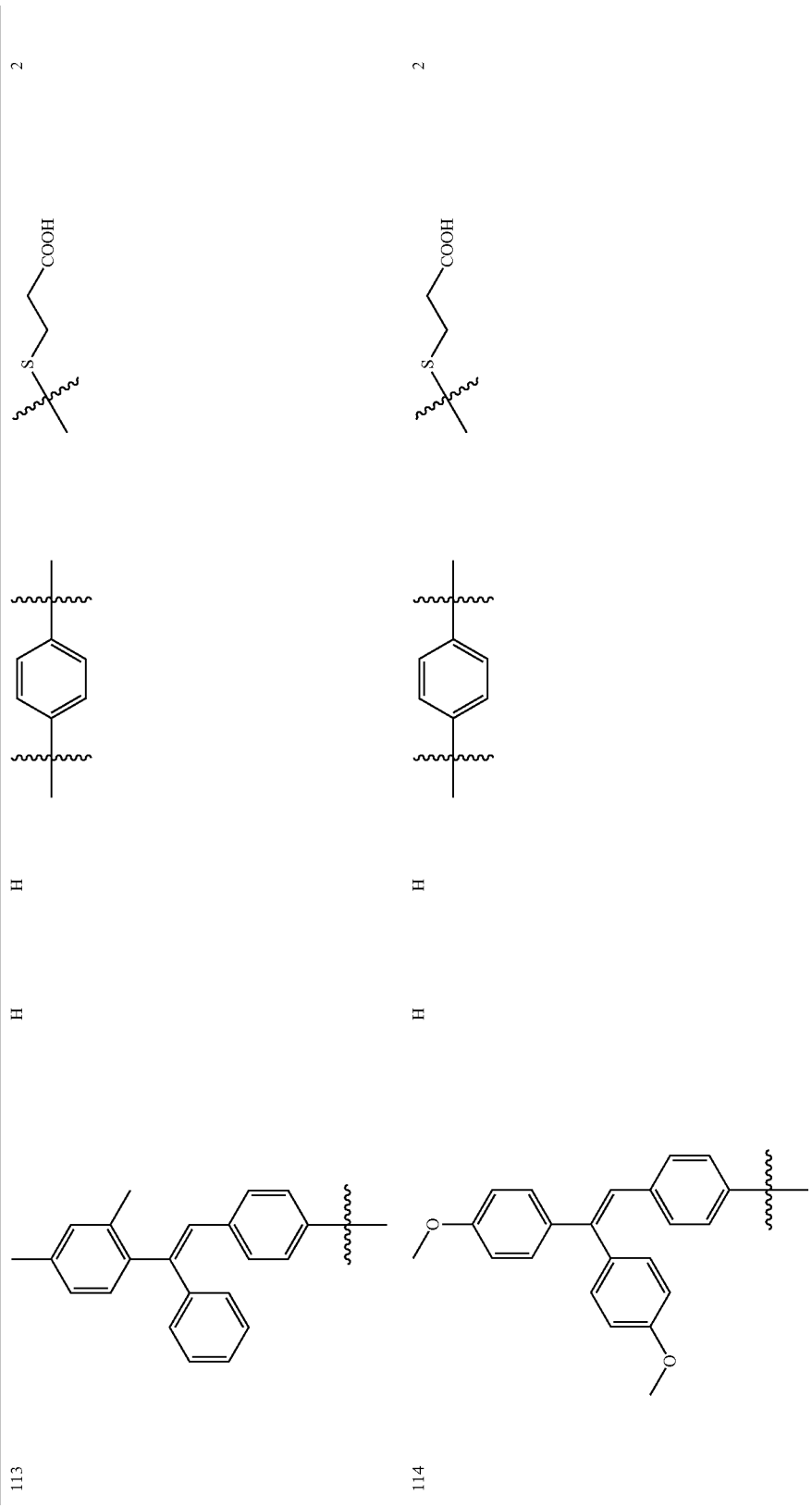

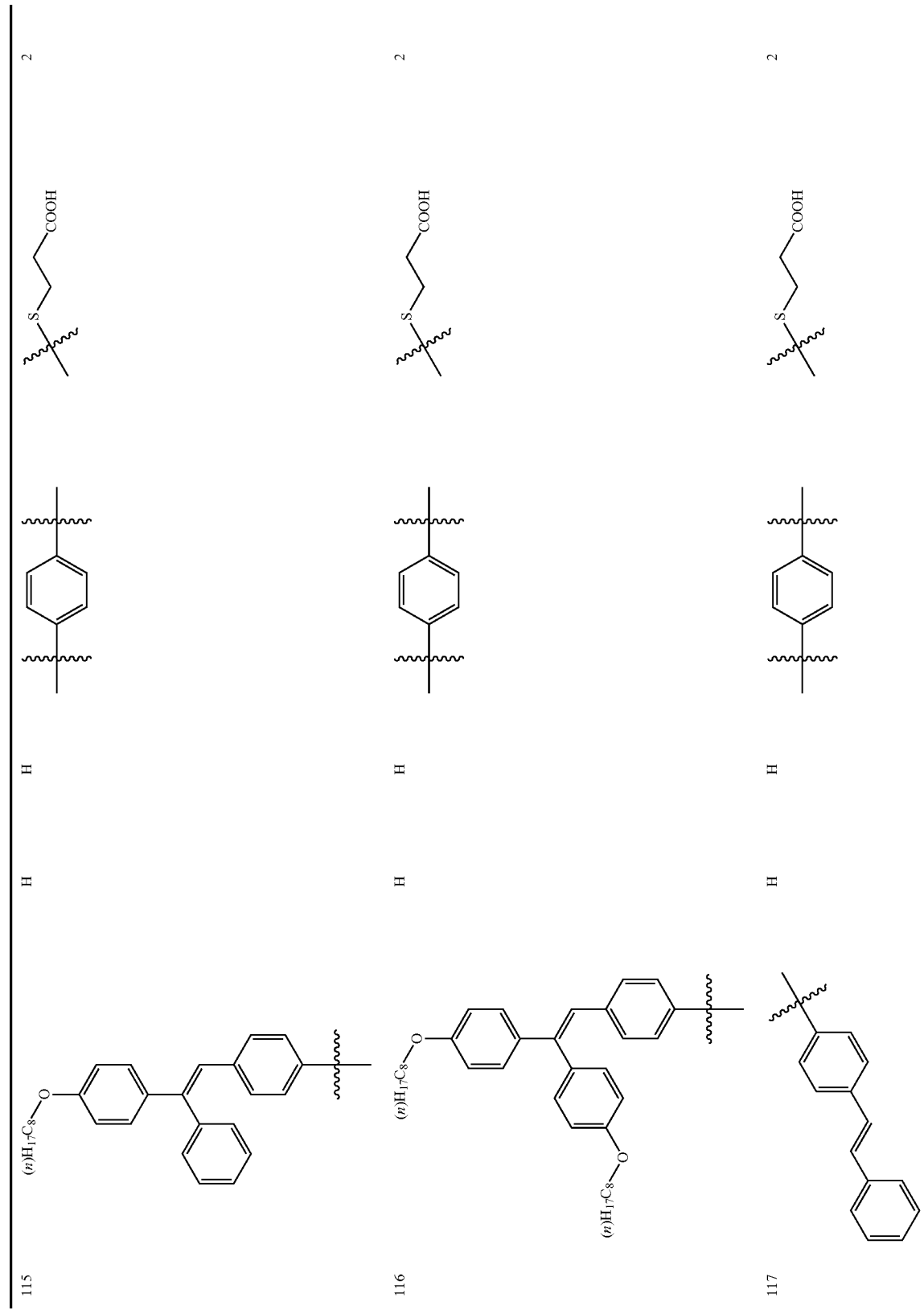

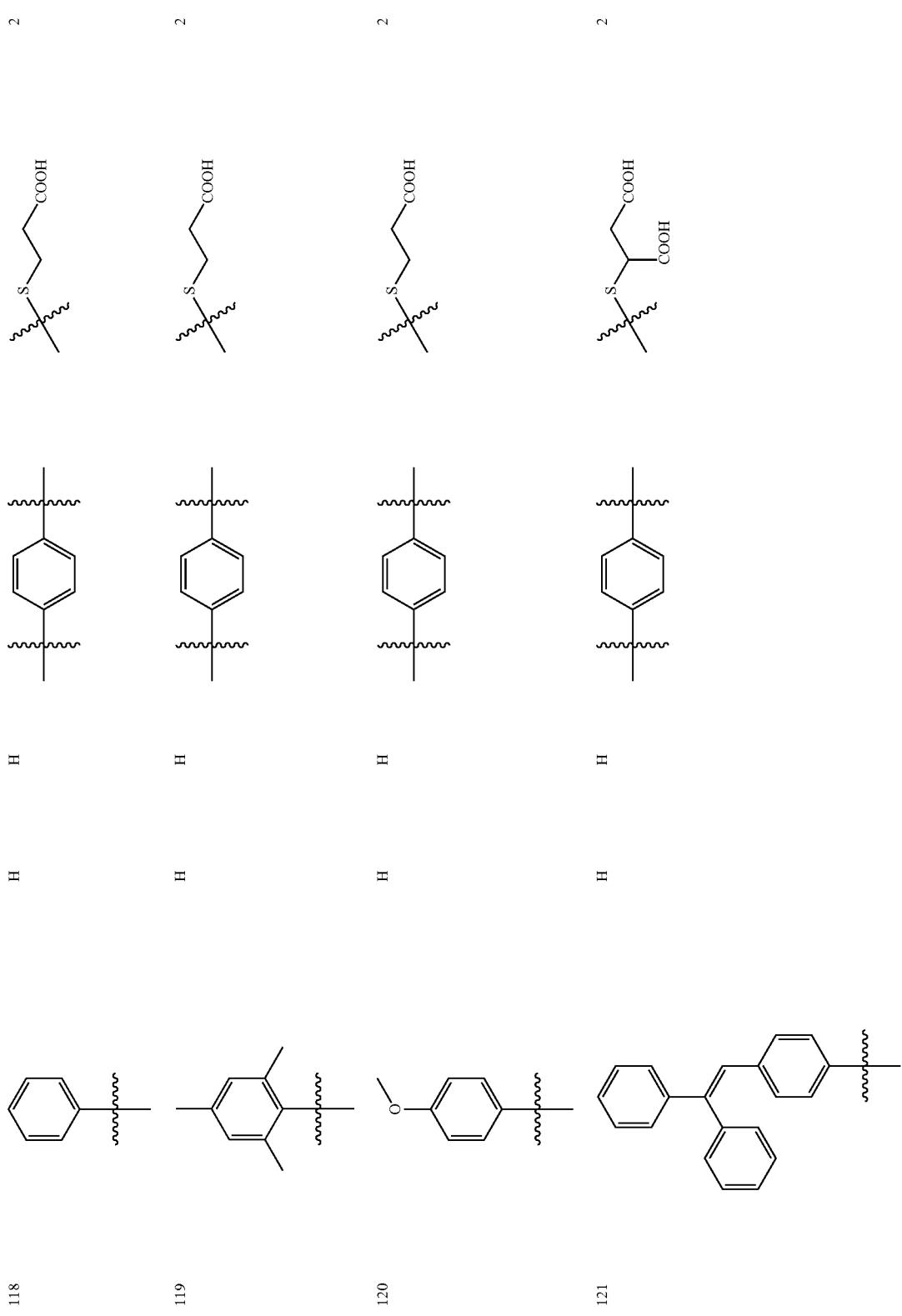

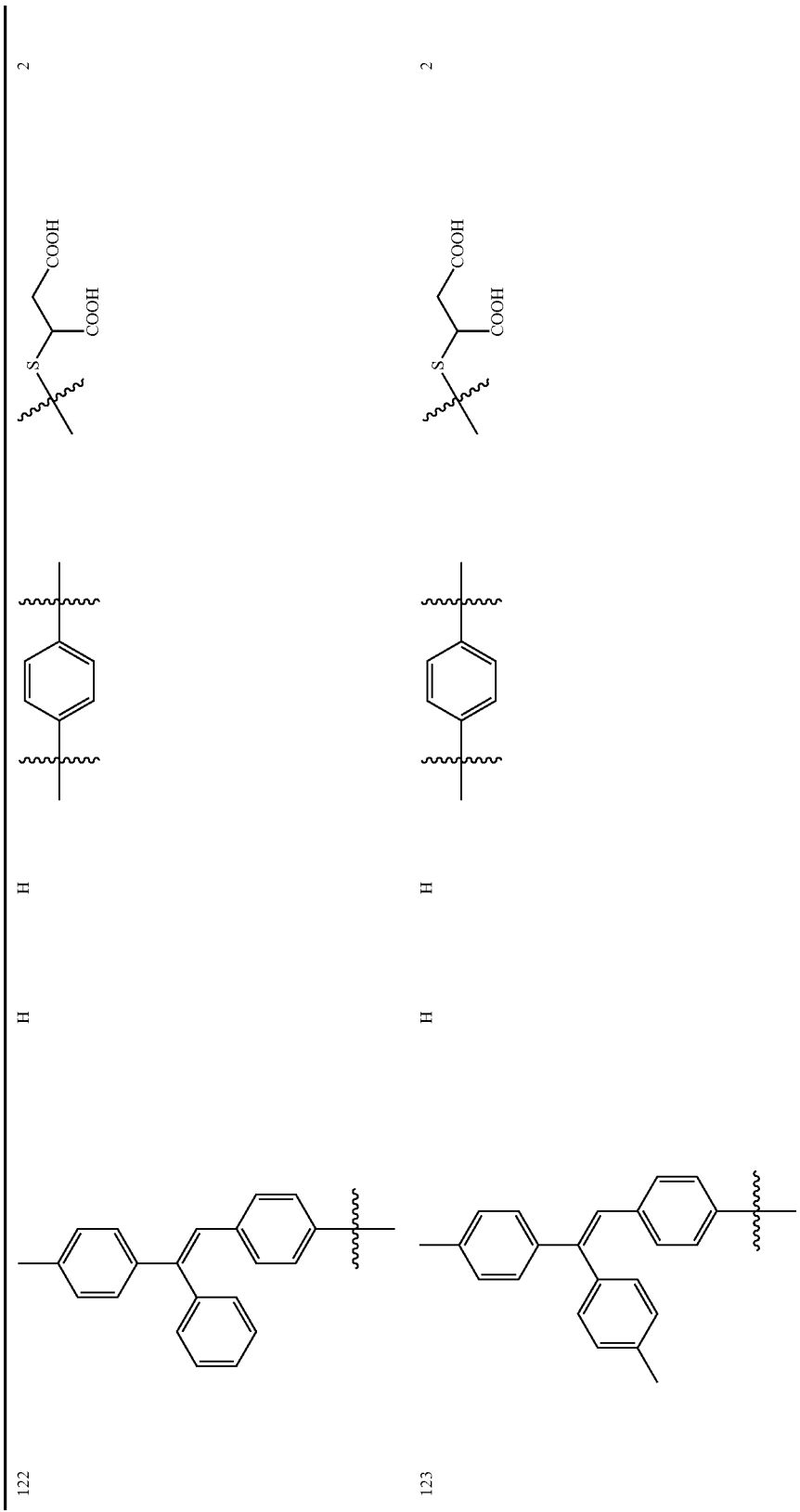

| | | | | |
|---|---|---|---|---|
| 124 | 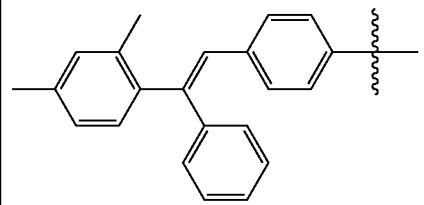 | H H | 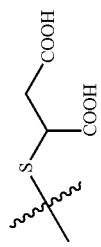 | 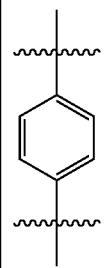 2 |
| 125 | 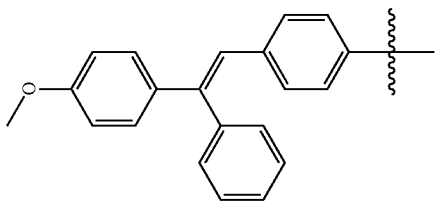 | H H | 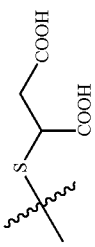 | 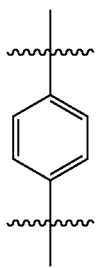 2 |

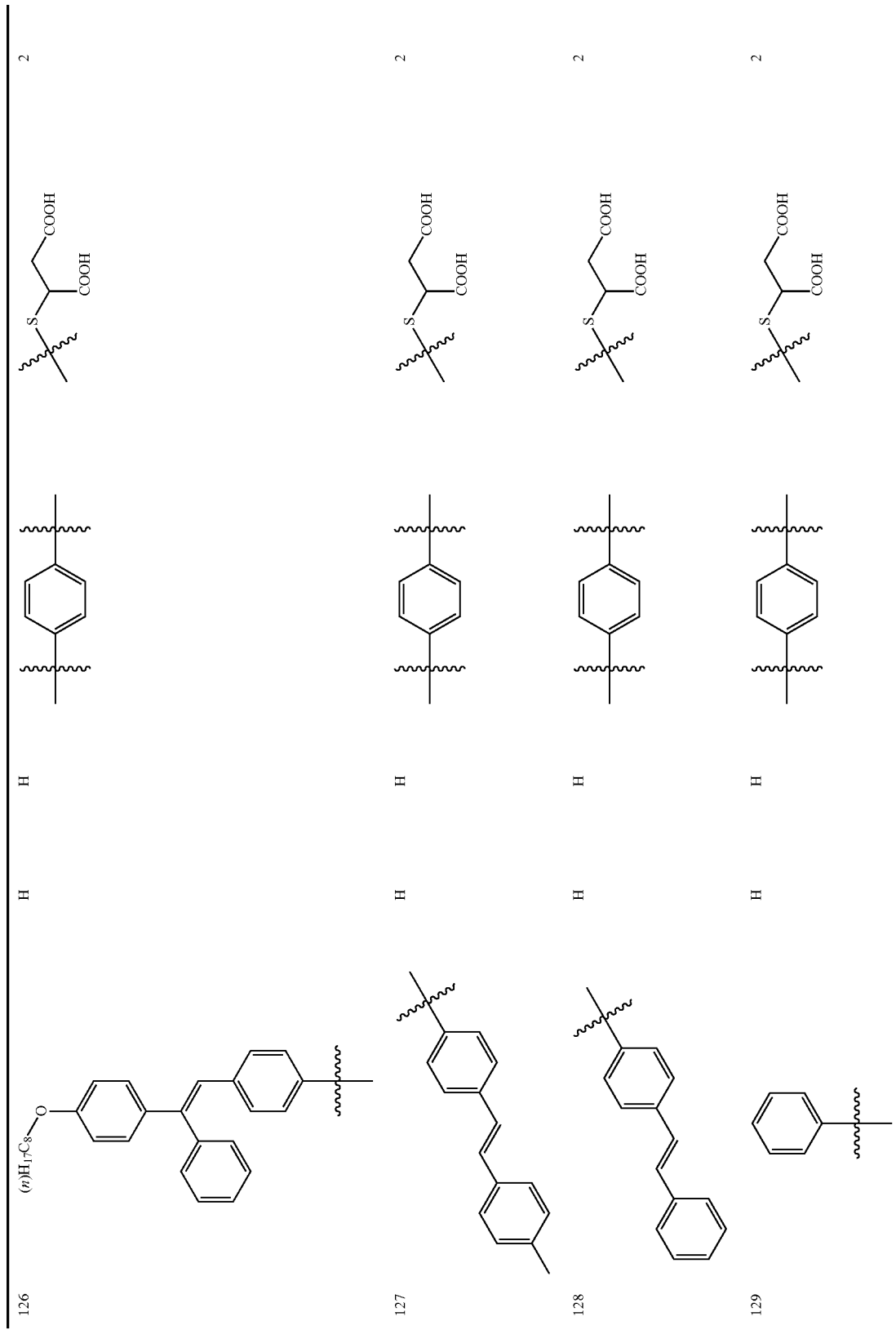

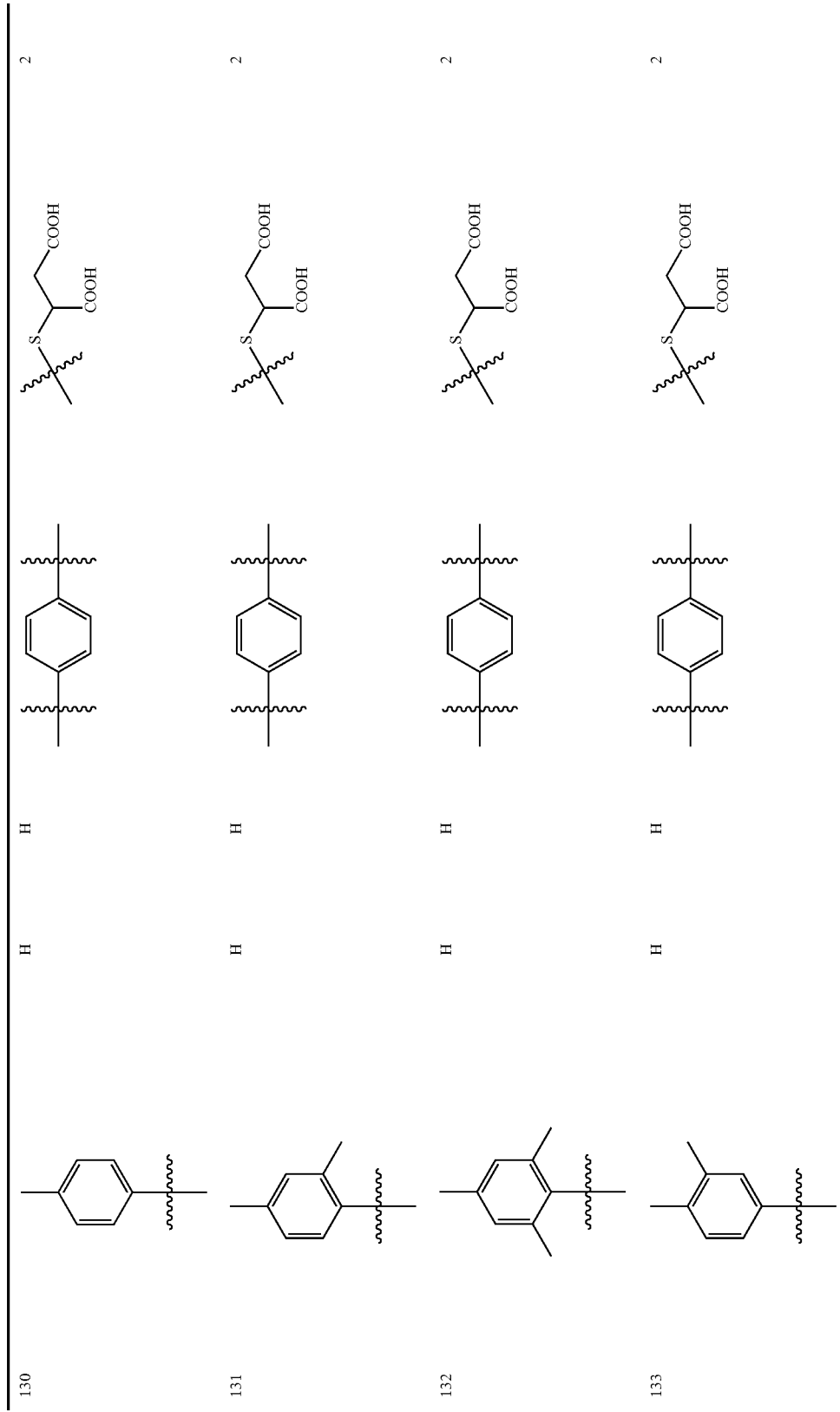

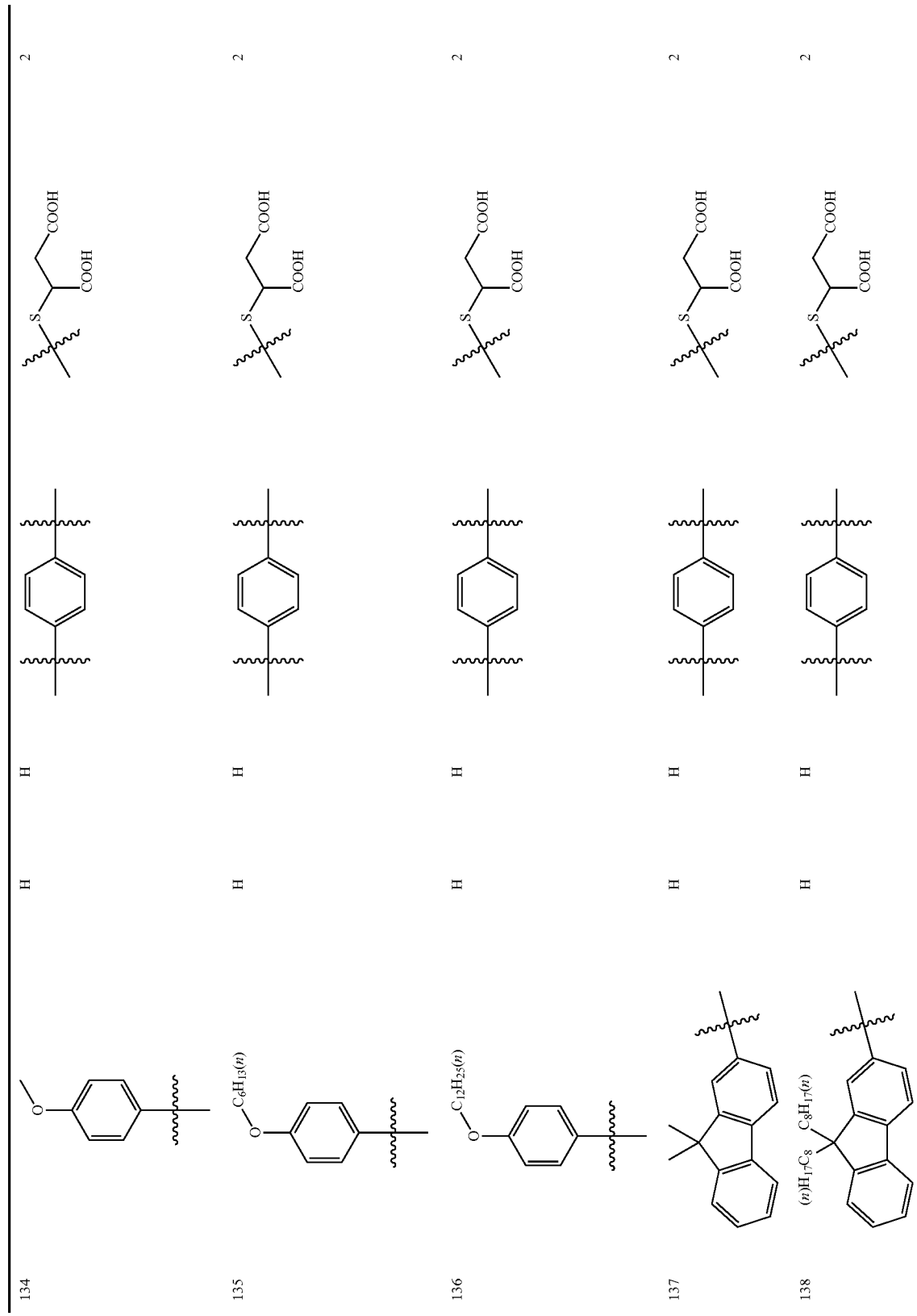

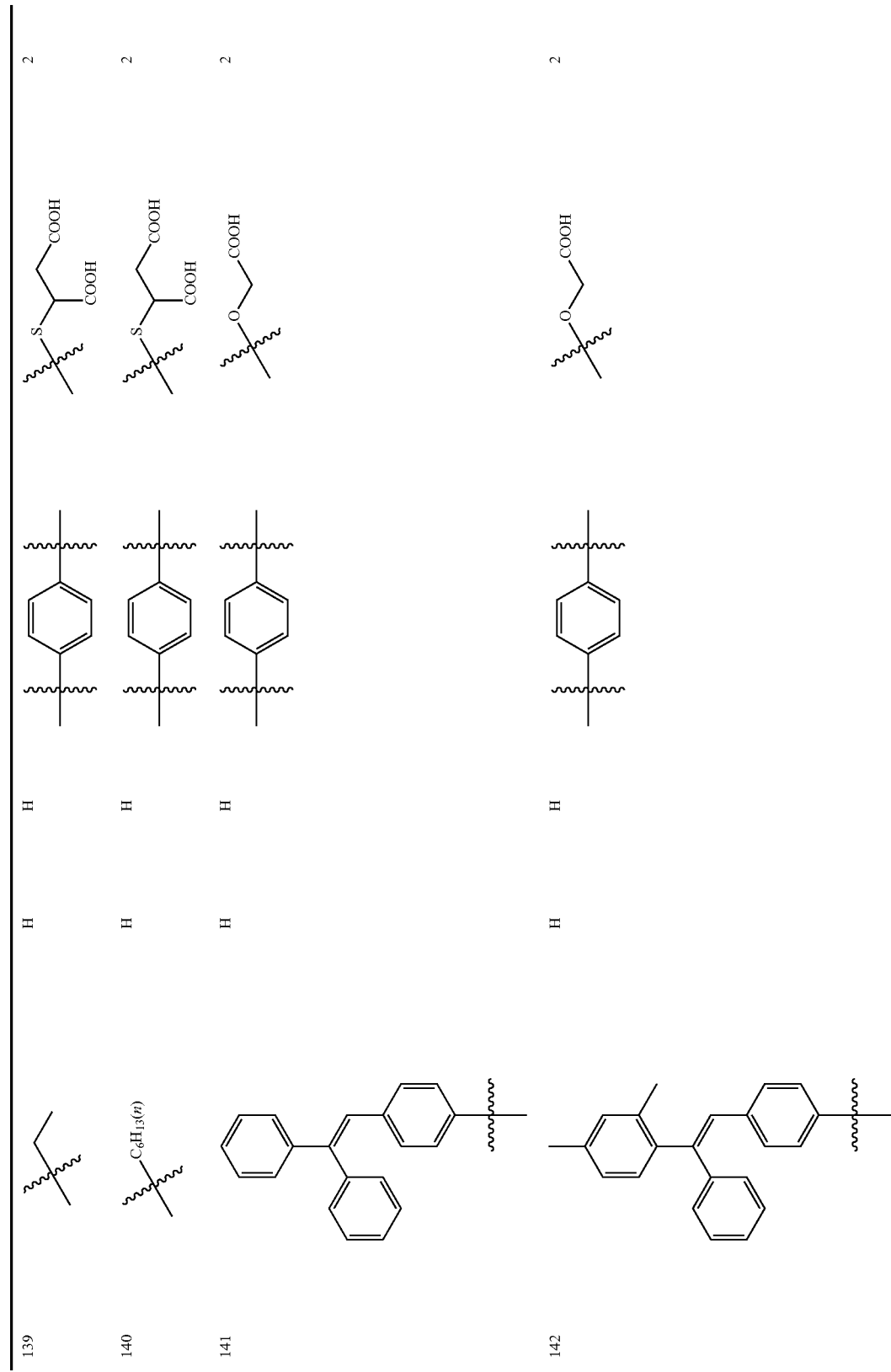

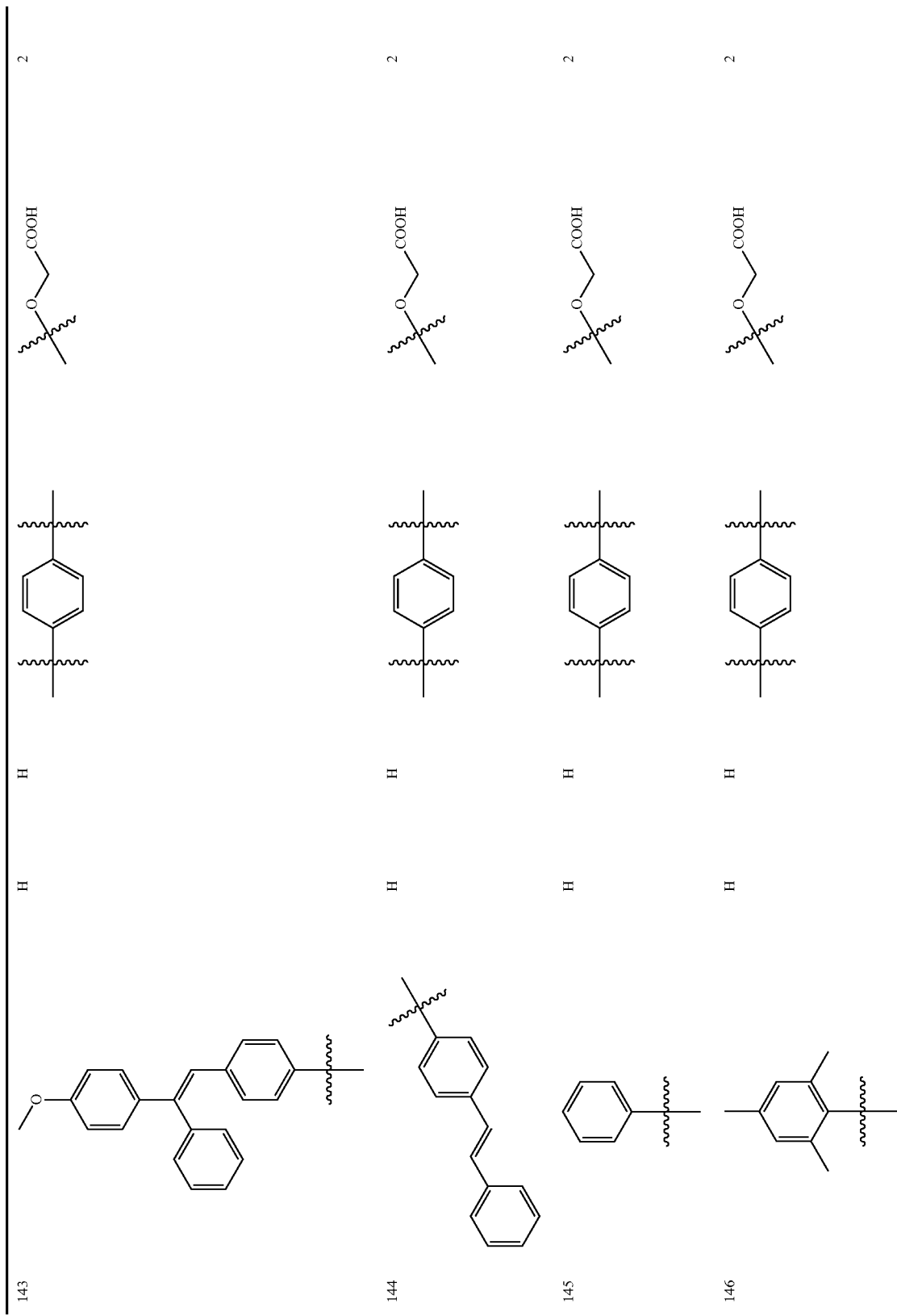

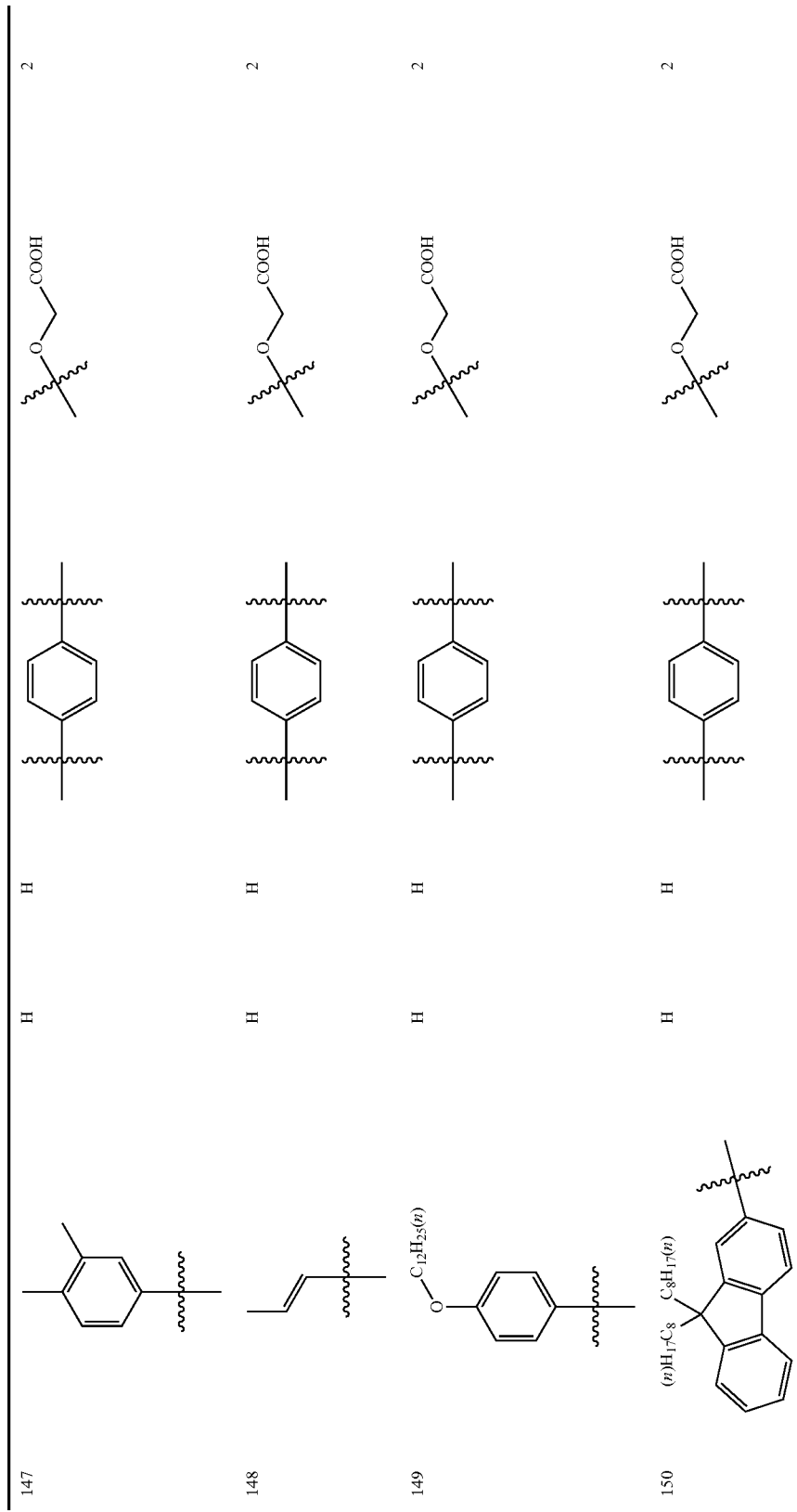

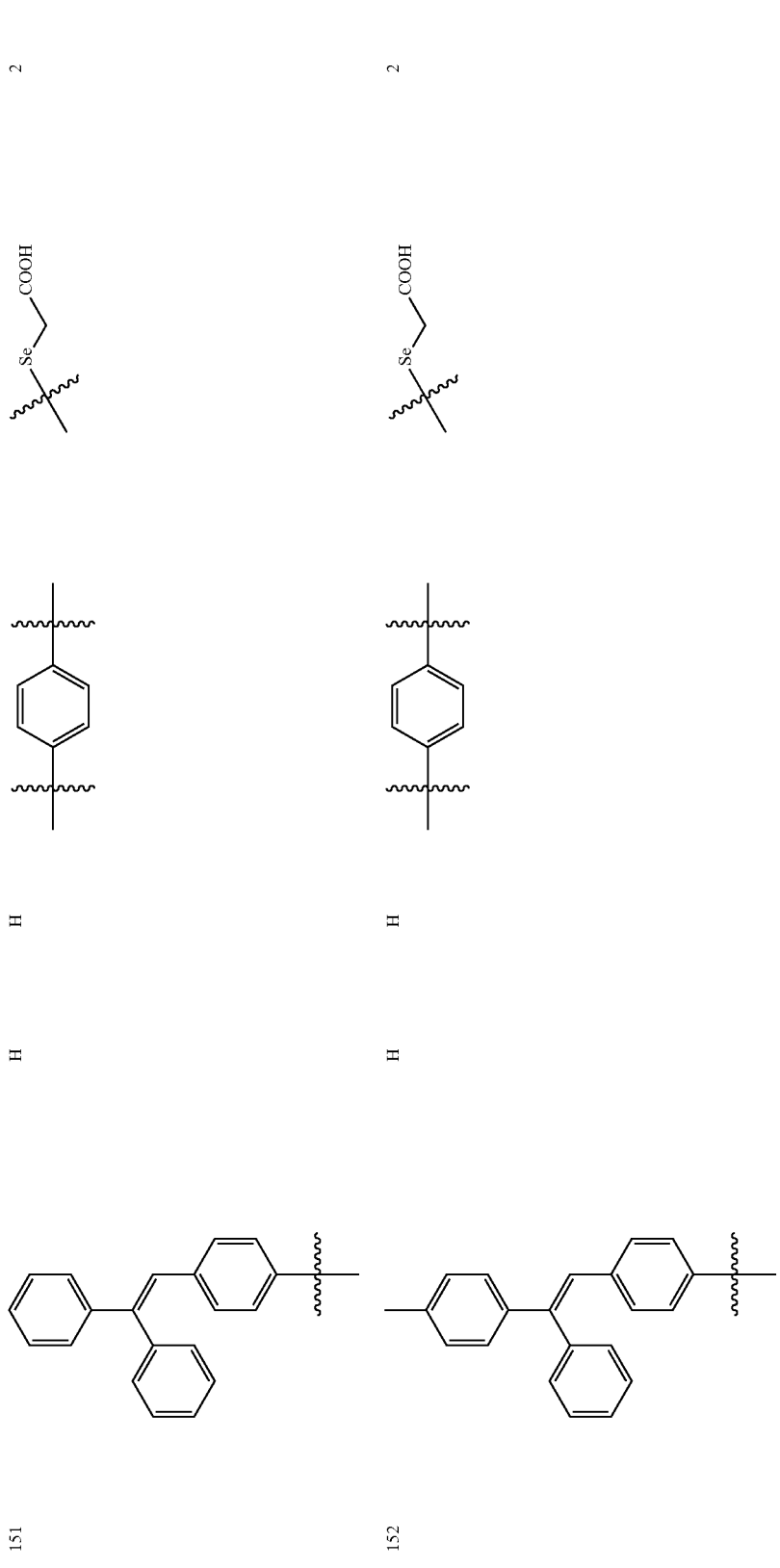

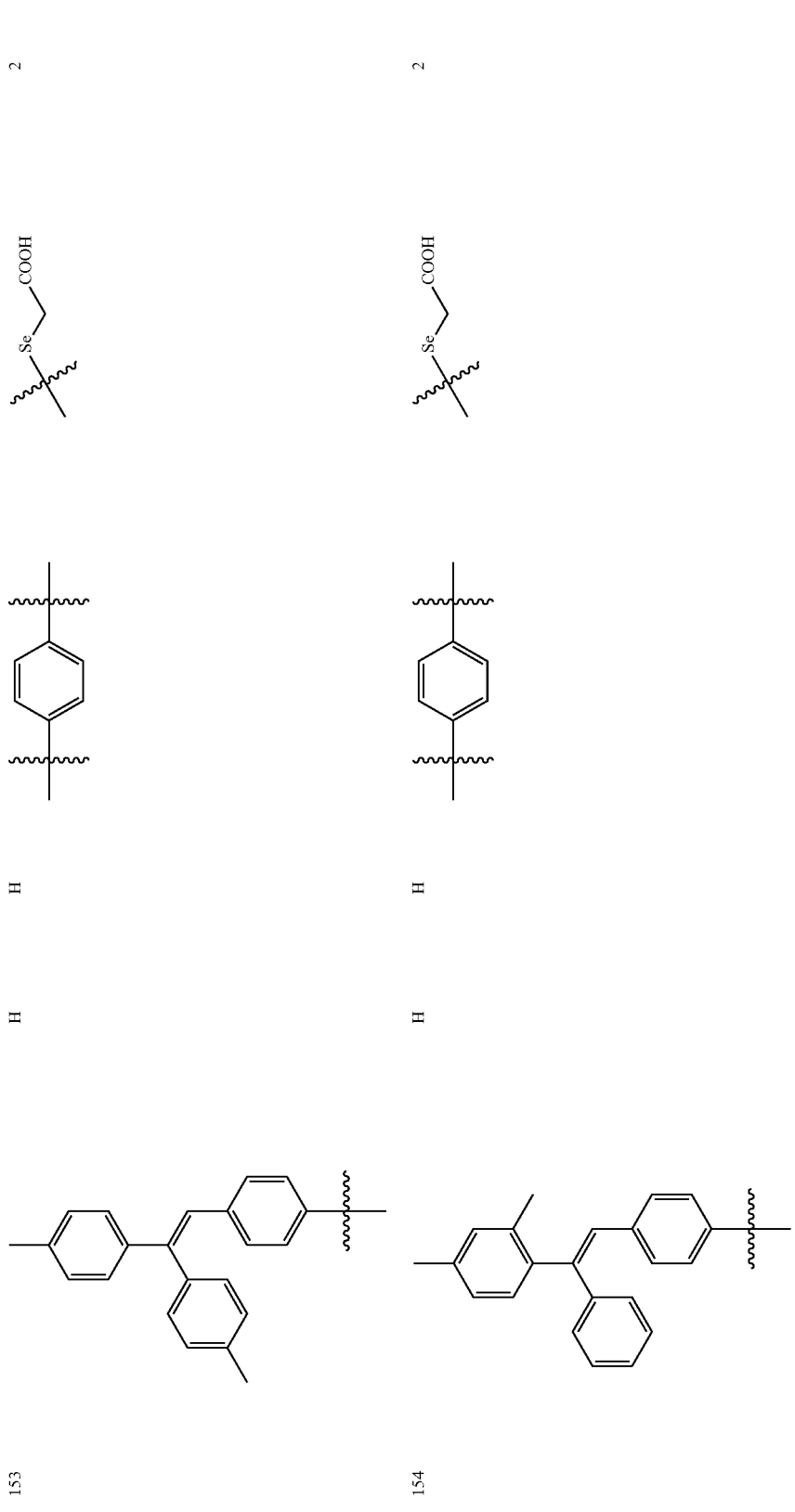

| | | | | | |
|---|---|---|---|---|---|
| 155 | 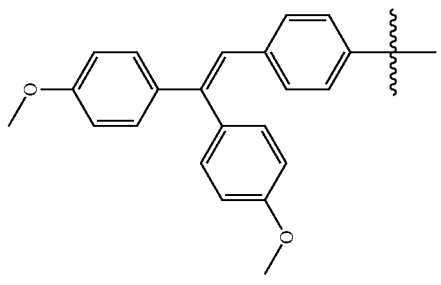 | H | H | 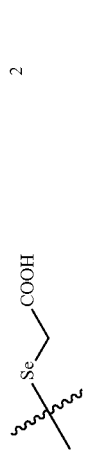 | 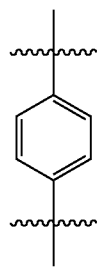 2 |
| 156 | 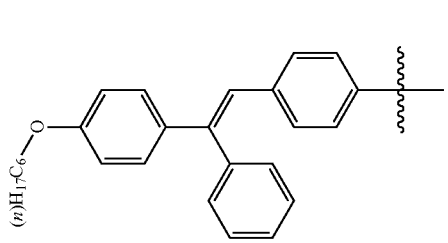 | H | H |  | 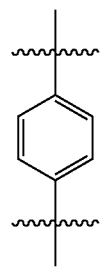 2 |
| 157 | 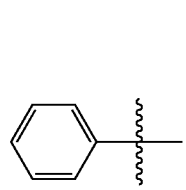 | H | H |  | 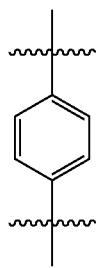 2 |

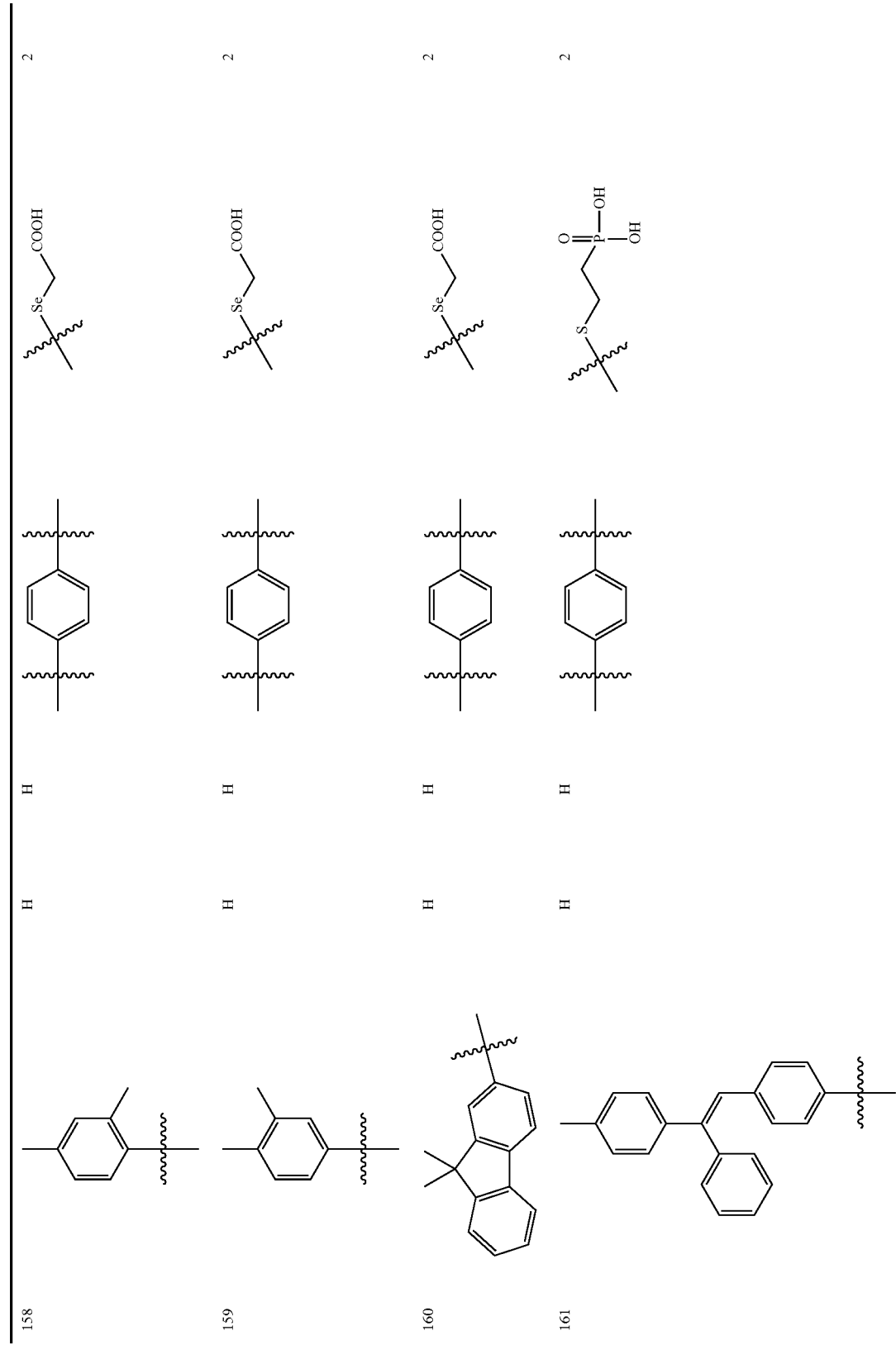

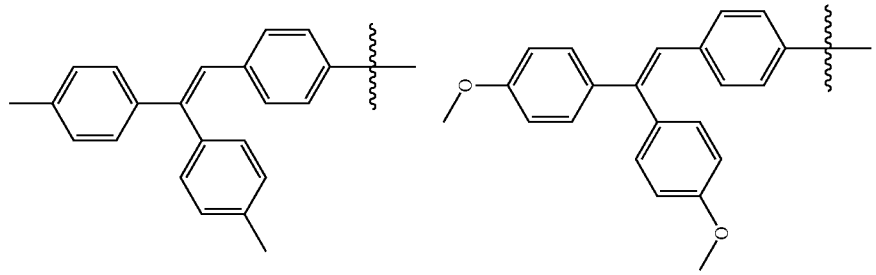

| | | | | | |
|---|---|---|---|---|---|
| 164 | 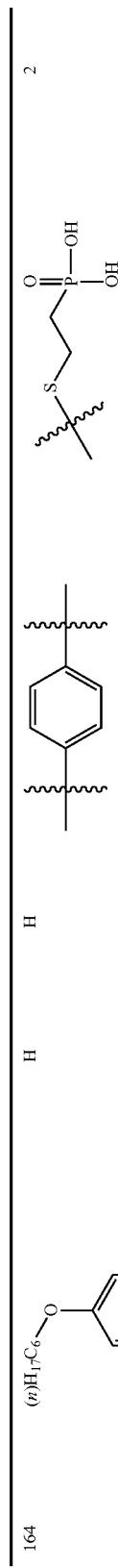 | H | H | 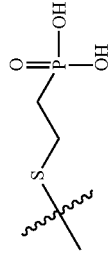 | 2 |
| 165 | 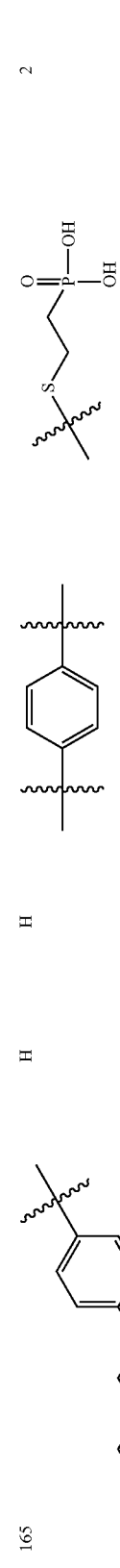 | H | H | 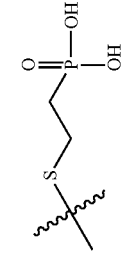 | 2 |
| 166 | 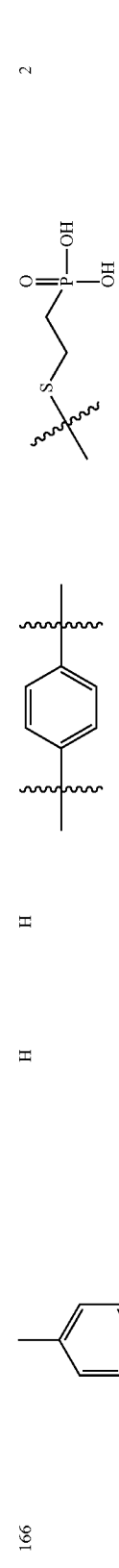 | H | H | 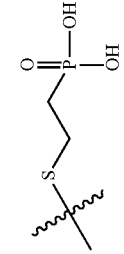 | 2 |

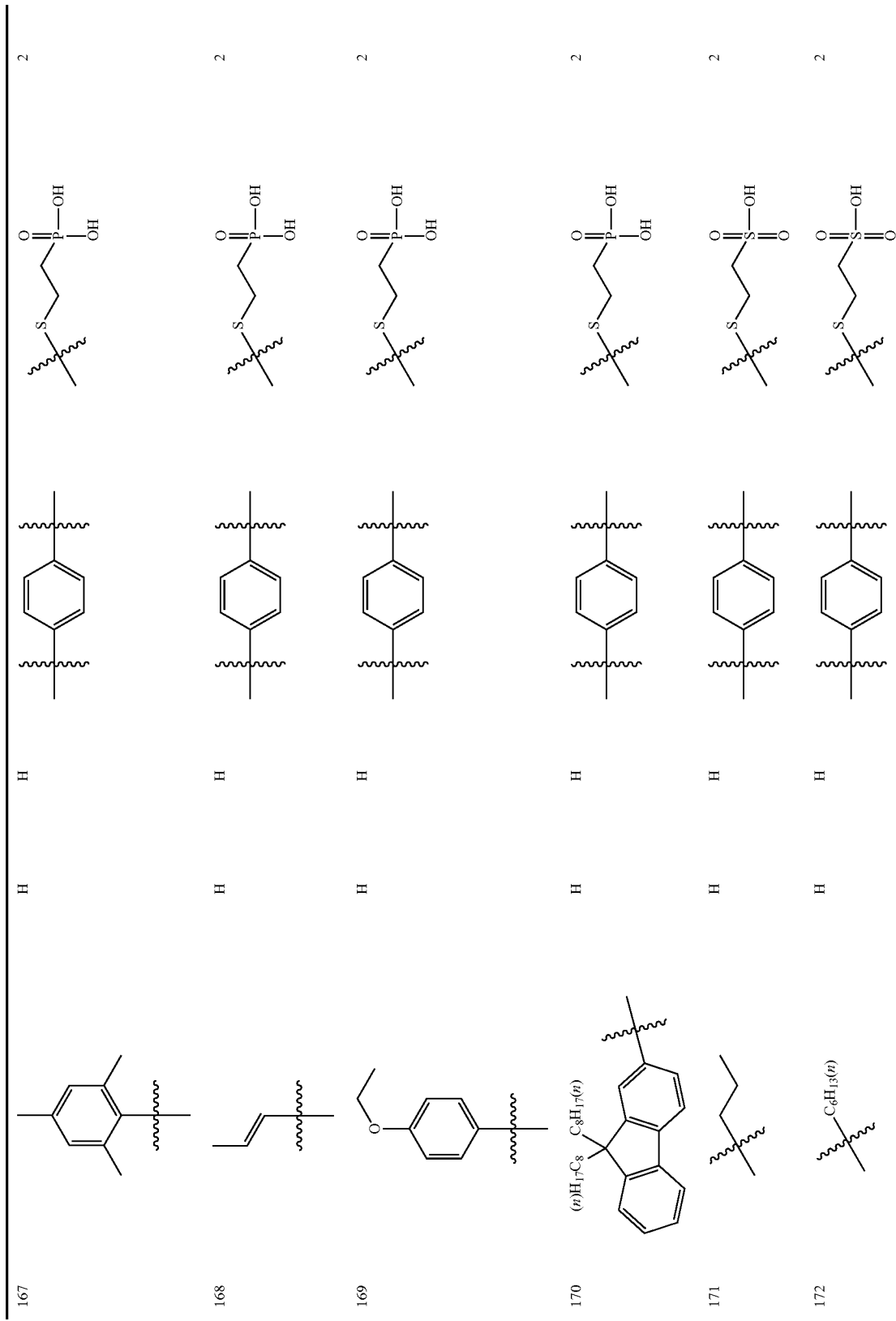

| | | | | | |
|---|---|---|---|---|---|
| 173 | 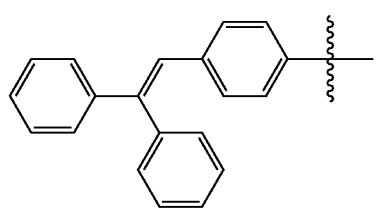 | H | H | 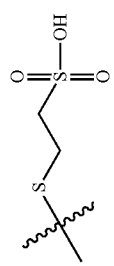 | 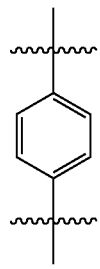 2 |
| 174 | 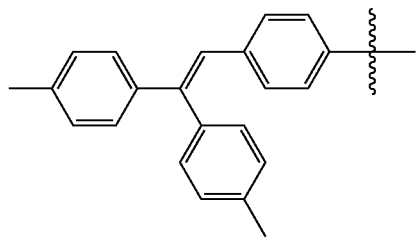 | H | H | 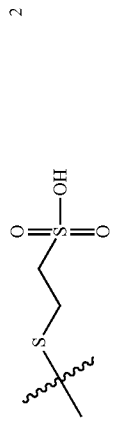 | 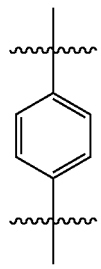 2 |

-continued
| | | | | | |
|---|---|---|---|---|---|
| 175 | 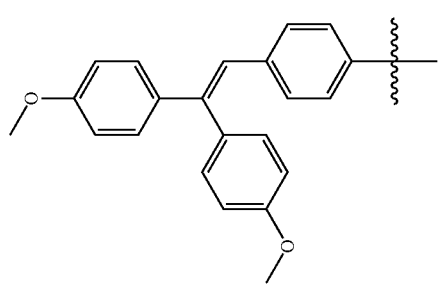 | H | H | 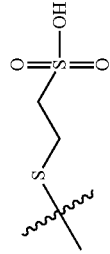 | 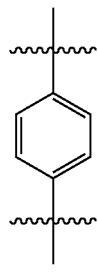 2 |
| 176 | 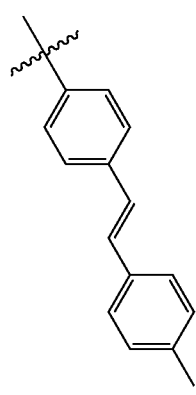 | H | H | 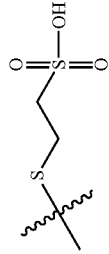 | 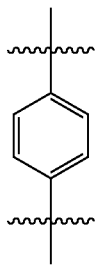 2 |
| 177 | 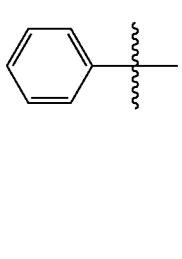 | H | H | 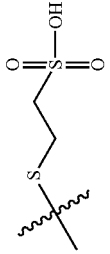 | 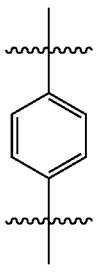 2 |
| 178 | 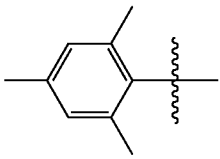 | H | H | 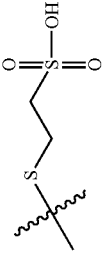 | 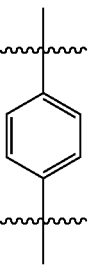 2 |

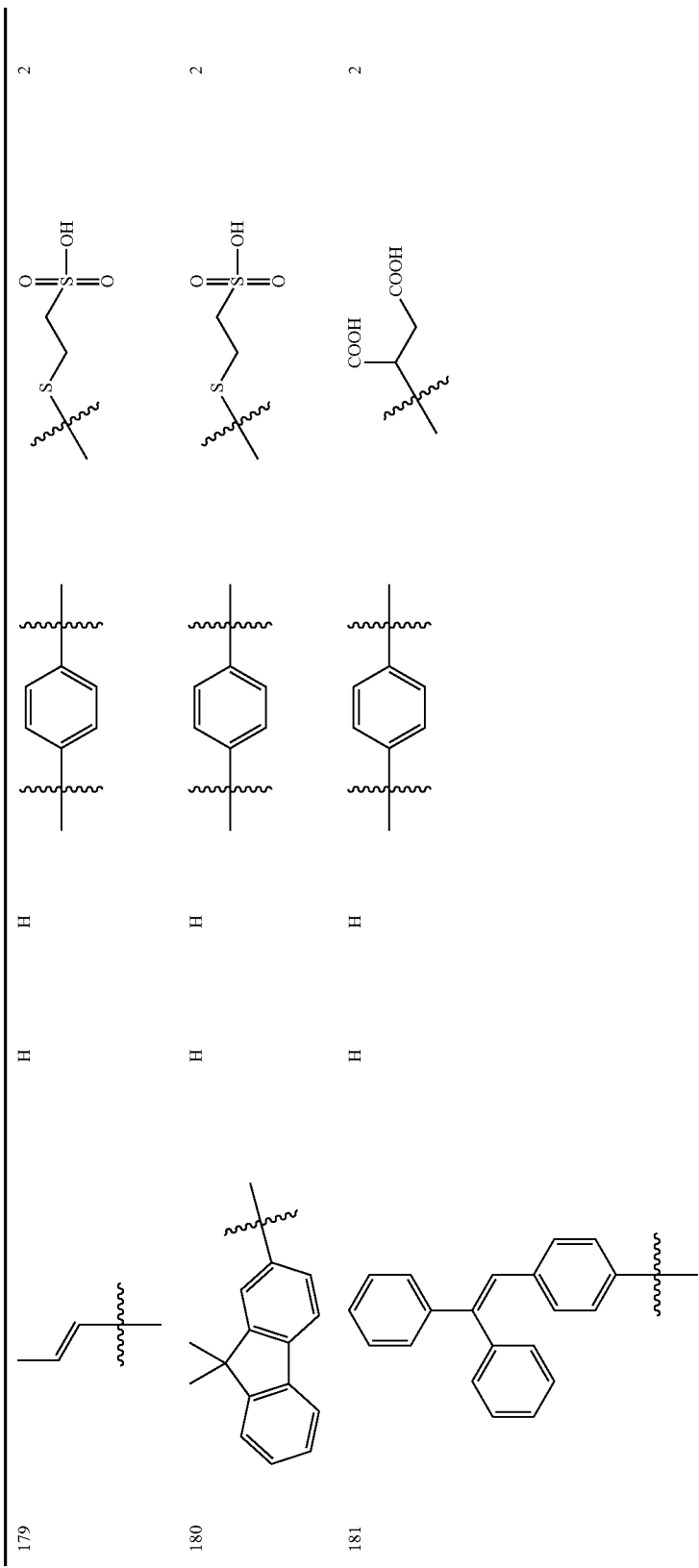

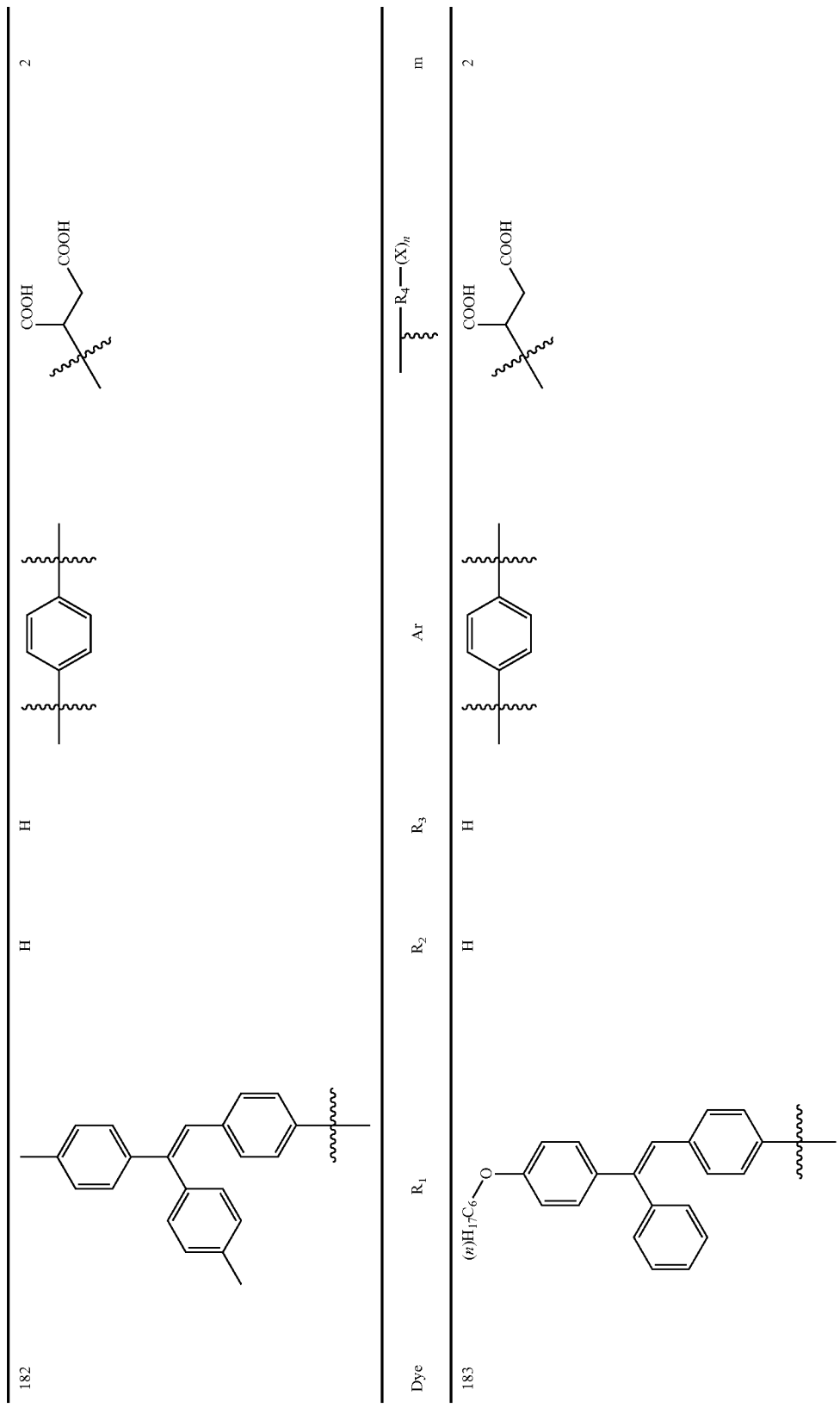

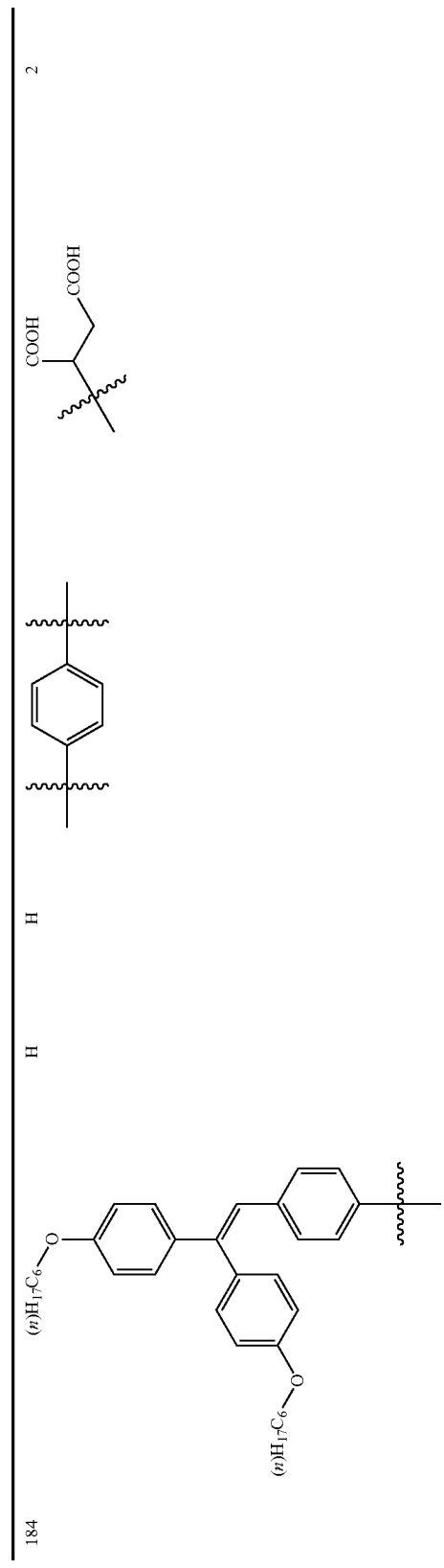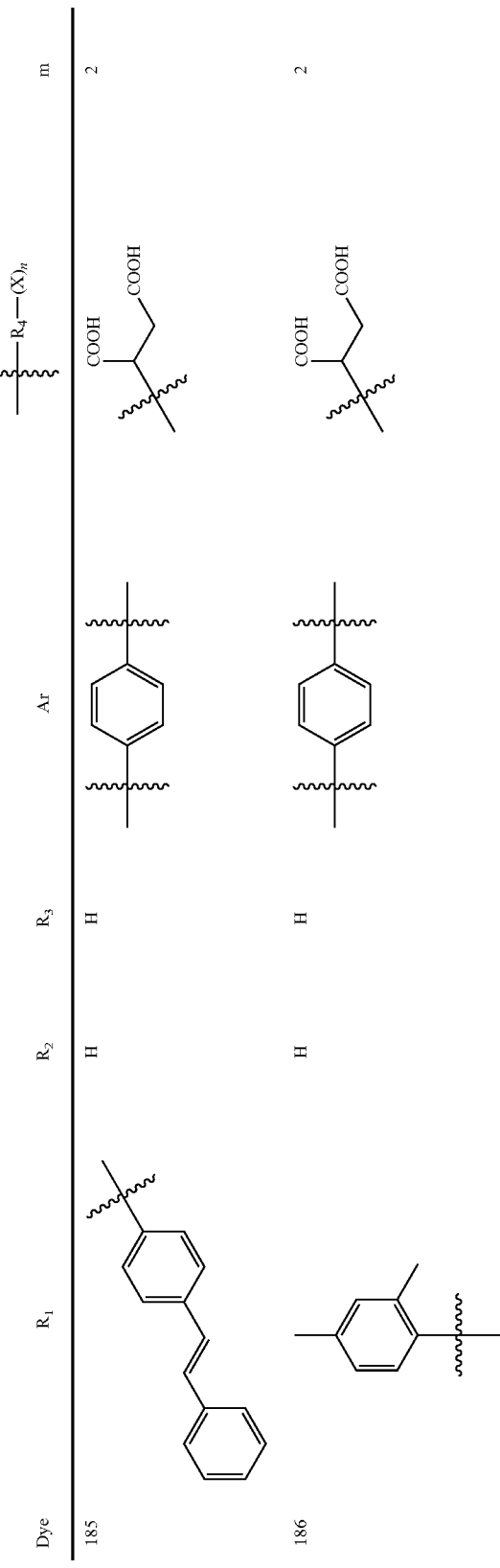

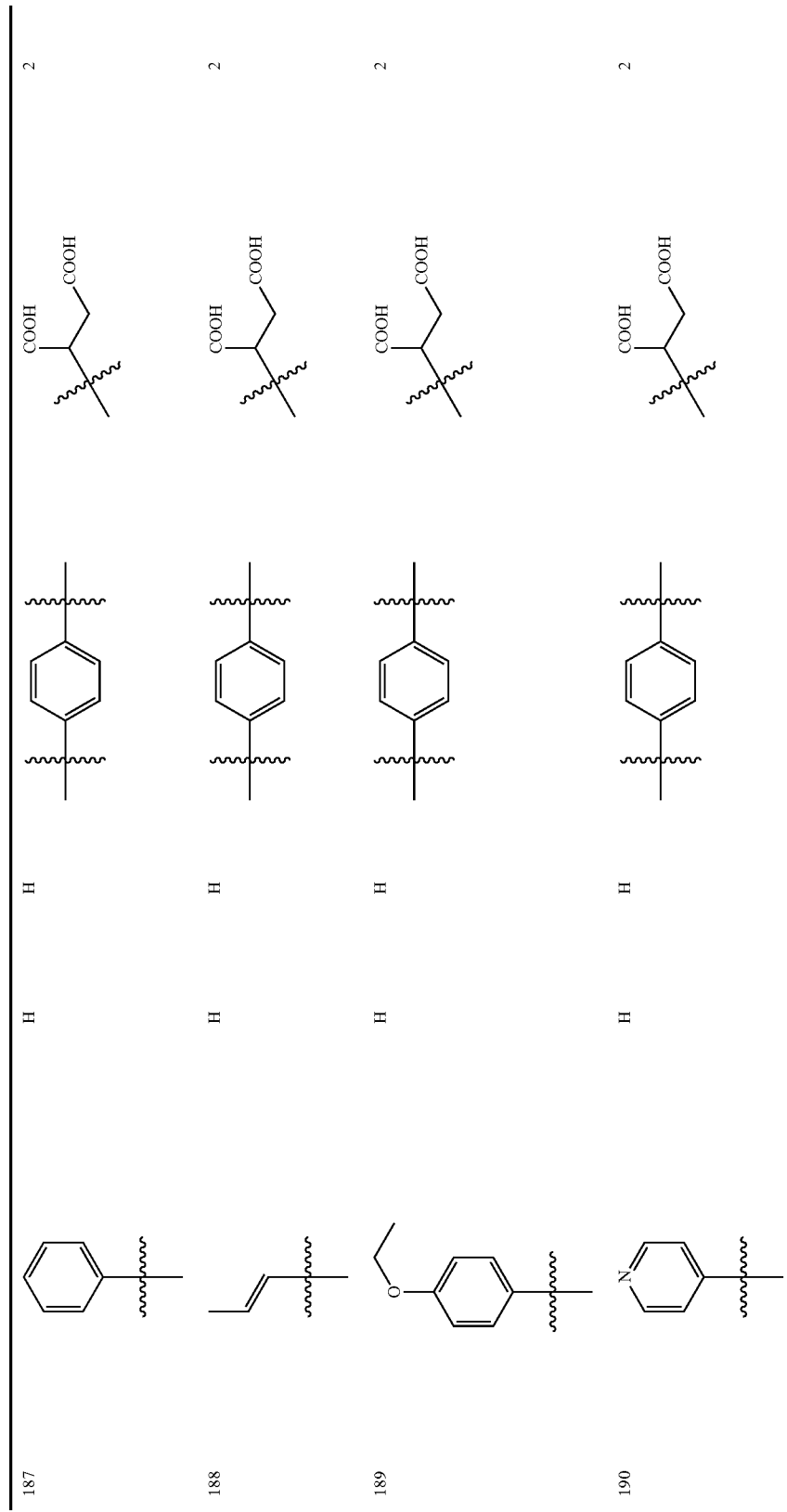

| | | | | |
|---|---|---|---|---|
| 191 | 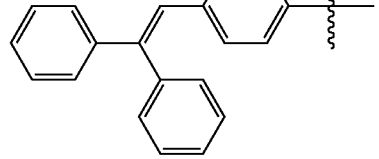 | H | 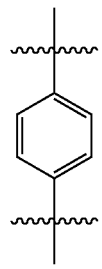 |  |
| 192 | 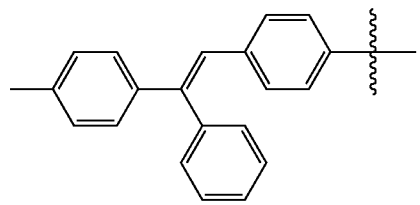 | H | 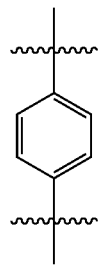 | 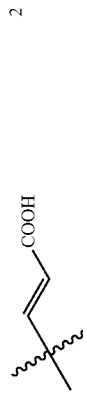 |

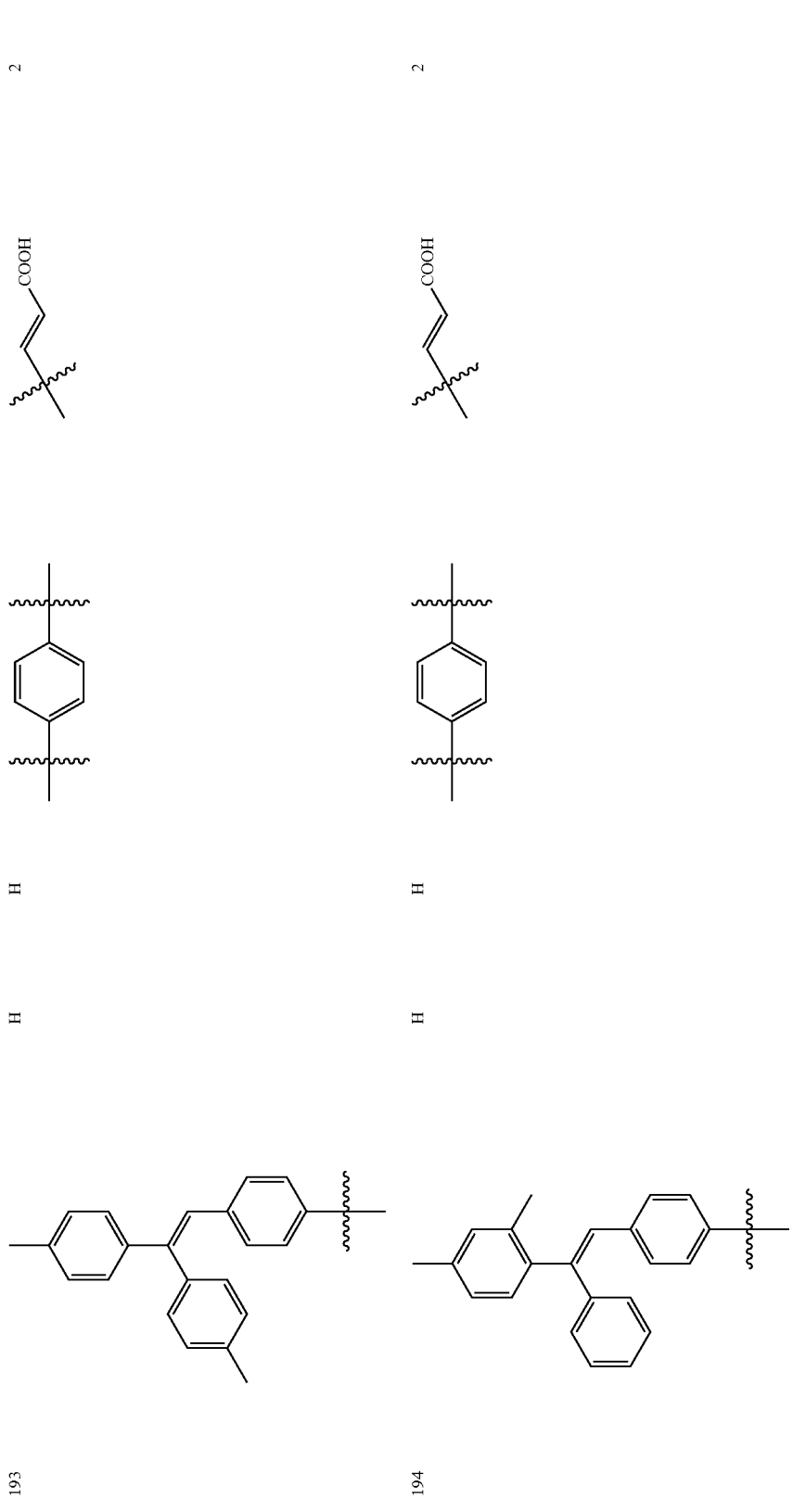

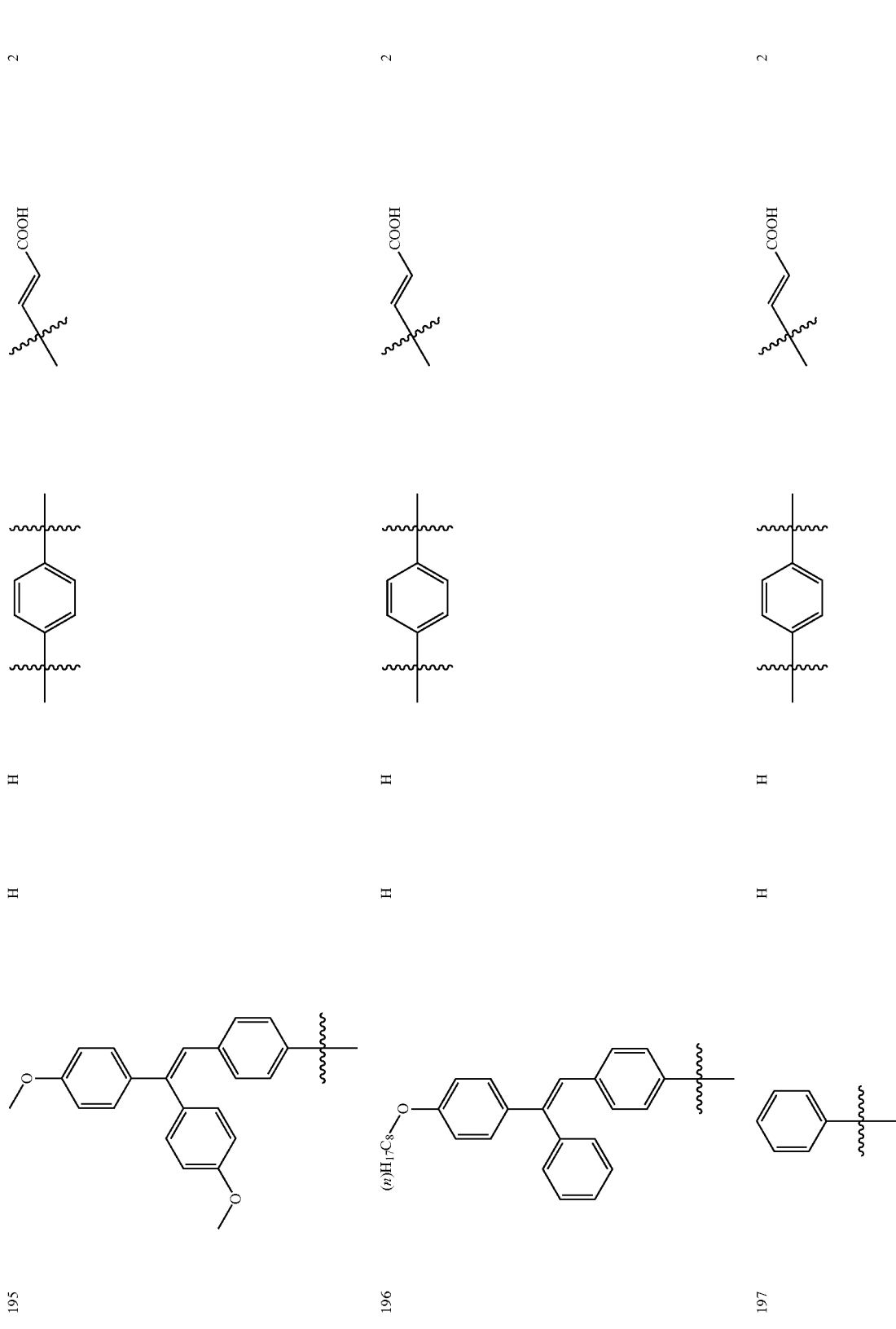

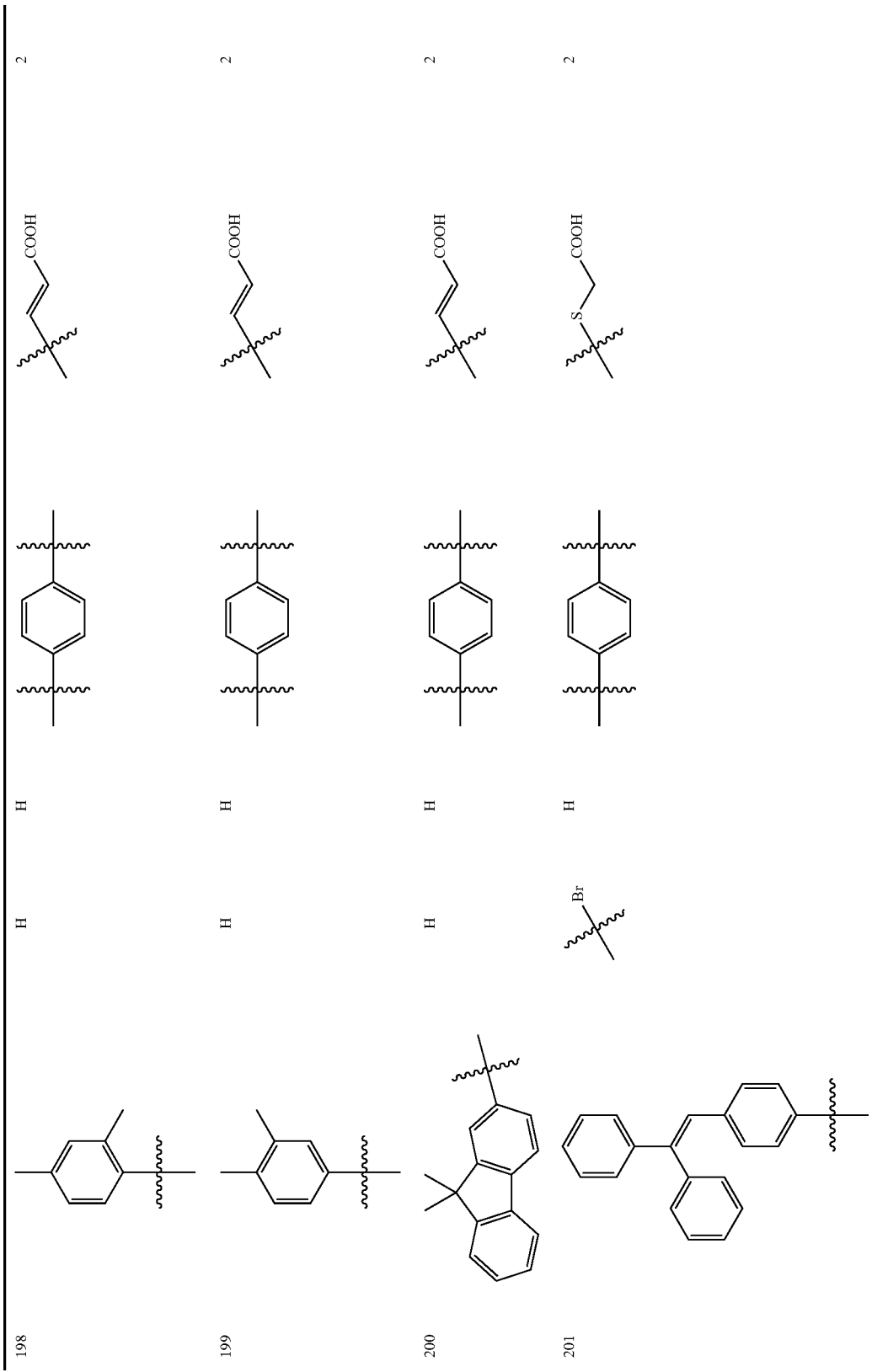

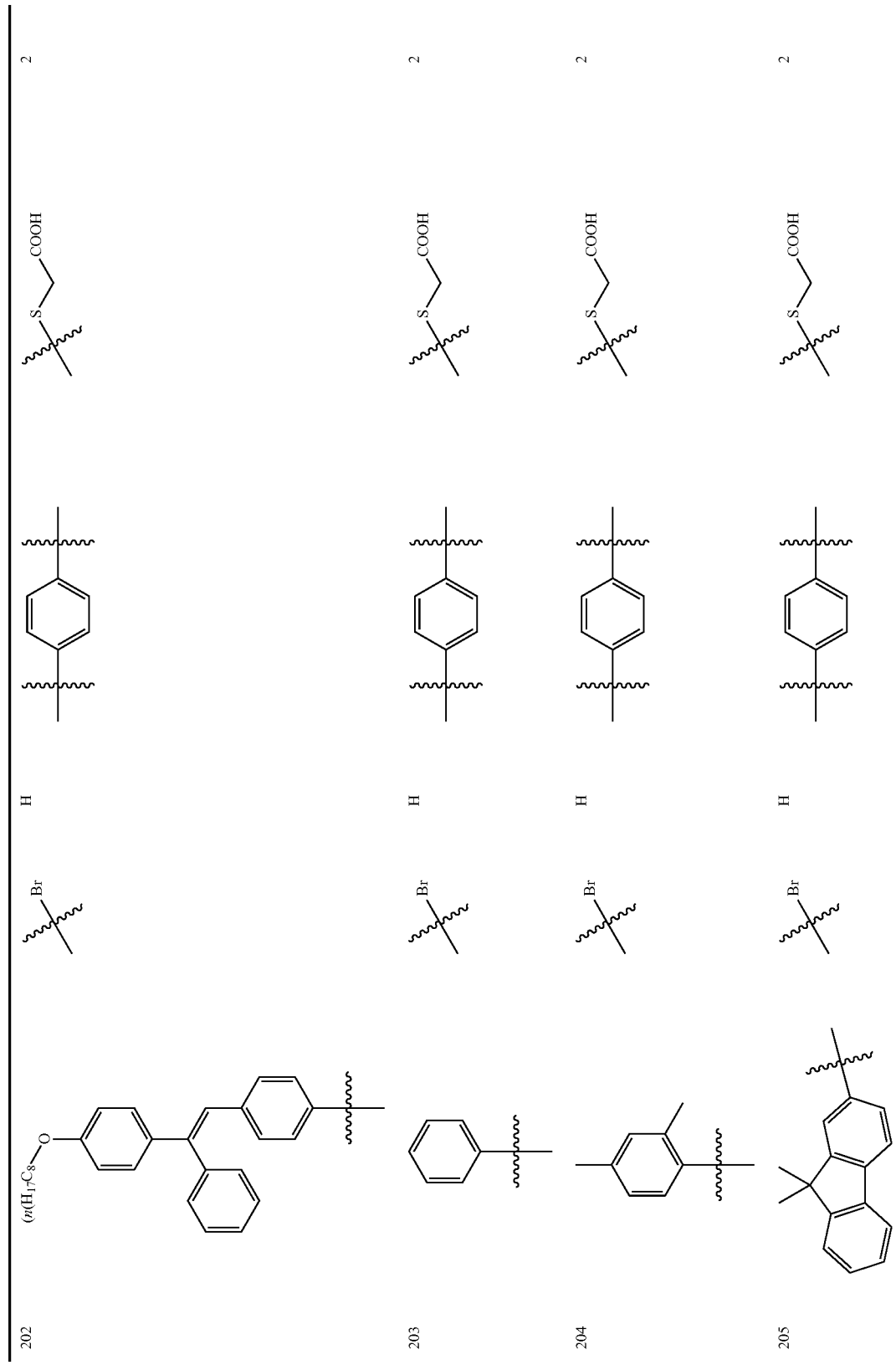

-continued
| | | | | | |
|---|---|---|---|---|---|
| 206 | 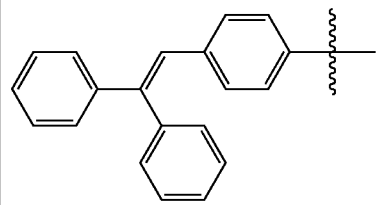 | 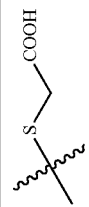 | H | 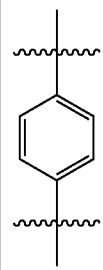 |  | 2 |
| 207 | 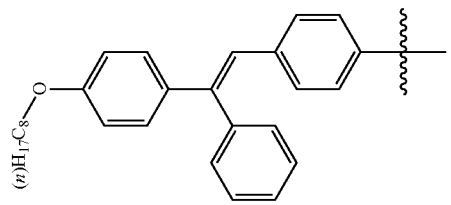 | 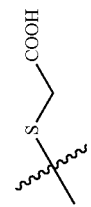 | H | 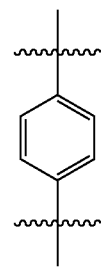 |  | 2 |
| 208 | 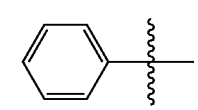 | 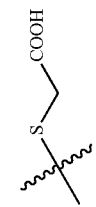 | H | 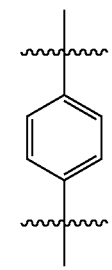 |  | 2 |

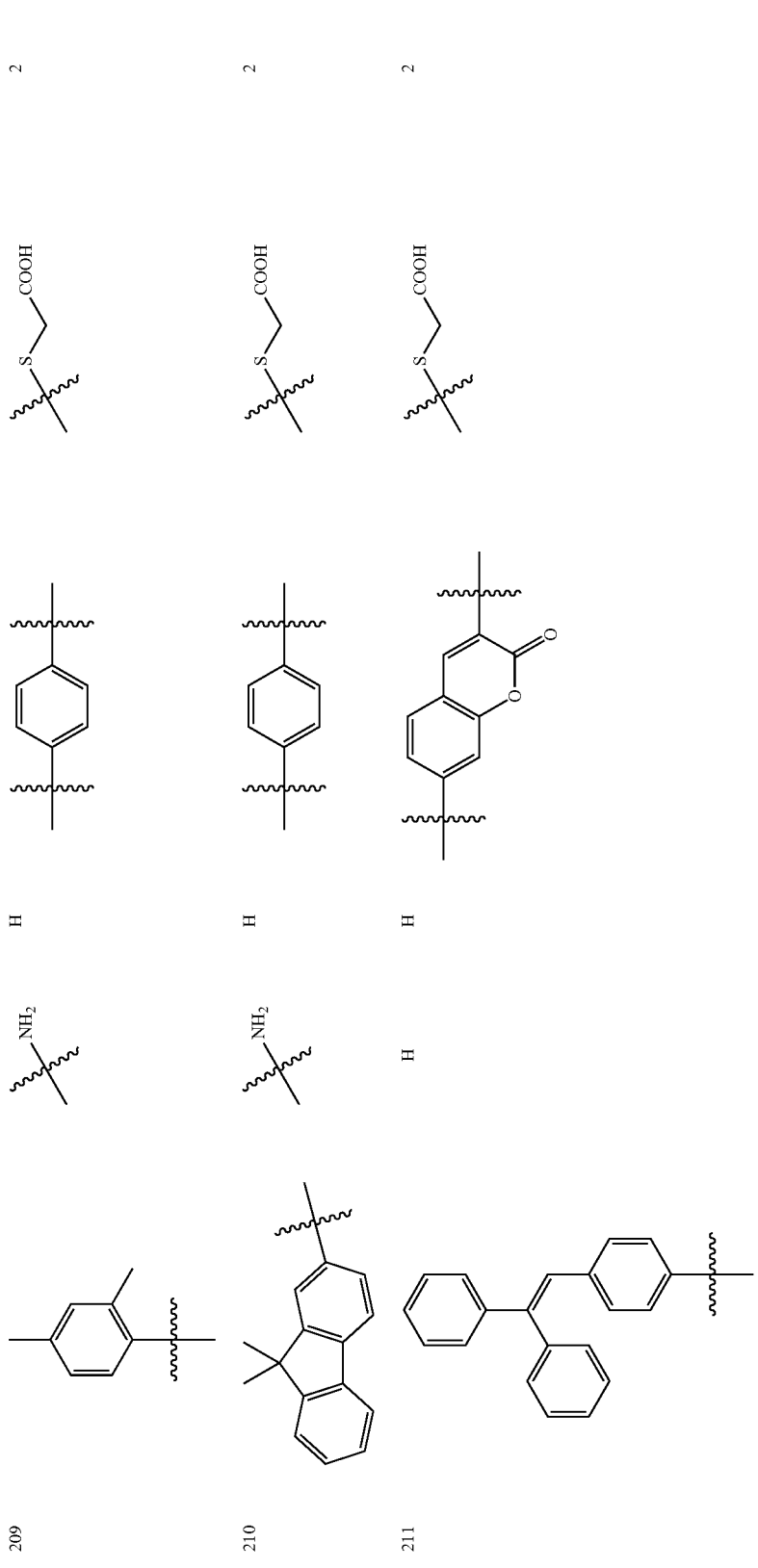

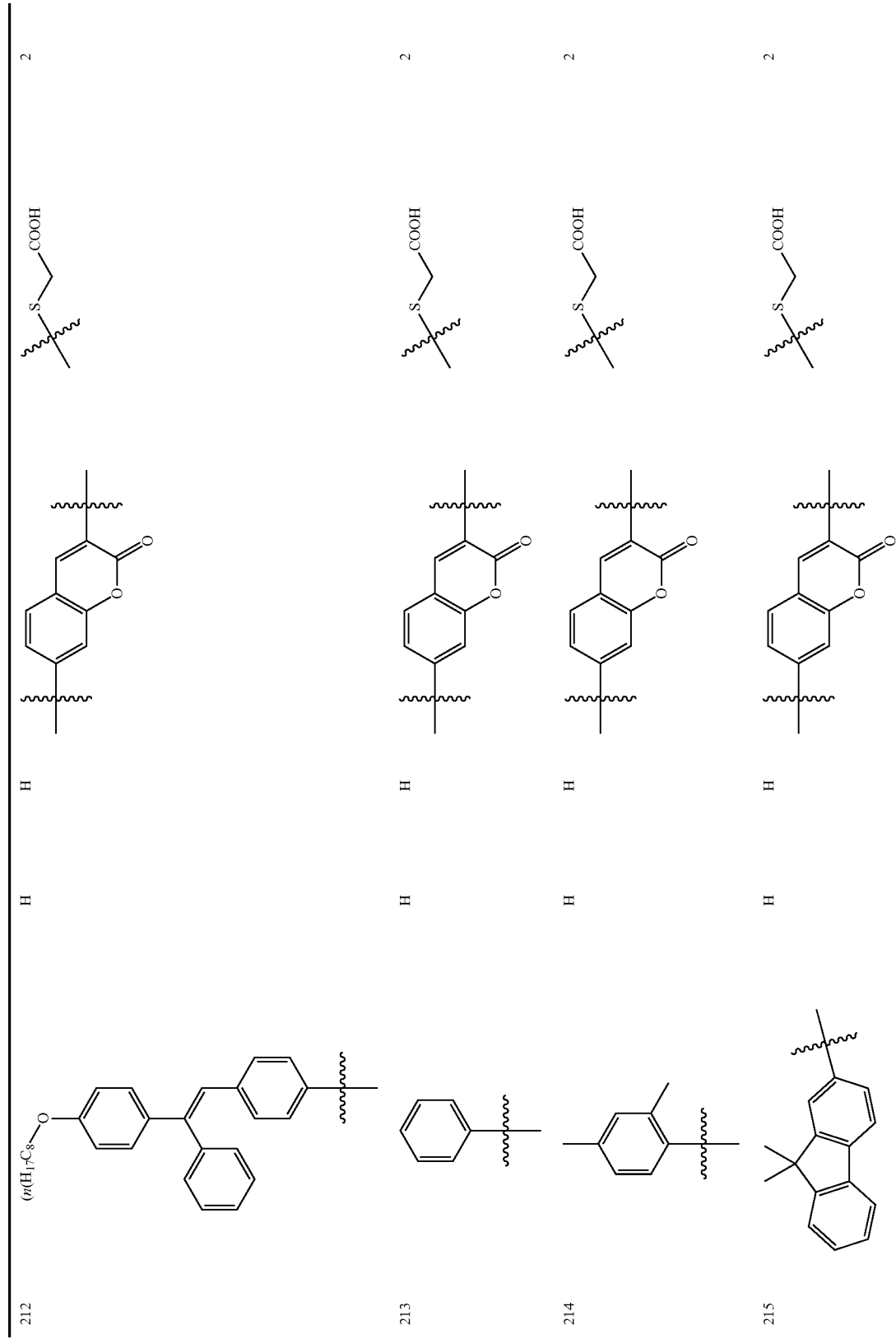

| | | | | | |
|---|---|---|---|---|---|
| 216 | 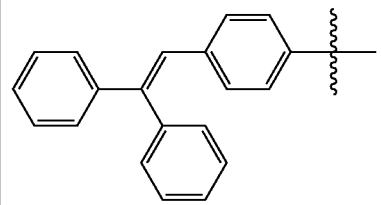 | H | H |  | 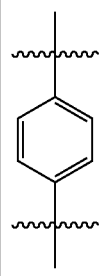 | 2 |
| 217 | 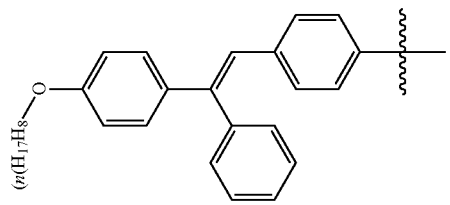 | H | H |  | 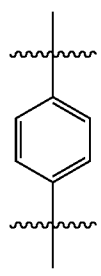 | 2 |
| 218 | 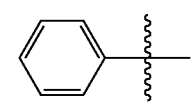 | H | H | 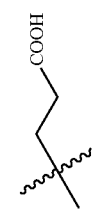 | 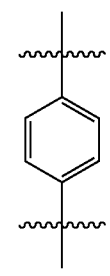 | 2 |

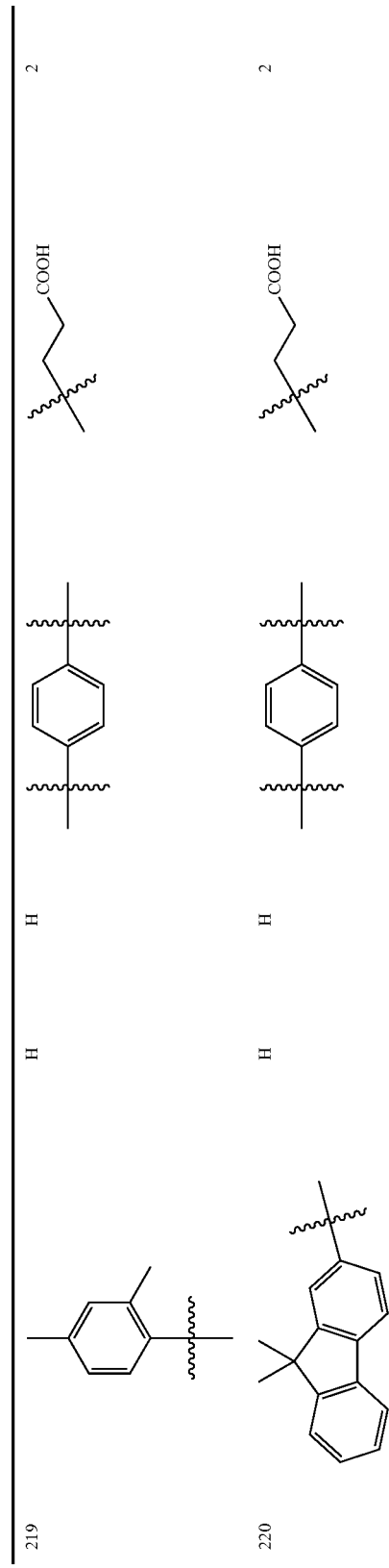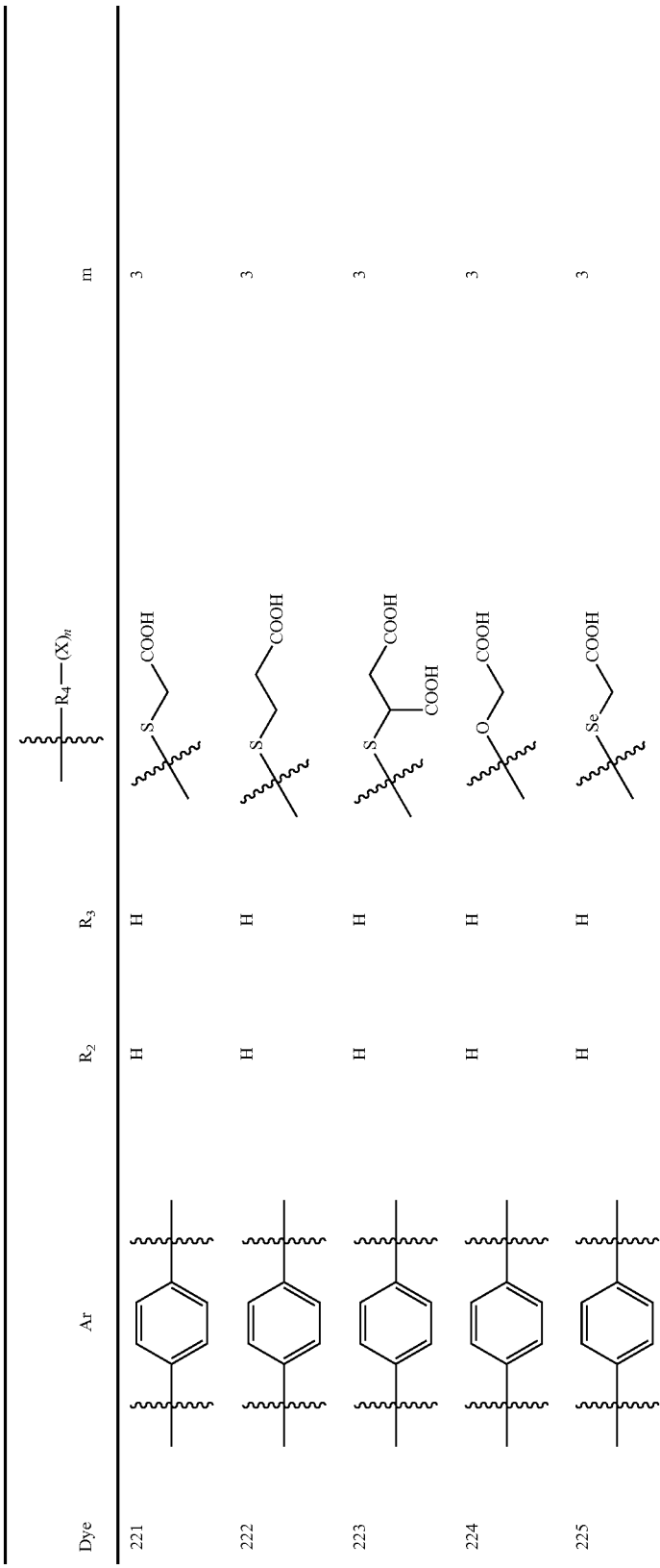

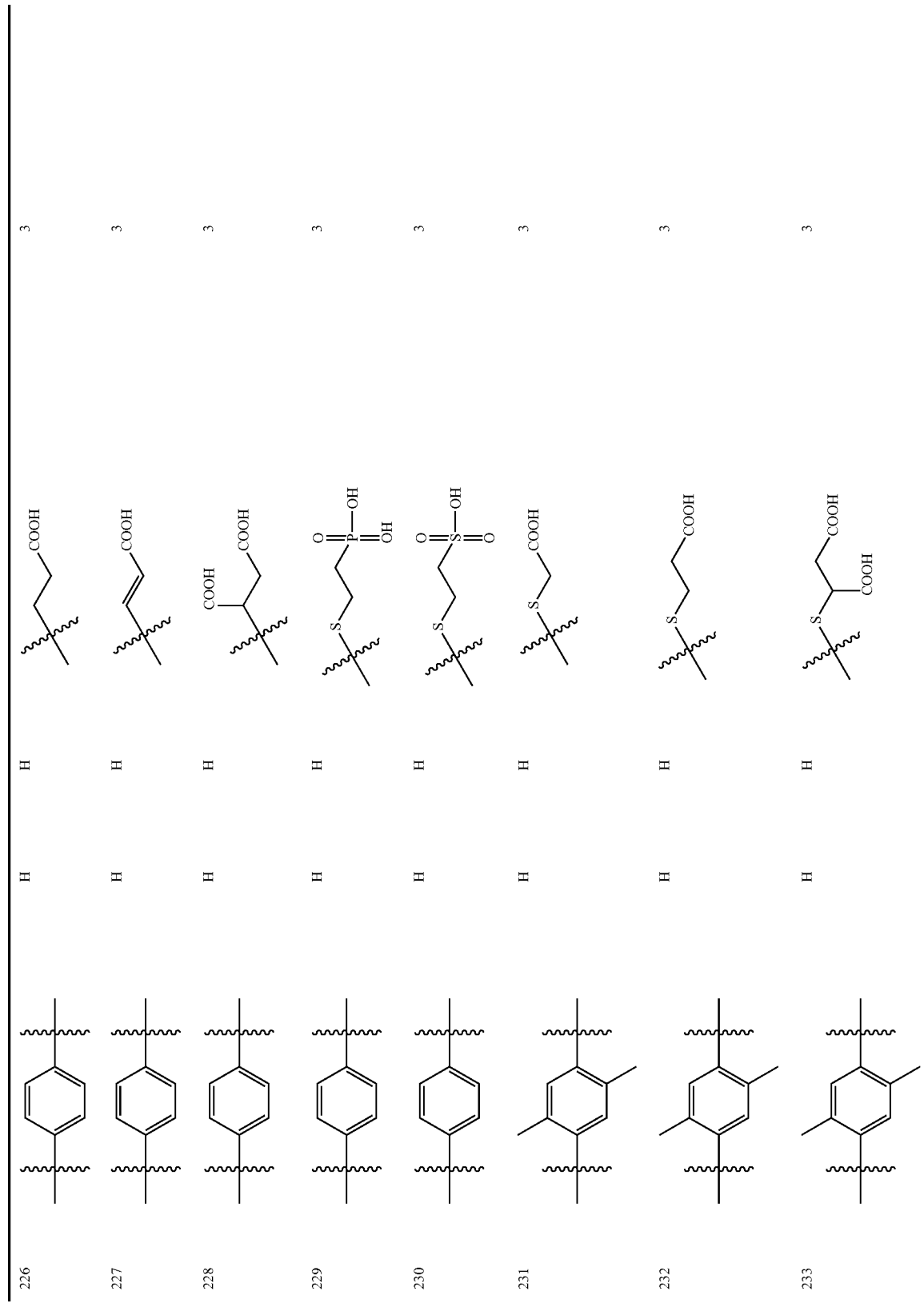

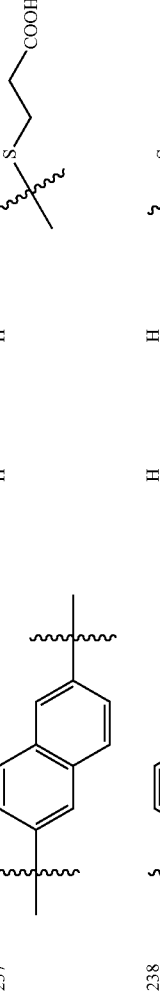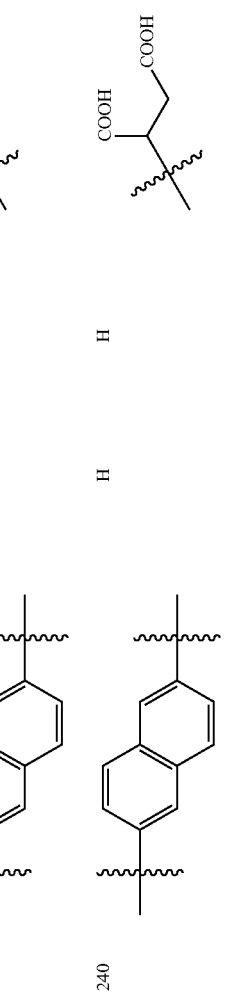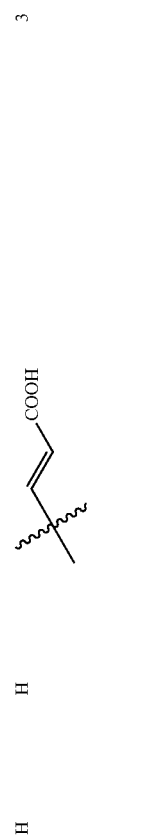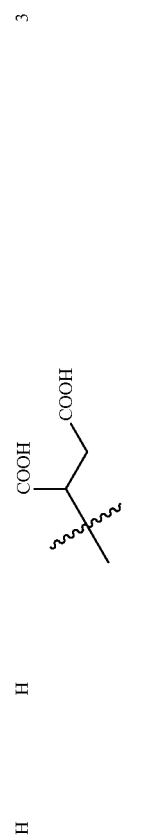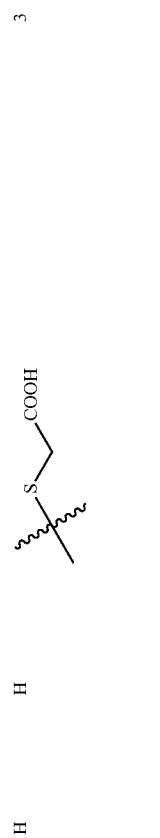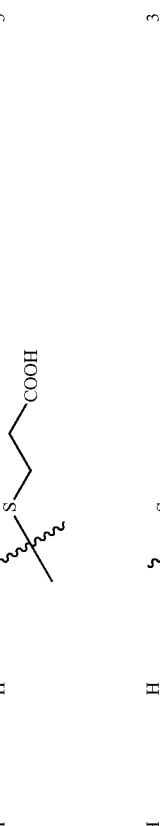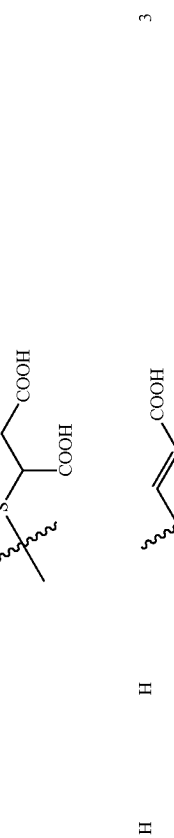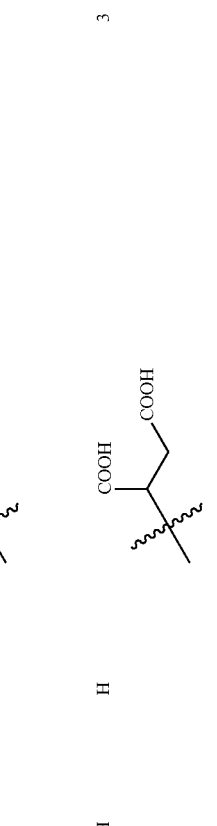

| | | | | |
|---|---|---|---|---|
| 241 | thiophene-2,5-diyl | H | H | -S-CH₂-COOH | 3 |
| 242 | thiophene-2,5-diyl | H | H | -S-CH₂CH₂-COOH | 3 |
| 243 | thiophene-2,5-diyl | H | H | -S-CH(CH₂COOH)-COOH | 3 |
| 244 | thiophene-2,5-diyl | H | H | -CH=CH-COOH | 3 |
| 245 | thiophene-2,5-diyl | H | H | -CH(COOH)-CH₂-COOH | 3 |
| 246 | coumarin-3,7-diyl | H | H | -S-CH₂-COOH | 3 |
| 247 | coumarin-3,7-diyl | H | H | -S-CH₂CH₂-COOH | 3 |

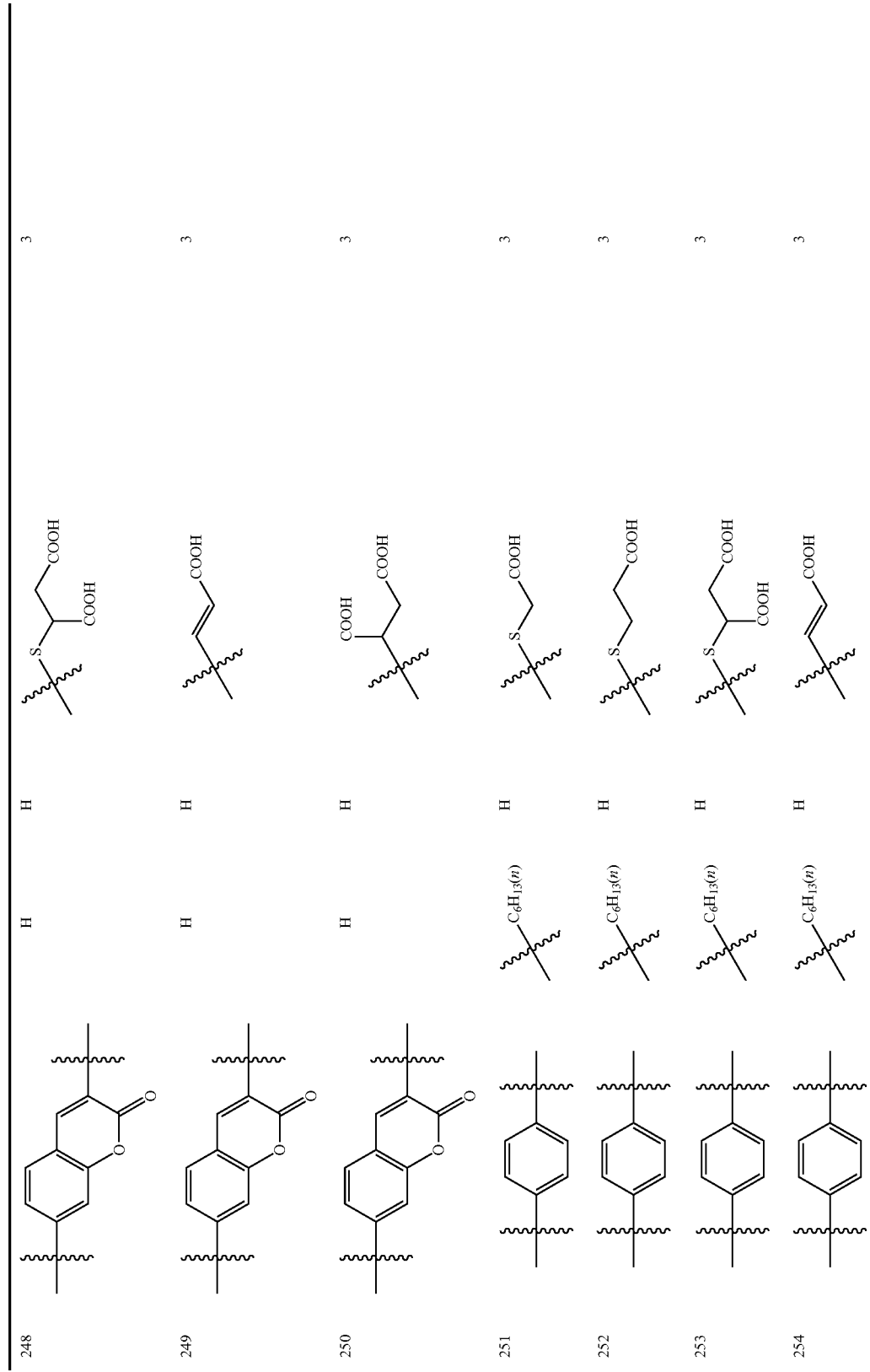

| | | | | | |
|---|---|---|---|---|---|
| 255 | ⌇⌇—⟨benzene⟩—⌇⌇ | C6H13(n) | H | ⌇—C(Me)(CH2COOH)(COOH) | 3 |
| 256 | ⌇⌇—⟨benzene⟩—⌇⌇ | Me | H | ⌇—C(Me)(S–CH2COOH) | 3 |
| 257 | ⌇⌇—⟨benzene⟩—⌇⌇ | Me | H | ⌇—C(Me)(S–CH2CH2COOH) | 3 |
| 258 | ⌇⌇—⟨benzene⟩—⌇⌇ | Me | H | ⌇—C(Me)(S–CH(COOH)CH2COOH) | 3 |
| 259 | ⌇⌇—⟨benzene⟩—⌇⌇ | Me | H | ⌇—C(Me)(CH=CH–COOH) | 3 |
| 260 | ⌇⌇—⟨benzene⟩—⌇⌇ | Me | H | ⌇—C(Me)(CH2COOH)(COOH) | 3 |
| 261 | ⌇⌇—⟨benzene⟩—⌇⌇ | H | Me | ⌇—C(Me)(S–CH2COOH) | 3 |
| 262 | ⌇⌇—⟨benzene⟩—⌇⌇ | H | Me | ⌇—C(Me)(S–CH2CH2COOH) | 3 |
| 263 | ⌇⌇—⟨benzene⟩—⌇⌇ | H | Me | ⌇—C(Me)(S–CH(COOH)CH2COOH) | 3 |

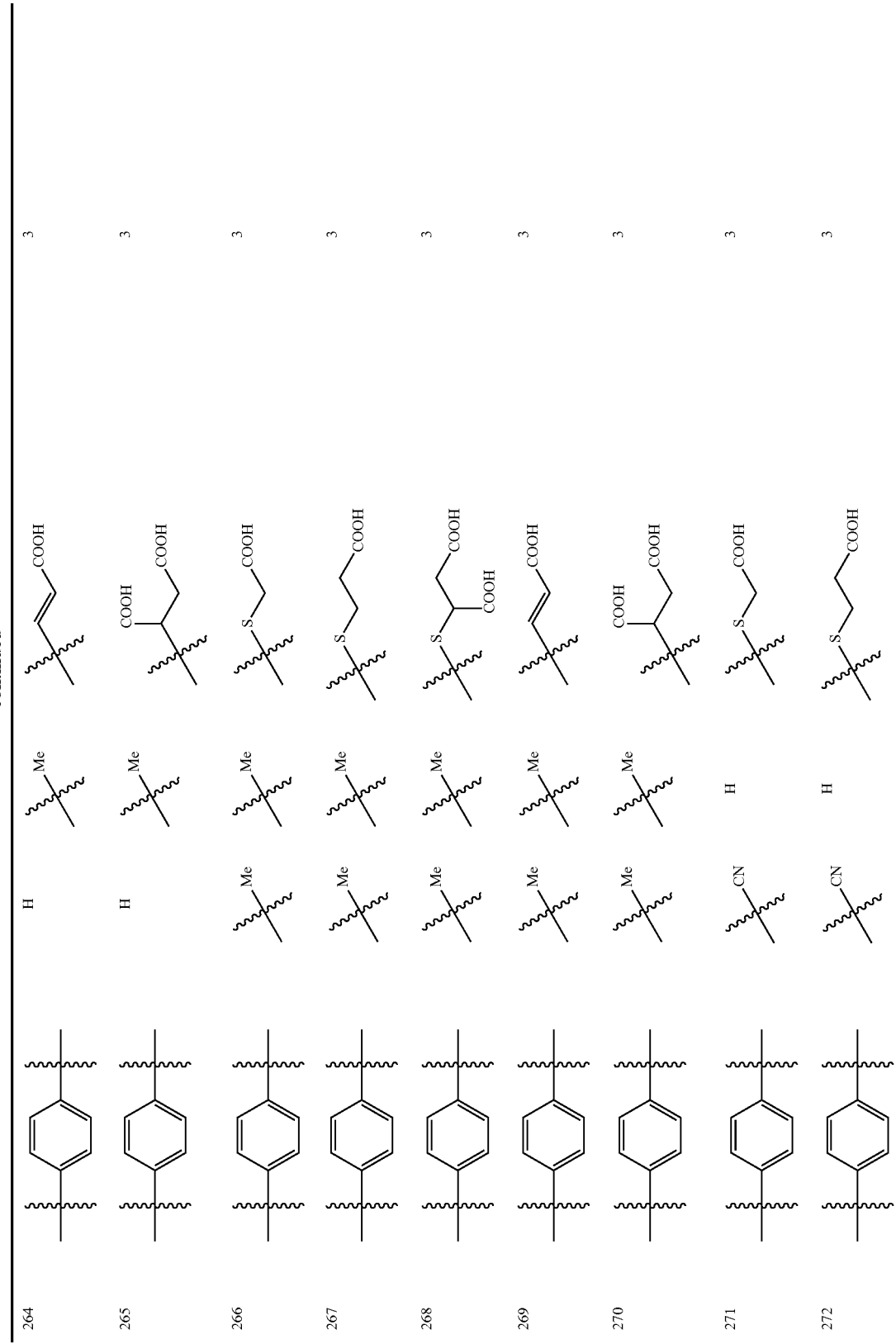

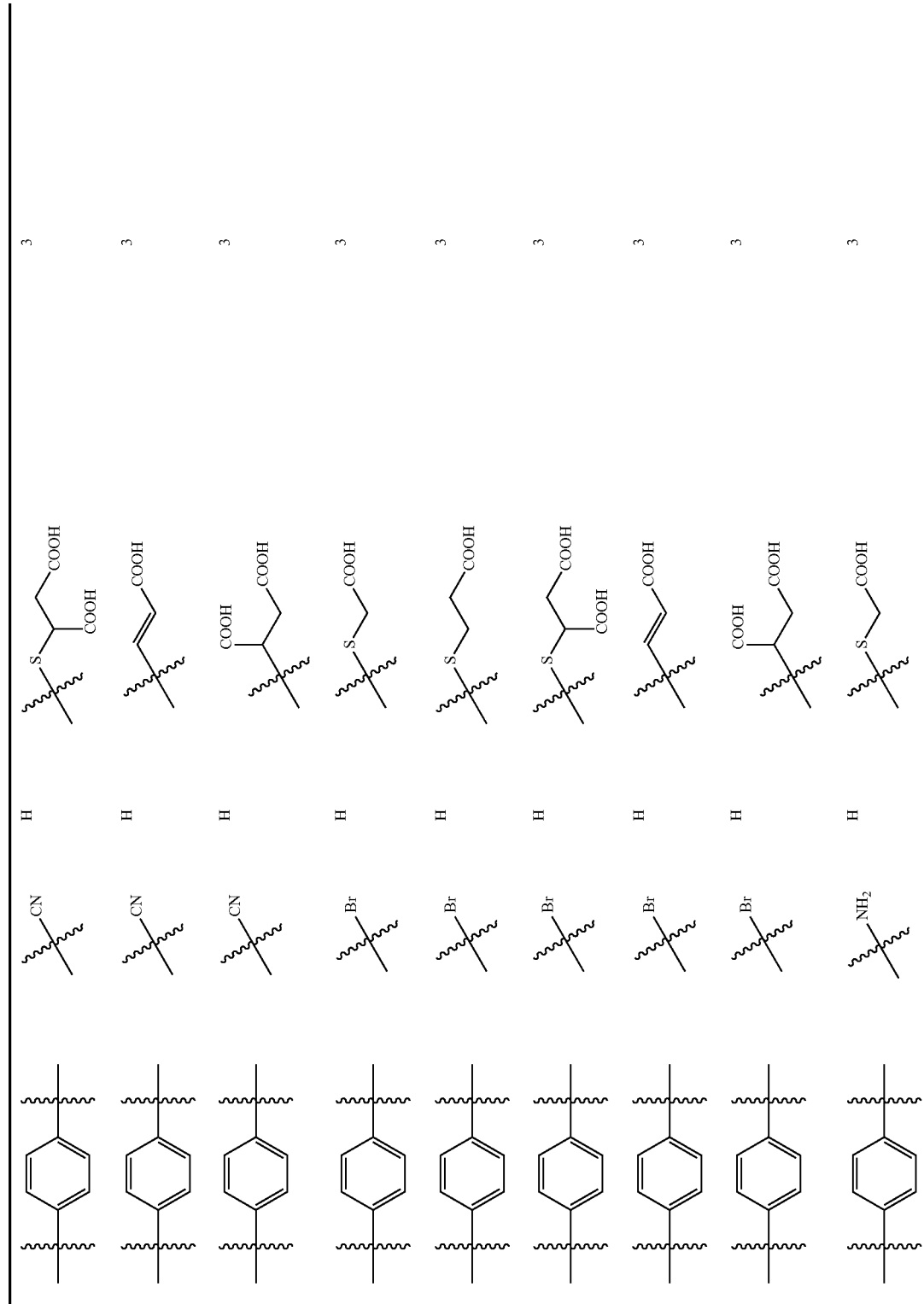

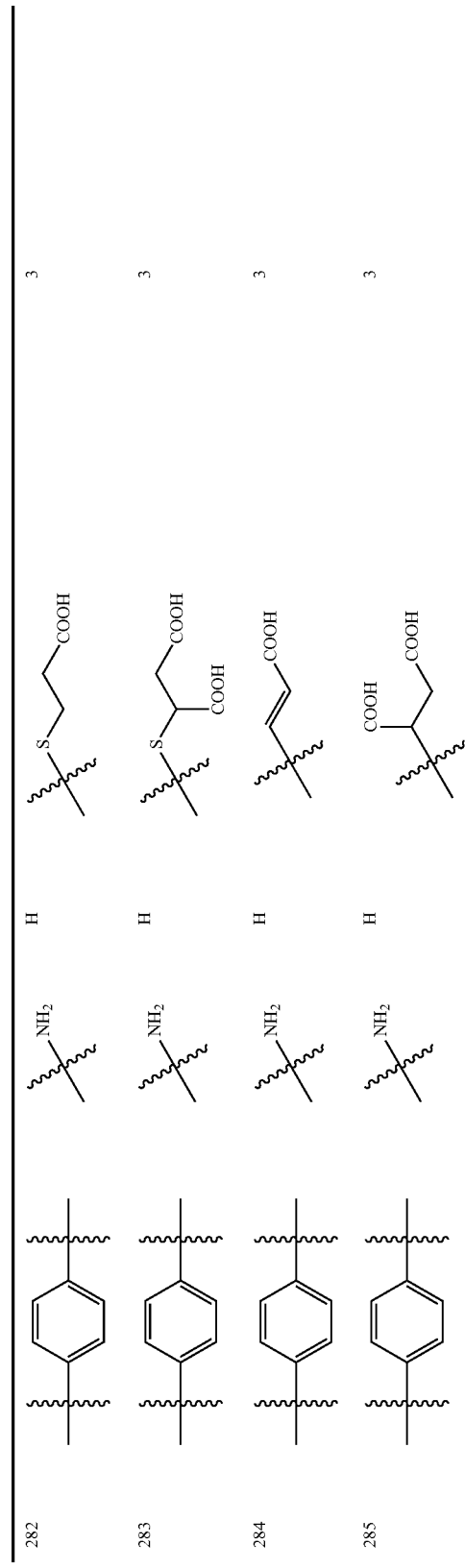

The above compounds (hereafter, also referred to as dye of the present invention) represented Formulas (1) through (4) may be synthesized by general synthesizing methods. Among those methods, the compounds can be synthesize by the methods disclosed in Japanese Unexamined Patent Publication Nos. 7-5709 and 7-5706.

Synthesizing Example

Synthesizing Example 1

Synthesis of Dye 5

Dye 5 was synthesized by the following schemes.

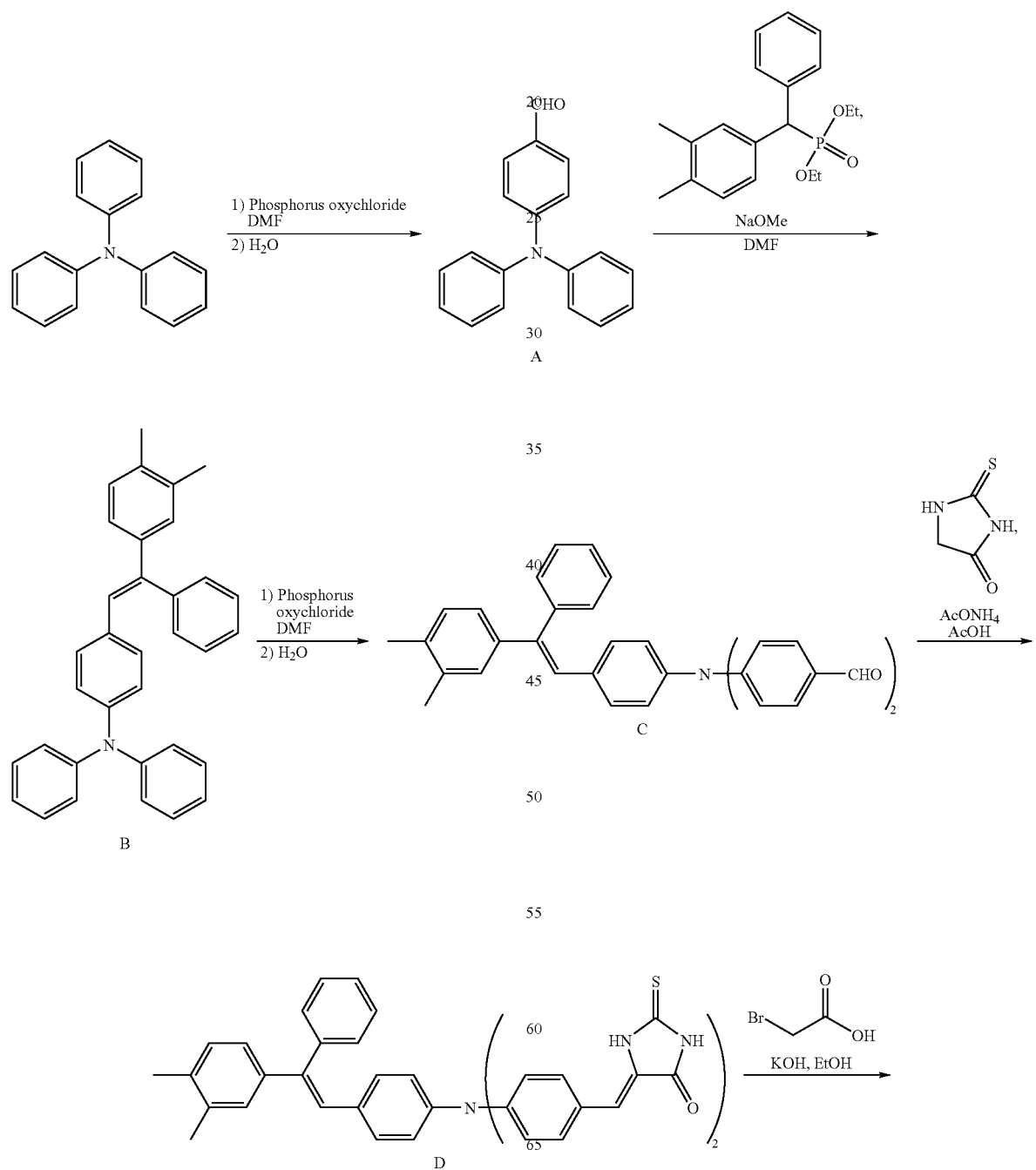

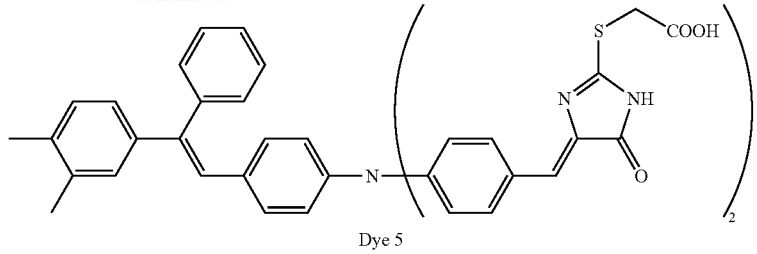

Dye 5

Into a toluene solution of triphenylamine, 1.1 equivalent of phosphorus oxychloride and 1.2 equivalent of DMF (N,N-dimethylformamide) were added, and stirred at 60° C. for one hour. The resultant reaction solution was added with chilled water, stirred for one hour at room temperature, and thereafter subjected to extraction with ethyl acetate. The extracted material was washed with water, dried with magnesium sulfate, thereafter, concentrated and dried in a rotary evaporator, and further processed with a silica column, whereby Compound A was obtained.

Compound A (aldehyde-substituted triphenylamine) was added into a DMF solution of 1.2 equivalent of diethylphenyl-(3,4-dimethylphenyl)methyl phosphonate and 1.3 equivalent of sodium methoxide, and was stirred at 120° C. for one hour. The resultant reaction solution was added with water, subjected) to extraction with ethyl acetate. The extracted material was washed with water, dried with magnesium sulfate, thereafter, concentrated and dried in a rotary evaporator, and further processed with a silica column, whereby Compound B was obtained.

Three equivalent of phosphorus oxychloride was dropped into DMF at 0° C., and stirred at room temperature for 30 minutes. Into the resultant solution, a DMF solution of Compound B was dropped, and stirred at 100° C. for 5 hours. The resultant reaction solution was added with chilled water, stirred at room temperature for one hour, and thereafter subjected to extraction with ethyl acetate. The extracted material was washed with water, dried with magnesium sulfate, thereafter, concentrated and dried in a rotary evaporator, and further processed with a silica column, whereby Compound C was obtained.

An acetic acid solution in which Compound C, 3 equivalent of thiohydantoin and 10 equivalent of ammonium acetate were added, was stirred at 120° C. for 2 hours. The resultant reaction solution was added with water, then, subjected to extraction with ethyl acetate. The extracted material was washed with water, dried with magnesium sulfate, thereafter, concentrated and dried in a rotary evaporator, and further processed with a silica column, whereby Compound D was obtained.

Into an ethanol solution of Compound D, 3 equivalent of bromoacetic acid and 9 equivalent of potassium hydroxide were added, and stirred at 70° C. for 1 hour. The resultant solution was concentrated and dried in a rotary evaporator, thereafter added with water and ethyl acetate, and then an organic layer was removed with a separating funnel. The remaining water layer was added with an excessive amount of 1 mol/l hydrochloric acid, and was stirred for 5 minutes, thereafter subjected to extraction with ethyl acetate. The extracted material was washed with water, dried with magnesium sulfate, thereafter, concentrated and dried in a rotary evaporator, and further processed with a silica column, whereby Dye 5 was obtained.

The structure of Dye 5 was checked with a nuclear magnetic resonance spectrum and a mass spectrum.

Other dyes (compounds) can be synthesized in the same way.

When a semiconductor is made to support the thus-obtained dyes of the present invention, the semiconductor is subjected to sensitization and becomes possible to provide the effect of the present invention. Embodiments of making a semiconductor to support dyes include an embodiment of adsorbing dyes on the semiconductor. In the case that a semiconductor has a porous structure, there is an embodiment of filling up dyes in the porous structure of the semiconductor.

The total supporting amount of the dyes of the present invention per 1 $m^2$ of a semiconductor layer (may be semiconductors) is preferably in a range of 0.01 to 100 millimole, more preferably in a range of 0.1 to 50 millimole, especially preferably in a range of 0.5 to 20 millimole.

When sensitization treatment is conducted with the dyes of the present invention, the dyes of the present invention may be used solely for each kind, in combination of plural different kinds or in combination with other compounds (for example, compounds described in U.S. Pat. No. 4,684,537, U.S. Pat. No. 4,927,721, U.S. Pat. No. 5,084,365, U.S. Pat. No. 5,350,644, U.S. Pat. No. 5,463,057, U.S. Pat. No. 5,525,440, WA (Japanese Unexamined Patent Publication) No. 7-249790, JPA No. 2000-150007 and so on.

In particular, in the case that the photoelectric conversion element of the present invention is used for a solar cell mentioned later, it is desirable that two or more kinds of dyes different in absorption wavelength are used as a mixture so as to make a wavelength range of photoelectric conversion wider as far as possible to utilize sunlight effectively.

In order to make a semiconductor support the dyes of the present invention, as a general method, the dyes are dissolved in an appropriate solvent (ethanol etc.) and in the resultant solution, a semiconductor having been dried sufficiently is dipped for a long time.

In the case that two or more kinds of dyes of the present invention are used in combination, or are used together with other dyes for sensitization treatment, a mixed solution of those dyes may be prepared and a semiconductor is dipped in the mixed solution, alternatively, a solution may be prepared separately for each of those dyes, and a semiconductor is dipped in for each solution sequentially. In the case that a solution is prepared separately for each of those dyes and a semiconductor is dipped in each solution sequentially, even if a semiconductor supports those dyes by being dipped in each solution in any order, the effects of the present invention can be acquired. Further, those dyes may be adsorbed on semiconductor particles solely separately, the resultant semiconductor particles supporting different dyes respectively may be mixed to prepare a photoelectric conversion element.

The detail of the sensitization treatment of the semiconductor according to the present invention will be explained concretely in the section of a photoelectric conversion element described later.

Moreover, in the case of a semiconductor with high porosity, it is preferable that before water adheres in pores on a semiconductor thin layer and in pores in the semiconductor thin layer due to moisture or steam, the adsorbing process of dyes has been completed.

Next, the photoelectric conversion elements of the present invention will be explained.

[Photoelectric Conversion Element]

The photoelectric conversion elements of the present invention comprises at least a semiconductor layer in which dyes of the present invention are supported by a semiconductor, a charge transport layer, a counter electrode on a conductive substrate. Hereafter, the semiconductor, the charge transport layer, and the counter electrode will be explained sequentially.

<<Semiconductor>>

Examples of a semiconductor employed as a semiconductor electrode of the present invention include single substances such as silicon and germanium; compounds containing elements of Groups 3 to 5 and Groups 13 to 15 of the periodic table (also referred to as the element periodic table); metal chalcogenides (for example, an oxide, sulfide, selenide, etc.); metal nitrides and the like.

Examples of preferable metal chalcogenides include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony, or bismuth; a selenide of cadmium or lead; a telluride of cadmium, and the like. Examples of other compound semiconductors include a hosphide of zinc, gallium, indium, or cadmium; a selenide of gallium-arsenic or copper-indium; a sulfide of copper-indium: a nitride of titanium, and the like.

As specific examples, $TiO_2$, $SnO_2$, $Fe_2O_3$, $WO_3$, ZnO, $Nb_2O_5$, CdS, ZnS, PbS, $Bi_2S_3$, CdSe, CdTe, GaP, InP, GaAs, $CuInS_2$, $CuInSe_2$ and $Ti_3N_4$ are employable. However, preferably employable are $TiO_2$, ZnO, $SnO_2$, $Fe_2O_3$, $WO_3$, $Nb_2O_5$, CdS and PbS; more preferably employable are $TiO_2$ and $Nb_2O_5$; and among them, most preferably employable is $TiO_2$ (titanium oxide).

As semiconductors used for the semiconductor layer, plural kinds of the above-described semiconductors may be used in combination. For example, several kinds of the above-described metal oxides or metal sulfides may be used in combination, or a titanium oxide semiconductor may be mixed and used with 20 weight % of titanium nitride ($Ti_3N_4$). Further, a composite of a zinc oxide and a tin oxide, described in J. Chem. Soc., Chem. Commun., 15 (1999), may also be used. In the case that a component other than a metal oxide and a metal sulfide is added as a semiconductor, the weight ratio of the additional component to a metal oxide or a metal sulfide semiconductor is preferably 30% or less.

Moreover, the semiconductor according to the present invention may be subjected to a surface treatment by the use of an organic base. Examples of the organic base include diarylamine, triarylamine, pyridine, 4-t-butylpyridine, polyvinyl pyridine, quinoline, piperidine, amidine, and the like. Among them, 4-t-butylpyridine, and polyvinyl pyridine are desirable.

In the ease that the above-mentioned organic base is a liquid, the organic base, as it is, is made to a liquid amine, and in the case that the organic base is a solid, the organic base is dissolved in an organic solvent so as to prepare an amine solution, whereby the surface treatment is conducted in such a way that a semiconductor according to the present invention is immersed in the liquid amine or the prepared amine solution.

(Conductive Substrate)

As a conductive substrate (an electrically conductive substrate) employed for the photoelectric conversion element of the present invention and the solar cell of the present invention, a conductive material such as a metal plate and a material having a structure in which a conductive substance is provided on a non-conductive material such as a glass plate or a plastic film, can be employed. Examples of a material employed for a conductive substrate include a metal (such as platinum, gold, silver, copper, aluminum, rhodium and indium), a conductive metal oxide (such as an indium-tin complexing oxide and a tin oxide doped with fluorine) or carbon. The thickness of a conductive substrate is not specifically limited, however, is preferably 0.3 to 5 mm.

The conductive substrate located at a position to which light is introduced, is preferably substantially transparent. The term "substantially transparent" means that the transmittance of light is 10% or more, more preferably 50% or more, and most preferably 80% or more. In order to obtain a transparent substrate, it is preferable to provide a conductive layer composed of a conductive metal oxide on a surface of a glass plate or a plastic film. In the case of employing a transparent conductive substrate, it is preferable to introduce light from the substrate side.

The surface resistance of a conductive substrate is preferably 50 $\Omega/cm^2$ or less, and more preferably 10 $\Omega/cm^2$ or less.

<<Production of a Semiconductor Layer>>

A producing method of a semiconductor layer according to the present invention will be explained.

In the case that the semiconductor of the semiconductor layer according to the present invention is particulate, it is preferable to produce a semiconductor layer is such a way that semiconductor particles are coated or sprayed onto a conductive substrate. On the other hand, in the case that the semiconductor according to the present invention is shaped in a film and is not held on a conductive substrate, it is preferable to produce a semiconductor layer is such a way that the film-shaped semiconductor is pasted onto a conductive substrate.

As a preferable producing method of the semiconductor layer according to the present invention, employable is a method of producing a semiconductor layer by coating and calcining fine particles of a semiconductor on the above conductive substrate.

In the case that the semiconductor layer according to the present invention is produced by calcination, it is preferable to conduct a sensitization treatment (adsorbing dyes, filling dyes into a porous layer, etc.) for the semiconductor by the use of dyes after the calcinations. After the calcination, it is especially preferable to conduct an adsorbing process of dyes quickly before water adheres to the semiconductor.

Hereafter, a method of forming a semiconductor electrode used preferably in the present invention by calcining semiconductor fine particles will be explained in detail.

(Preparation of a Coating Liquid Containing Semiconductor Fine Particles)

First, a coating liquid containing semiconductor fine particles is prepared. The semiconductor fine particles are preferable to have a minute primary particle size, and the primary particle size is preferably 1 to 5,000 nm, and more preferably 2 to 50 nm. The coating liquid containing semiconductor fine particles can be prepared by dispersing semiconductor fine particles in a solvent. The semiconductor fine particles dispersed in the solvent are dispersing in a state of the primary particle. Any solvent is usable as far as it can disperse the fine particles, and such a solvent is not specifically limited.

Examples of the above solvent include water, an organic solvent and a mixed solution of water and an organic solvent. Examples of an organic solvent include an alcohol such as methanol and ethanol; a ketone such as methyl ethyl ketone, acetone and acetyl acetone; a hydrocarbon such as hexane and cyclohexane, and the like. Into the coating liquid, a surfactant or a viscosity controlling agent (such as a polyalcohol such as polyethylene glycol) can be appropriately added as needed. The concentration of semiconductor fine particles in a solvent is preferably in a range of 0.1 to 70% by weight, and more preferably 0.1 to 30% by weight.

(Coating a Coating Liquid Containing Semiconductor Fine Particles and the Calcination Treatment of a Formed Semiconductor Fine Particle Layer)

The coating liquid containing semiconductor fine particles which has been prepared as mentioned above is coated or sprayed on a conductive substrate and dried, and then the dried coating layer is calcined in air or in an inert gas, whereby a semiconductor particle layer (semiconductor particle film) is formed on the conductive substrate.

The coating layer which has been prepared by the coating and drying of the coating liquid containing semiconductor fine particles on the conductive substrate is comprised of aggregate of semiconductor fine particles, and the particle size of the fine particles corresponds to the primary particle size of the used semiconductor fine particles.

The semiconductor fine particle layer formed in the above ways on a conductive layer of a conductive substrate is weak in bonding strength with the conductive substrate or in mutually bonding strength of particles and also weak in mechanical strength. Therefore, in order to increase the mechanical strength and to make the semiconductor layer firmly adhering on the substrate, the semiconductor fine particle layer is subjected to a calcining treatment.

In the present invention, the semiconductor fine particle layer may have any structure, however, preferable is a porous structure layer (also referred to as a porous layer having pores).

Here, the porosity of the semiconductor fine particle layer according to the present invention is preferably 10% by volume or less, more preferably 8% by volume or less, and specifically preferably in a range of 0.01 to 5% by volume. The porosity of a semiconductor fine particle layer means a porosity having penetrability in the thickness direction of a dielectric substance, and can be measured by the use of an apparatus available on the market such as a mercury porosimeter (Shimazu Porelyzer 9220).

The layer thickness of the semiconductor fine particle layer becoming a calcined substance layer having a porous structure is preferably at least 10 nm or more, and more preferably in a range of 500 to 30,000 nm.

At the time of the calcining treatment, from a viewpoint of preparing appropriately an actual surface area of a calcined layer and obtaining a calcined layer having the abovementioned porosity, a calcining temperature is preferably less than 1,000° C., more preferably in a range of 200 to 800° C., and specifically preferably in a range of 300 to 800° C.

The ratio of an actual surface area to an apparent surface area can be controlled by, for example, the particle size and specific surface area of semiconductor fine particles and the calcining temperature. Further, in order to increase an electron injection efficiency from dyes to semiconductor fine particles by increasing surface areas of semiconductor fine particles or by increasing purity in the vicinity of the semiconductor fine particles, the semiconductor fine particle layer may be subjected to a chemical plating treatment by the use of a titanium tetrachloride aqueous solution or an electrochemical plating treatment by the use of a titanium trichloride aqueous solution after the calcining treatment.

(Sensitization Treatment of a Semiconductor)

A sensitization treatment for a semiconductor is conducted by a step of dissolving dyes of the present invention in a suitable solvent and a step of immersing in the solution a substrate on which the aforesaid semiconductor fine particle layer has been calcined. At this time, the substrate on which the semiconductor fine particle layer (also referred to as a semiconductor fine particle film) has been calcined is preferably subjected to a reduced-pressure treatment or a heating treatment in order to remove air bubbles in the layer. With these treatments, the dyes of the present invention can deeply enter into the inside of the semiconductor layer (semiconductor film). Accordingly, it is specifically preferable when the semiconductor layer (semiconductor fine film) is a porous structure layer.

A solvent used for dissolving the dyes of the present invention is not limited to a specific solvent, as far as the solvent can dissolve the abovementioned dyes and does not dissolve nor react with the semiconductor. However, it is preferable that a solvent is degassed and refined by distillation in advance in order to prevent moisture and gas dissolved in the solvent from entering into a semiconductor fine particle layer and disturbing a sensitization treatment such as adsorption treatment of the abovementioned compound (dye).

Examples of a solvent preferably employed for dissolving the abovementioned compound (dye), include alcohol solvents such as methanol, ethanol and n-propanol; ketone solvents such as acetone and methylethyl ketone; ether solvents such as diethyl ether, diisopropyl ether, tetrahydrofuran and 1,4-dioxane; and halogenated hydrocarbon solvents such as methylene chloride and 1,1,2-trichloroethane, and two or more kinds of the above solvents may be used as a mixed solvent. Among the above solvents, specifically preferable are methanol, ethanol, acetone, methylethyl ketone, tetrahydrofuran and methylene chloride.

(Temperature and Time of a Sensitization Treatment)

It may be preferable to determine a time for immersing a substrate with a calcined semiconductor in a solution containing dye of the present invention in consideration of at least the following two points. (1) It is necessary to allow dye to enter deeply in a semiconductor layer (a semiconductor film) such that the dyes adsorb on the semiconductor so as to sensitize the semiconductor sufficiently. (2) It is necessary to prevent decomposition products produced by the decomposition of dye in the solution from disturbing the adsorption of dye. From the above viewpoints, the immersing time is preferably in a range of 3 to 48 hours and more preferably in a range of 4 to 24 hours under a condition of 25° C. The above effects are particularly remarkable when the semiconductor film is a porous film. The above immersing time is a value on a condition of 25° C., and if the temperature condition is changed, the above immersing time may be also changed.

During the immersing, as far as dye does not decompose, a solution containing dye of the present invention may be heated to a temperature at which it does not boil. A preferable temperature is in a range of 10 to 100° C. and more preferably in a range of 25 to 80° C.; however, as mentioned above, if a solvent boils, the above temperature range may be changed.

<Charge Transport Layer>

The charge transport layer employed in the present invention will be explained.

A charge transport layer is a layer having a function to transport, to a counter electrode, positive holes which reduced the oxidant of dye promptly and are injected at an interface with dye.

The charge transport layer according to the present invention is constituted by the disperse material of a redox electrolyte and a p type compound semiconductor (charge transport agent) as a hole transporting material as main components.

Examples of a redox electrolyte include a $I^-/I_3^-$ type, a $Br^-/Br_3^-$ type and a quinone/hydroquinone type. These redox electrolytes can be prepared by a conventionally well known method, and for example, an electrolyte of $I^-/I_3^-$ type can be prepared by mixing iodine and an ammonium salt of iodine. A disperse material of these electrolytes is called a liquid electrolyte in the case that the disperse material is a liquid; a solid polymer electrolyte in the case that the electrolytes are dispersed in a polymer which is a solid at ordinary temperature, and a gel electrolyte in the case that the electrolytes are dispersed in a gel form substance. In the case that a liquid electrolyte is employed as a charge transport layer, an electrochemically inert solvent is used as its solvent, and examples of the electrochemically inert solvent include acetonitrile, propylene carbonate and ethylene carbonate. Examples of a solid electrolyte are disclosed in Japanese Unexamined Patent Publication No. 2001-160427, and examples of a gel electrolyte are disclosed in "Surface Science", vol. 21, No. 5, pages 288 through 293.

A charge transport agent has preferably a large band gap in order not to disturb dye absorption. The band gap of the charge transport agent employed in the present invention is preferably 2 eV or more, and more preferably 2.5 eV or more. The ionization potential of a charge transport agent needs to be smaller than the ionization potential of a dye adsorption electrode in order to reduce a dye hole. Although the preferable range of the ionizing potential of a charge transport agent employed for a charge transport layer may differ depending on the employed dye, generally, the ionizing potential is preferably 4.5 eV or more and 5.5 eV or less, and preferably 4.5 eV or more and 5.5 eV or less.

As a charge transport agent, an aromatic amine derivative excellent in transporting ability for a positive hole is desirable. For this reason, when a charge transport layer is constituted mainly by an aromatic amine derivative, photoelectric conversion efficiency can be improved more. As the aromatic amine derivative, it is particularly desirable to use a triphenyl diamine derivative. The triphenyl diamine derivative is excellent particularly in transporting capacity for a positive hole among the aromatic amine derivative. Further, any one of a monomer, an oligomer, a prepolymer, and a polymer of such an aromatic amine derivative may be employable, and a mixture of them may be employable. Since a monomer, an oligomer, and a prepolymer have relatively low molecular weight, they have high solubility to a solvent such as an organic solvent. Accordingly, in the case that a charge transport layer is formed by a coating method, there is an advantage that a charge transport layer material can be prepared more easily. Among them, as an oligomer, it is desirable to use a dimer or a trimer.

Specific examples of an aromatic tertiary amine compound include N,N,N',N'-tetraphenyl-4,4"-diaminophenyl; N,N'-diphenyl-N,N'-bis(3-methylphenyl)-[1,1'-biphenyl]-4,4'-diamine (TPD); 2,2-bis(4-di-p-tolyl aminophenyl)propane; bis(4-dimethylamino 2-methylphenyl)phenylmethane; bis(4-di-p-tolyl aminophenyl)phenylmethane; N,N'-diphenyl-N,N"-di(4-methoxy phenyl)-4,4'-diaminobiphenyl; N,N,N',N'-tetraphenyl-4,4'-diaminodiphenyl ether; 4,4'-bis(diphenylamino) quadriphenyl; N,N,N-trip-tolyl)amine; 4-(di-p-tolylamino)-4'-[4-(di-p-tolyl amino)styryl]stilbene; 4-N,N-diphenylamino-(2-diphenylvinyl)benzene; 3-methoxy-4'-N,N-diphenylamino still benzene; N-phenylcarbazole; further a compound having two condensed aromatic rings in a molecule, such as 4,4'-bis[(N-(1-naphthyl)-N-phenylamino)]biphenyl (NPD) which is disclosed in U.S. Pat. No. 5,061,569; a compound in which three triphenylamine units are bonded in starburst type, such as 4,4',4"-tris[N-(3-methylphenyl)-N-phenylamino]triphenylamine (MTDATA) which is disclosed in Japanese Unexamined Patent Publication No. 4-308688; and the like.

Furthermore, employable is a polymeric material in which these materials are introduced in a polymer chain or these materials are made as a main chain of a polymer.

As charge transport agents other than the aromatic amine derivative, a thiophene derivative, a pyrrole derivative, a stilbene derivative, etc. are employable.

Although specific examples of a charge transport agent are shown below, the present invention is not limited to these examples.

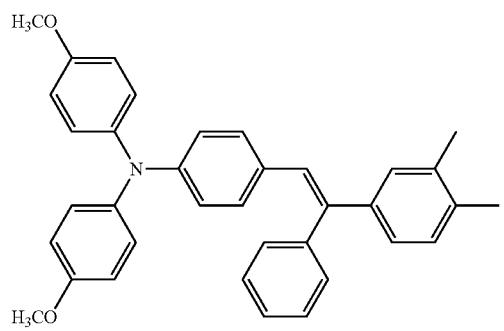

D-1

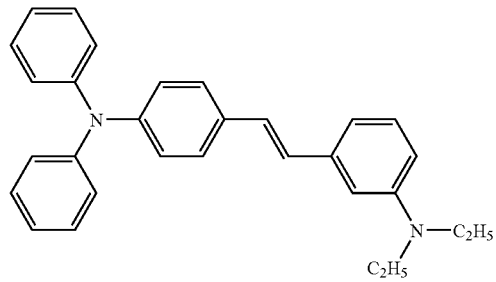

D-2

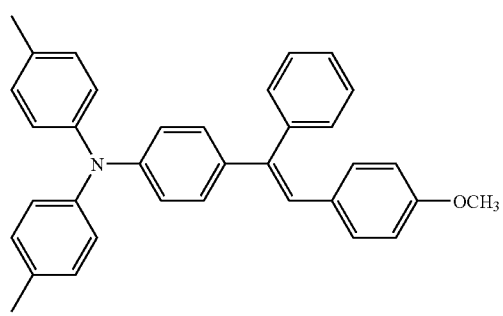

D-3

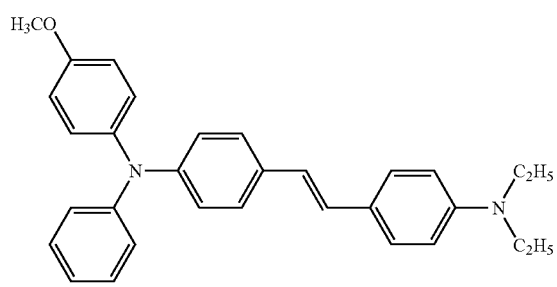

D-4

-continued
D-5
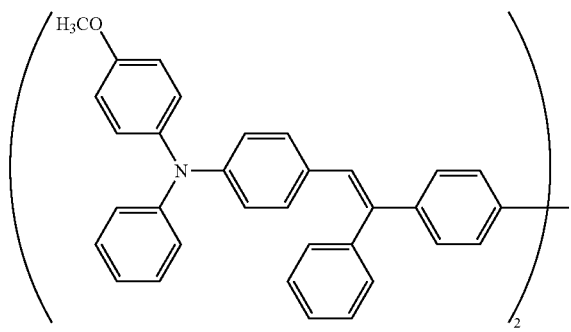
D-6
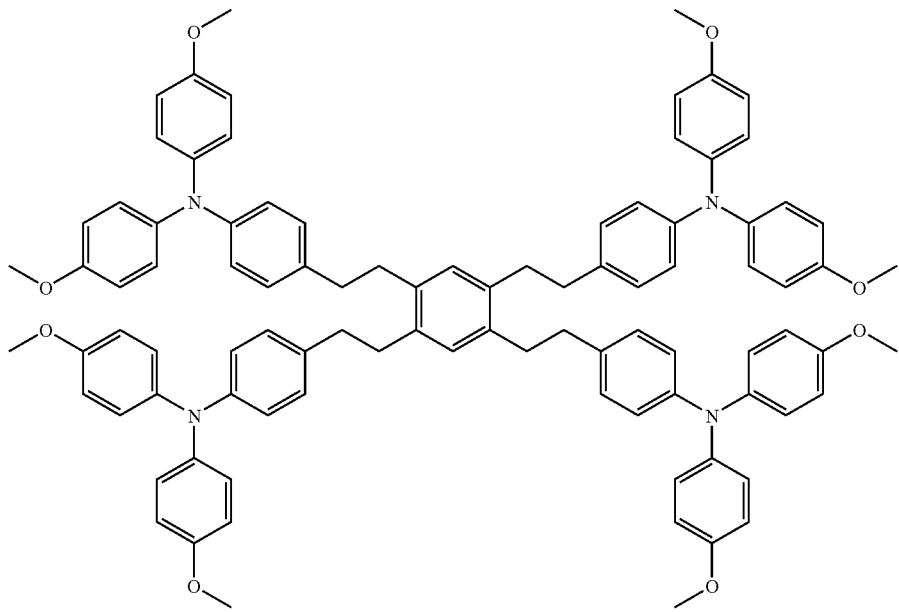
D-7
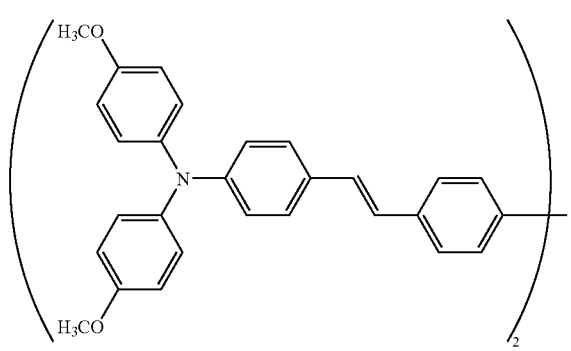
D-8
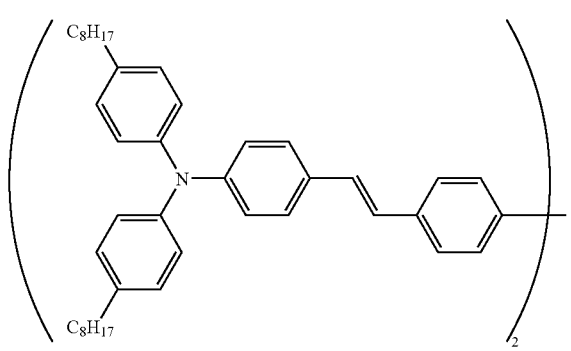
D-9
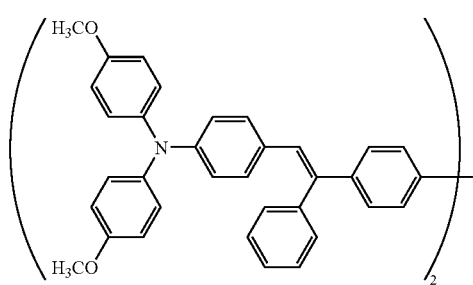
D-10
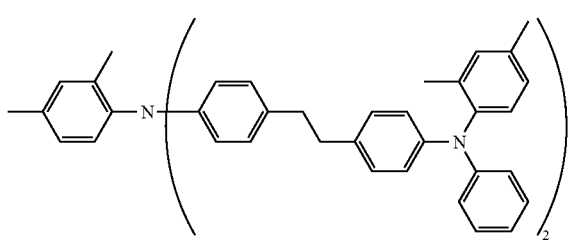

D-11
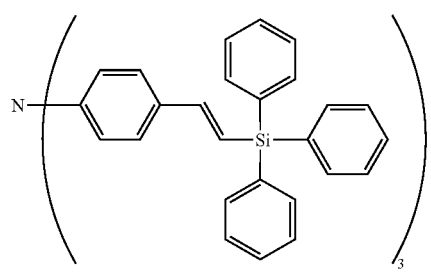

D-12
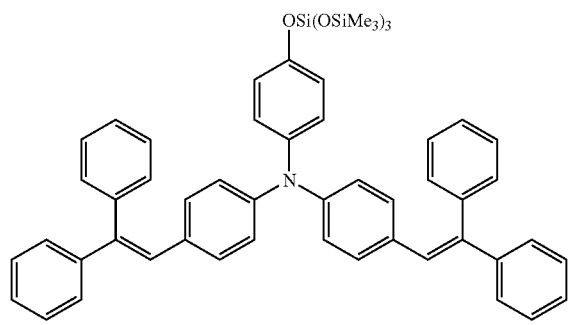

D-13
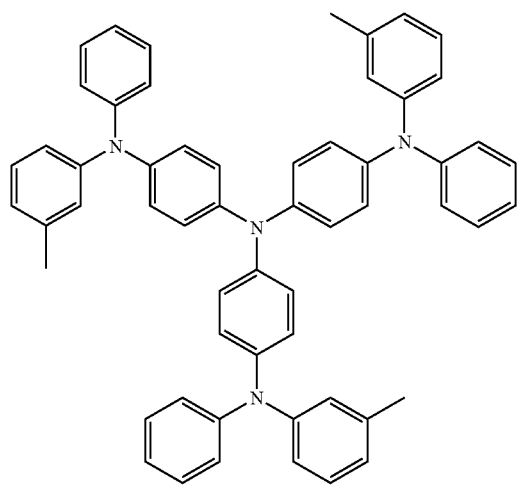

D-14
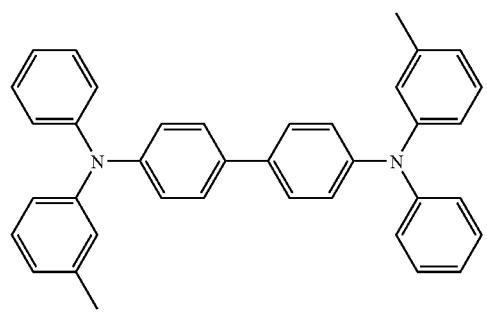

D-15
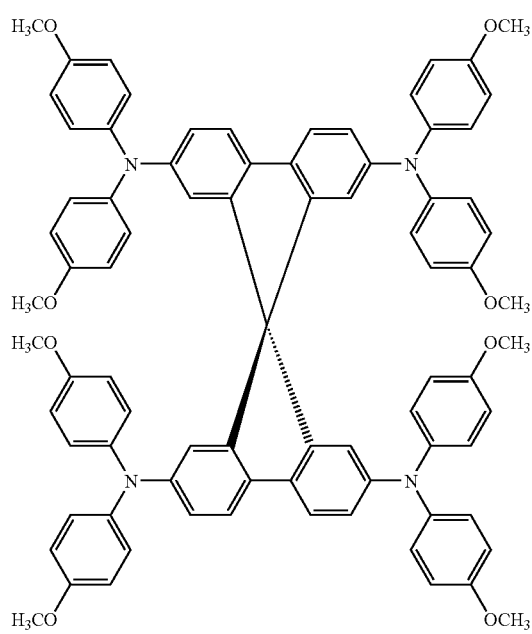

<<Counter Electrode>>

The counter electrode employed in the present invention will now be explained.

The counter electrode may be anyone having conductivity, and any conductive material may be employed arbitrarily as the counter electrode. However, preferably employed is a material having a catalytic ability to make $I_3^-$ ions conduct an oxidation reaction and other redox ions conduct a reduction reaction at a sufficient speed. Examples of such a material include a platinum electrode, a material in which platinum is plated or vapor-deposited on a surface of a conductive material, a rhodium metal, a ruthenium metal, a ruthenium oxide and carbon.

[Solar Cell]

The solar cell of the present invention will now be explained.

In a solar cell of the present invention, as an embodiment of a photoelectric conversion element of the present invention, a design and a circuit design are made most suitably for sunlight so that the solar cell has a structure with which optimum photoelectric conversion is performed when sunlight is used as a light source. That is, the solar cell is structured such that sunlight is irradiated to a dye sensitized semiconductor. At the time of assembling a solar cell of the present invention, it is preferable that the abovementioned semiconductor electrode, charge transport layer and counter electrode are stored in a case and sealed or the entire body of them is sealed with resin.

When the solar cell of the present invention is irradiated with sunlight or electromagnetic waves equivalent to sunlight, dye of the present invention supported on a semiconductor absorbs the irradiated sunlight or electromagnetic waves, and then is excited. An electron generated by the excitation moves to the semiconductor, and then the electron is transmitted as an electric current from a terminal of a conductive substrate to an electric load through an external electric circuit. Successively, the electron is transmitted through the external electric circuit to a counter electrode where the electron reduces a redox electrolyte in the charge transport layer. On the other hand, the dye of the present invention that has shifted the electron to the semiconductor becomes an oxidized state. However, the dye receives an electron from the counter electrode via the redox electrolyte in a charge transport layer, is reduced, and returns to the original state. In this way, electrons flow as an electric current, whereby the solar cell employing the photoelectric conversion element of the present invention can be constituted.

EXAMPLE

Hereafter, the present invention will be explained based on examples. However, the present invention is not limited to these examples.

Example

Production of Photoelectric Conversion Element 1

A titanium oxide paste (anatase type, a primary mean particle size (microscope observation average): 18 nm, polyethylene glycol dispersion paste) was coated on a surface of a fluorine-doped tin oxide (FTO) conductive glass substrate by a screen printing method (coating area: 5×5 mm$^2$). The coating process and a drying process (120° C. for 2 minutes) were repeated twice for the glass substrate, and the coated layer was calcined at 200° C. for 10 minutes and then at 500° C.: for 15 minutes, whereby a first titanium oxide thin layer with a thickness of 4 μm was formed. Subsequently, further, on the first titanium oxide thin layer, a titanium oxide paste (anatase type, a primary mean particle size (microscope observation average): 400 nm, polyethylene glycol dispersion paste) was coated, dried and calcined in the same ways, whereby a second titanium oxide thin layer with a thickness of 2 μm was formed.

Dye 1 of the present invention was dissolved in a mixture sovent of (acetonitrile:t-butyl alcohol=1:1) so that a Dye-1 solution with a concentration of 5×10$^{-4}$ mol/l was prepared. The above FTO glass on which the first titanium oxide thin layer and the second titanium oxide thin layer were formed was dipped in the Dye 1 solution at room temperature for 3 hours, whereby the Dye 1 adsorbing process was conducted and a semiconductor electrode was prepared.

As a charge transport layer (electrolysis solution), a mixture (acetonitrile:valeronitrile=85:15) solution containing 0.6 mol/l of 1,2-dimethyl-3-propyl imidazolium iodide, 0.1 mol/l of lithium iodide, 0.05 mol/l of iodine, and 0.5 mol/l of 4-(t-butyl)pyridine was prepared. The above-prepared semiconductor electrode, a glass plate on which platinum and chromium were vapor-deposited and which was employed as a counter electrode, and a charge transport layer with a thickness of 20 μm were assembled with a clamp cell, whereby Photoelectric conversion element 1 was prepared.

[Production of Photoelectric Conversion Elements 2 to 38]

Photoelectric conversion elements 2 to 38 were prepared in the same ways as that in Photoelectric conversion element 1 except that Dye 1 was changed to another dyes of the present invention shown in Table 1.

[Production of Photoelectric Conversion Element 39]

Dye 5 was dissolved in a mixture solvent of (acetonitrile:t-butyl alcohol=1:1) so that a Dye 5 solution with a concentration of 5×10$^{-4}$ mol/l was prepared, and also, Dye 286 was dissolved in a mixture solvent of (acetonitrile:t-butyl alcohol=1:1) so that a Dye 286 solution with a concentration of 5×10$^{-4}$ mol/l was prepared. Then, the Dye 5 solution and the Dye 286 solution were mixed with a mixing ratio of 1:1 so as to prepare a mixed Dye 5/286 solution. Subsequently, Photoelectric conversion element 39 was prepared in the same ways as that in Photoelectric conversion element 1 except that the abovementioned Dye 1 solution was changed to the resultant mixed Dye 5/286 solution.

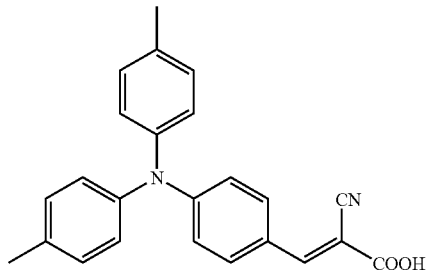

Dye 286

[Production of Photoelectric Conversion Element 40]

Dye 1 of the present invention was dissolved in a mixture solution of (acetonitrile:t-butyl alcohol=1:1) so that a Dye 1 solution with a concentration of 5×10$^{-4}$ mol/l was prepared, and also Dye 139 was dissolved in a mixture solution of (acetonitrile:t-butyl alcohol=1:1) so that a Dye 139 solution with a concentration of 5×10$^{-4}$ mol/l was prepared. Then, the Dye 1 solution and the Dye 139 solution were mixed with a mixing ratio of 1:1 so as to prepare a mixed Dye 1/139 solution. Subsequently, Photoelectric conversion element 40 was prepared in the same ways as that in Photoelectric conversion element 1 except that the Dye 1 solution was changed to the resultant mixed Dye 1/139 solution.

[Production of Photoelectric Conversion Element 41]

Photoelectric conversion element 41 was prepared in the same ways as that in Photoelectric conversion element 1 except that (1) the thickness of the first titanium oxide thin layer which was fanned by the use of the titanium oxide having a primary mean particle size of 18 nm was changed to a thickness of 15 μm, (2) the thickness of the second titanium oxide thin layer which was formed by the use of the titanium oxide having a primary mean particle size of 400 nm was changed to a thickness of 5 μm, (3) Dye 1 was changed to Comparative dye 501, and (4) as the charge transport layer, a 3-methoxy propionitrile solution containing 0.6 mol/l of 1-methyl-3-buty imidazolium iodide, 0.1 mol/l of lithium iodide, and 0.5 mol/l of 4-(t-butyl)pyridine was employed.

Dye 501

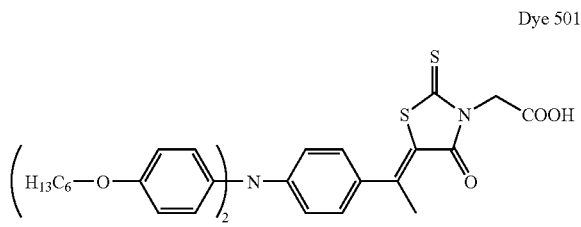

[Production of Photoelectric Conversion Element 42]

Photoelectric conversion element 42 was prepared in the same ways as that in Photoelectric conversion element 41 except that Dye 501 was changed to Comparative dye 502.

Dye 502

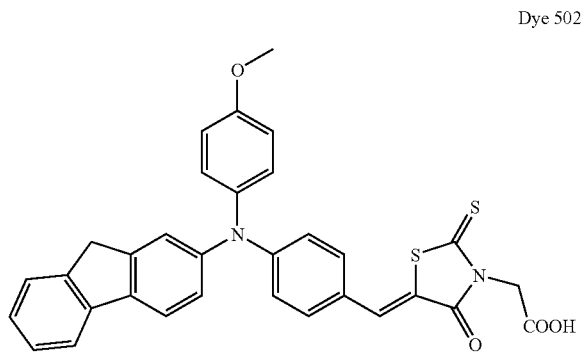 [SMILES: COc1ccc(N(c2ccc(/C=C3\SC(=S)N(CC(=O)O)C3=O)cc2)c2ccc3c(c2)Cc2ccccc2-3)cc1]

[Production of Photoelectric Conversion Element 43]

A titanium oxide paste (anatase type, a primary mean particle size (microscope observation average): 18 nm, polyethylene glycol dispersion paste) was coated on a surface of a fluorine-doped tin oxide (FTO) electrically-conductive glass substrate by a screen printing method (coating area: 5×5 mm²). The coated layer was calcined at 200° C. for 10 minutes and at 450° C. for 15 minutes, whereby a titanium oxide thin layer with a thickness of 1.5 μm was obtained.

Dye 5 of the present invention was dissolved in a mixture solution of (acetonitrile:t-butyl alcohol=1:1) so that a Dye-5 solution with a concentration of $5 \times 10^{-4}$ mol/l was prepared. The above FTO glass on which the titanium oxide thin layer was fainted was dipped in the Dye 5 solution at room temperature for 3 hours, whereby the Dye 5 adsorbing process was conducted and a semiconductor layer (semiconductor electrode) was prepared.

A coating liquid for forming a hole layer was prepared in such a way that a hole transporting material of 0.17 mol/l of 2,2',7,7'-tetrakis(N,N'-di(4-methoxy phenyl)amine)-9,9'-spirobifluorene (OMeTAD)(aromatic amine derivative) and a hole doping substance of 0.33 mmol/l of $N(PhBr)_3SbCl_6$, 15 mmol/l of $Li[(CF_3SO_2)_2N]$ and 50 mmol/l of t-Butylpyridine were dissolved in a mixture solvent (chlorobenzene acetonitrile=19:1). The resultant coating liquid for forming a hole layer was coated by a spin coating method on the top surface of the above semiconductor layer in which the above light sensitizing dyes were adsorbed and combined, whereby a charge transport layer with a thickness of 10 μm was formed. Further, a counter electrode with a thickness of 90 nm was formed in such a way that gold was vapor-deposited on the charge transport layer, whereby Photoelectric conversion element 43 was produced. In the coating by the spin coating method, the revolution of the spin coating was set to 1000 rpm.

[Production of Photoelectric Conversion Element 44]

Photoelectric conversion element 44 was prepared in the same ways as that in Photoelectric conversion element 43 except that Dye 5 was changed to comparative dye 501.

[Evaluation of Photoelectric Conversion Elements]

The evaluation was conducted by the use of a solar simulator (manufactured by EKO INSTRUMENTS Co., Ltd.) in such a way that the produced photoelectric conversion elements were irradiated with pseudo-sunlight which was emitted from a xenon lamp and passed through an AM filter (AM-1.5). Namely, for each of the photoelectric conversion elements, current-voltage characteristics were measured at room temperature with an I-V tester so as to obtain a short-circuit current density (Jsc), an open circuit voltage (Voc), and a fill factor (F.F.) and a photoelectric conversion efficiency ($\eta$ (%)) was calculate from the measured values.

Moreover, a molar absorbance coefficient was obtained with a spectrophotometer.

The results of the evaluation are shown in Table 1.

TABLE 1

| Photo-electric conversion element | Dye | Open-circuit voltage (mV) | Short-circuit current dennsity (mA/cm²) | Photo-electric conversion efficiency (%) | Molar absorbance coefficient | Remarks |
|---|---|---|---|---|---|---|
| 1 | 1 | 720 | 13.2 | 6.0 | 68000 | Inv. |
| 2 | 2 | 700 | 12.1 | 5.1 | 73000 | Inv. |
| 3 | 3 | 710 | 12.1 | 5.3 | 73000 | Inv. |
| 4 | 5 | 750 | 12.3 | 6.6 | 69000 | Inv. |
| 5 | 15 | 700 | 9.8 | 4.8 | 66000 | Inv. |
| 6 | 17 | 690 | 8.5 | 3.9 | 59000 | Inv. |
| 7 | 21 | 700 | 9.0 | 4.3 | 67000 | Inv. |
| 8 | 27 | 630 | 8.6 | 3.9 | 58000 | Inv. |
| 9 | 35 | 760 | 10.0 | 5.1 | 62000 | Inv. |
| 10 | 49 | 740 | 9.8 | 4.9 | 61000 | Inv. |
| 11 | 55 | 770 | 7.3 | 5.0 | 69000 | Inv. |
| 12 | 68 | 760 | 9.5 | 4.8 | 63000 | Inv. |
| 13 | 87 | 690 | 8.7 | 4.1 | 68000 | Inv. |
| 14 | 97 | 730 | 8.9 | 4.5 | 68000 | Inv. |
| 15 | 112 | 720 | 10.2 | 4.9 | 71000 | Inv. |
| 16 | 121 | 750 | 11.2 | 5.1 | 73000 | Inv. |

TABLE 1-continued

| Photo-electric conversion element | Dye | Open-circuit voltage (mV) | Short-circuit current dennsity (mA/cm²) | Photo-electric conversion efficiency (%) | Molar absorbance coefficient | Remarks |
|---|---|---|---|---|---|---|
| 17 | 124 | 740 | 9.9 | 5.0 | 70000 | Inv. |
| 18 | 130 | 720 | 7.9 | 3.7 | 62000 | Inv. |
| 19 | 136 | 750 | 8.3 | 3.9 | 63000 | Inv. |
| 20 | 150 | 760 | 7.8 | 3.5 | 68000 | Inv. |
| 21 | 154 | 670 | 7.2 | 3.3 | 59000 | Inv. |
| 22 | 161 | 660 | 6.3 | 3.2 | 60000 | Inv. |
| 23 | 168 | 670 | 6.9 | 4.0 | 61000 | Inv. |
| 24 | 177 | 680 | 6.9 | 3.9 | 62000 | Inv. |
| 25 | 190 | 680 | 8.3 | 4.3 | 67000 | Inv. |
| 26 | 199 | 690 | 8.3 | 4.3 | 70000 | Inv. |
| 27 | 203 | 700 | 7.9 | 4.1 | 58000 | Inv. |
| 28 | 210 | 710 | 7.7 | 3.3 | 55000 | Inv. |
| 29 | 212 | 730 | 9.8 | 4.6 | 67000 | Inv. |
| 30 | 216 | 720 | 8.4 | 3.7 | 62000 | Inv. |
| 31 | 221 | 740 | 7.8 | 3.6 | 76000 | Inv. |
| 32 | 223 | 760 | 8.1 | 3.8 | 60000 | Inv. |
| 33 | 239 | 740 | 8.7 | 3.8 | 62000 | Inv. |
| 34 | 241 | 750 | 7.9 | 3.9 | 69000 | Inv. |
| 35 | 246 | 720 | 8.4 | 3.5 | 63000 | Inv. |
| 36 | 251 | 700 | 9.2 | 4.1 | 66000 | Inv. |
| 37 | 270 | 710 | 7.6 | 3.4 | 59000 | Inv. |
| 38 | 274 | 690 | 8.4 | 3.7 | 61000 | Inv. |
| 39 | 5/286 | 690 | 10.4 | 5.2 | — | Inv. |
| 40 | 1/139 | 700 | 11.1 | 5.1 | — | Inv. |
| 41 | 501 | 670 | 7.8 | 3.0 | 34000 | Comp. |
| 42 | 502 | 700 | 7.3 | 2.8 | 29000 | Comp. |
| 43 | 5 | 790 | 8.2 | 3.0 | 69000 | Inv. |
| 44 | 501 | 750 | 4.2 | 0.9 | 34000 | Comp. |

Inv.: Inventive example,
Comp.: Comparative example

In Table 1, with regard to the molar absorbance coefficient in Photoelectric conversion element Nos. 40 and 41 in which two kinds of dyes were employed as a mixed dye, the molar absorbance coefficient is indicated in Photoelectric conversion element which employed one of the two kinds of dyes solely.

As can be see from Table 1, in Photoelectric conversion element 12 having employed the dye having two imidazolone skeletons according to the present invention, improvements were observed in terms of the short-circuit current, open circuit voltage, and conversion efficiency as compared with Photoelectric conversion element 41 having employed the comparative dye having one rhodanine skeleton. The improvements are assumed due to the fact that the molar absorbance coefficient (∈) increased by 29000. Further, in Photoelectric conversion elements 1 through 38 having employed the dye having the imidazolone skeleton according to the present invention, the improvement in the conversion efficiency was also observed. Furthermore, in Photoelectric conversion elements 39 and 40 having employed plural kinds of dyes, the improvement in the conversion efficiency was also observed, and in Photoelectric conversion element 43, improvements were observed in terms of the short-circuit current, open circuit voltage, and conversion efficiency as compared with Photoelectric conversion element 44. As can be assumed from the molar absorbance coefficient, it can be assumed that the current values and the conversion efficiency were improved due to the fact that the photoelectric conversion elements absorbed more light.

Moreover, in a part of the dyes of the present invention, as compared with the absorption wavelength measured when dyes are dispersed in a solution, the absorption wavelength measured when dyes adsorb the semiconductor particle layer becomes broader toward a long wavelength side. From this fact, it is presumed that when dyes adsorb the semiconductor particle layer, dyes agglutinate due to interaction between molecules of dyes such that dyes absorb light more in a wide range of wavelength, whereby photoelectric conversion efficiency can be improved.

What is claimed is:

1. A dye-sensitized photoelectric conversion element, comprising:

a pair of electrodes arranged opposite to each other, a semiconductor layer including a semiconductor supporting a sensitizing dye; and an electrolyte layer, wherein at least the semiconductor layer and the electrolyte layer are provided between the pair of electrodes, and the sensitizing dye contains a compound represented by the following Formula (1),

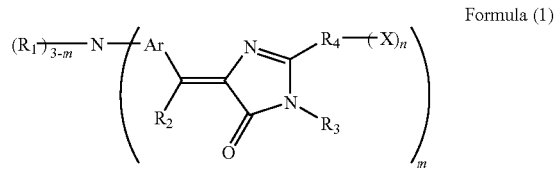

Formula (1)

in Formula (1), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_4$ represents an X-substituted group of one of an alkyl group, alkenyl group, alkynyl group, alkoxy group, alkylthio group, alkylseleno group, amino group, aryl group, and heterocyclic group and $R_4$ may be further substituted with a substituent other than X, X represents an acidic group, n is an integer of 1 or more, m is 2 or 3, and a carbon-carbon double bond may be a cis form or a trans form.

2. The dye-sensitized photoelectric conversion element described in claim 1, wherein the compound represented by the abovementioned Formula (1) is a compound represented by the following Formula (2),

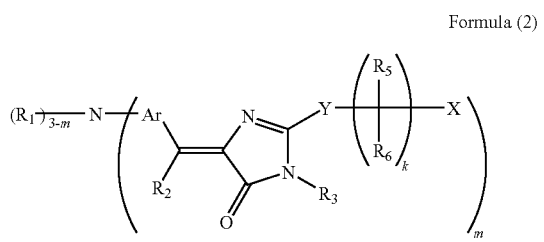

Formula (2)

in Formula (2), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, Y represents a sulfur atom, an oxygen atom, or a selenium atom, m is 2 or 3, X represents an acidic group, and a carbon-carbon double bond may be a cis form or a trans form.

3. The dye-sensitized photoelectric conversion element described in claim 2, wherein Y represents a sulfur atom so that the compound represented by the abovementioned Formula (2) is a compound represented by the following Formula (3),

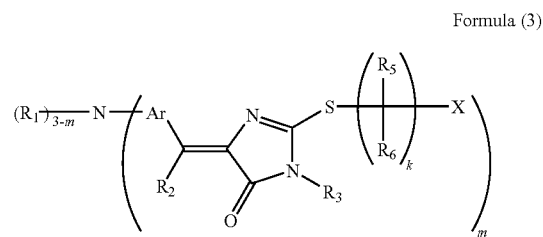

Formula (3)

in Formula (3), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, alkoxy group, aryl group, amino group and heterocyclic group, $R_3$ represents a hydrogen atom, or a substituted or unsubstituted group of one of an alkyl group, alkenyl group, alkynyl group, aryl group, and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the ease of k≥2, $R_5$ and $R_6$ may be the same or different, m is 2 or 3, X represents an acidic group, and a carbon-carbon double bond may be a cis form or a trans form.

4. The dye-sensitized photoelectric conversion element described in claim 3, wherein $R_3$ represents a hydrogen atom so that the compound represented by the abovementioned Formula (3) is a compound represented by the following Formula (4),

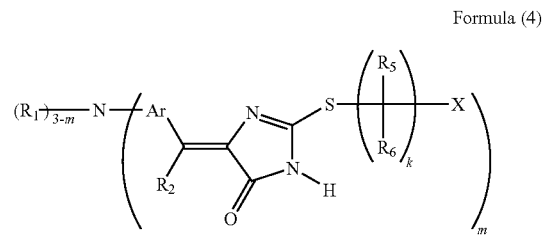

Formula (4)

in Formula (4), Ar represents a substituted or unsubstituted group of one of an arylene group and heterocyclic group, $R_1$ represents a substituted or unsubstituted group of one of an alkyl group, alkenyl group, alkynyl group, aryl group, and heterocyclic group, $R_1$ and Ar may form a ring-shaped structure by bonding with each other, $R_2$ represents a hydrogen atom, a halogen atom, a cyano group, or a substituted or unsubstituted group of one of an alkyl group, alkenyl group, alkynyl group, aryl group, amino group, cyano group and heterocyclic group, $R_5$ and $R_6$ each represents a hydrogen atom, a halogen atom, a hydroxyl group, a cyano group, or a substituted or unsubstituted group of one of an alkyl group, aryl group, alkenyl group, alkynyl group, alkoxy group, amino group, and heterocyclic group and $R_5$ and $R_6$ may form a ring-shaped structure by bonding with each other, k is an integer of 1 or more, in the case of k≥2, $R_5$ and $R_6$ may be the same or different, m is 2 or 3, X represents an acidic group, and a carbon-carbon double bond may be a cis form or a trans form.

5. The dye-sensitized photoelectric conversion element described in claim 1, wherein an alkyl portion of one of the alkoxy group, alkylthio group, alkylseleno group and amino group is substituted with X.

6. The dye-sensitized photoelectric conversion element described in claim 1, wherein X represents a carboxyl group, a sulfo group, a sulfino group, a sulfinyl group, a phosphoryl group, a phosphinyl group, a phosphono group, a phosphonyl group, a sulfonyl group, or a salt of them.

7. The dye-sensitized photoelectric conversion element described in claim 6, wherein X represents a carboxyl group, or a sulfo group.

8. The dye-sensitized photoelectric conversion element described in claim 1, wherein the sensitizing dye contains plural kinds of compounds represented by Formula (1).

9. The dye-sensitized photoelectric conversion element described in claim 1, wherein the semiconductor is a titanium oxide.

10. The dye-sensitized photoelectric conversion element described in claim 1, wherein the semiconductor layer is a semiconductor particle layer subjected to a calcination process, and the sensitizing dye is dye particles supported by semiconductor particles.

11. The dye-sensitized photoelectric conversion element described in claim 1, wherein the semiconductor particle layer has a porosity of 10% by volume or less.

12. A solar cell, comprising:
the photoelectric conversion element described in claim 1, and
a pair of terminals connected the pair of electrodes.

* * * * *